United States Patent
Yu et al.

(10) Patent No.: US 12,429,776 B2
(45) Date of Patent: Sep. 30, 2025

(54) LITHOGRAPHY METHOD WITH REDUCED IMPACTS OF MASK DEFECTS

(71) Applicant: Taiwan Semiconductor Manufacturing Co., Ltd., Hsinchu (TW)

(72) Inventors: Shinn-Sheng Yu, Hsinchu (TW); Ching-Fang Yu, Hsinchu (TW); Wen-Chuan Wang, Hsinchu (TW); Ting-Hao Hsu, Hsinchu (TW); Sheng-Chi Chin, Hsinchu (TW); Anthony Yen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 883 days.

(21) Appl. No.: 17/206,722

(22) Filed: Mar. 19, 2021

(65) Prior Publication Data

US 2021/0208505 A1    Jul. 8, 2021

Related U.S. Application Data

(62) Division of application No. 15/861,156, filed on Jan. 3, 2018, now Pat. No. 10,955,746.

(Continued)

(51) Int. Cl.
*G03F 7/20* (2006.01)
*G03F 1/24* (2012.01)
(Continued)

(52) U.S. Cl.
CPC ............ *G03F 7/2022* (2013.01); *G03F 1/24* (2013.01); *G03F 1/52* (2013.01); *G03F 7/2004* (2013.01);

(Continued)

(58) Field of Classification Search
CPC ...... G03F 7/2022; G03F 1/24; G03F 7/70466; G03F 7/70558
See application file for complete search history.

(56) References Cited

U.S. PATENT DOCUMENTS

| | | | |
|---|---|---|---|
| 6,091,845 A * | 7/2000 | Pierrat | G03F 7/70483 716/52 |
| 8,764,995 B2 | 7/2014 | Chang et al. | |

(Continued)

FOREIGN PATENT DOCUMENTS

| | | |
|---|---|---|
| TW | 200409195 A | 6/2004 |
| TW | 201535059 A | 9/2015 |

OTHER PUBLICATIONS

Book: Principles of Lithography, Second Edition Author(s): Harry J. Levinson Published: 2005 https://doi.org/10.1117/3.601520.ch11 (Year: 2005).*

(Continued)

*Primary Examiner* — Jonathan Johnson
*Assistant Examiner* — Alexander N. Lee
(74) *Attorney, Agent, or Firm* — HAYNES AND BOONE, LLP

(57) ABSTRACT

An extreme ultraviolet lithography method is disclosed. In an example, the EUVL method includes forming a resist layer on a substrate; performing a first exposure process to image a first pattern of a first sub-region of a first mask to the resist layer; performing a second exposure process to image a second pattern of a second sub-region of the first mask to the resist layer; and performing a third exposure process to image a third pattern of a first sub-region of a second mask to the resist layer. The second and third patterns are identical to the first pattern. The first, second and third exposure processes collectively form a latent image of the first pattern on the resist layer.

20 Claims, 67 Drawing Sheets

Related U.S. Application Data

(60) Provisional application No. 62/537,987, filed on Jul. 28, 2017.

(51) Int. Cl.
  G03F 1/52 (2012.01)
  G03F 7/00 (2006.01)

(52) U.S. Cl.
  CPC .......... G03F 7/203 (2013.01); G03F 7/70466 (2013.01); G03F 7/70558 (2013.01); G03F 7/7065 (2013.01)

(56) References Cited

U.S. PATENT DOCUMENTS

| | | |
|---|---|---|
| 8,796,666 B1 | 8/2014 | Huang et al. |
| 8,828,625 B2 | 9/2014 | Lu et al. |
| 8,841,047 B2 | 9/2014 | Yu et al. |
| 8,877,409 B2 | 11/2014 | Hsu et al. |
| 9,075,313 B2 | 7/2015 | Yu et al. |
| 9,093,530 B2 | 7/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |
| 2003/0123039 A1 | 7/2003 | Yen et al. |
| 2004/0157164 A1* | 8/2004 | Hasegawa ................ G03F 1/30 430/311 |
| 2008/0268381 A1 | 10/2008 | Saito et al. |
| 2012/0045712 A1 | 2/2012 | Chang et al. |
| 2014/0272720 A1* | 9/2014 | Yu ............................. G03F 1/22 430/322 |
| 2015/0072271 A1 | 3/2015 | Lu et al. |
| 2019/0033720 A1 | 1/2019 | Yu et al. |

OTHER PUBLICATIONS

Repairing native defects on EUV mask blanks, Mark Lawliss, Emily Gallagher, Michael Hibbs, Kazunori Seki, Takeshi Isogawa, Tod Robinson, Jeff LeClaire, Photomask Technology 2014, edited by Paul W. Ackmann, Naoya Hayashi, Proc. of SPIE vol. 9235, 923516 (Year: 2014).*

Analyzing EUV Mask Costs, Michael Lercel and Bryan Kasprowicz, BACUS News, vol. 33, issue 2, Feb. 2017 (Year: 2017).*

* cited by examiner

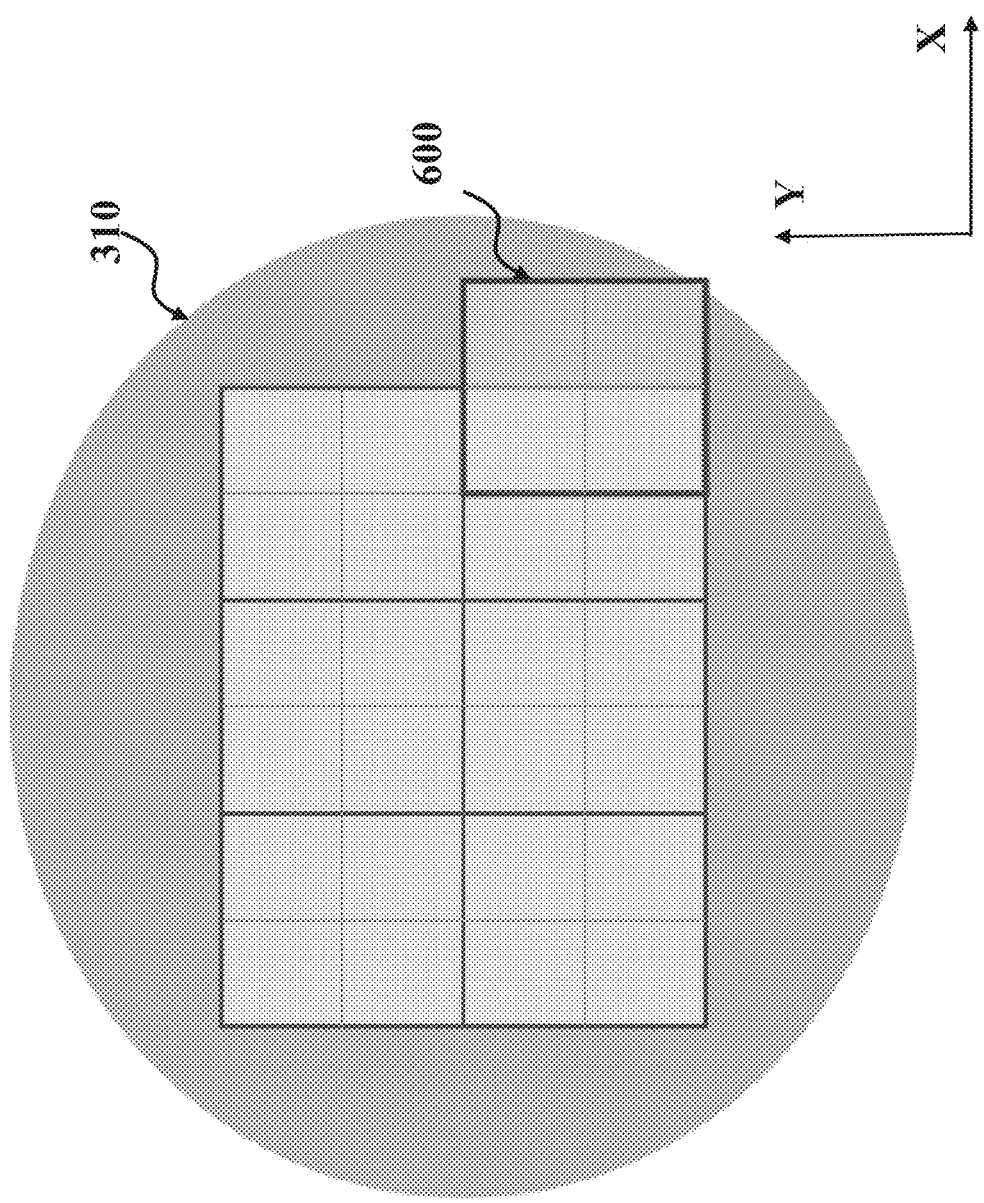

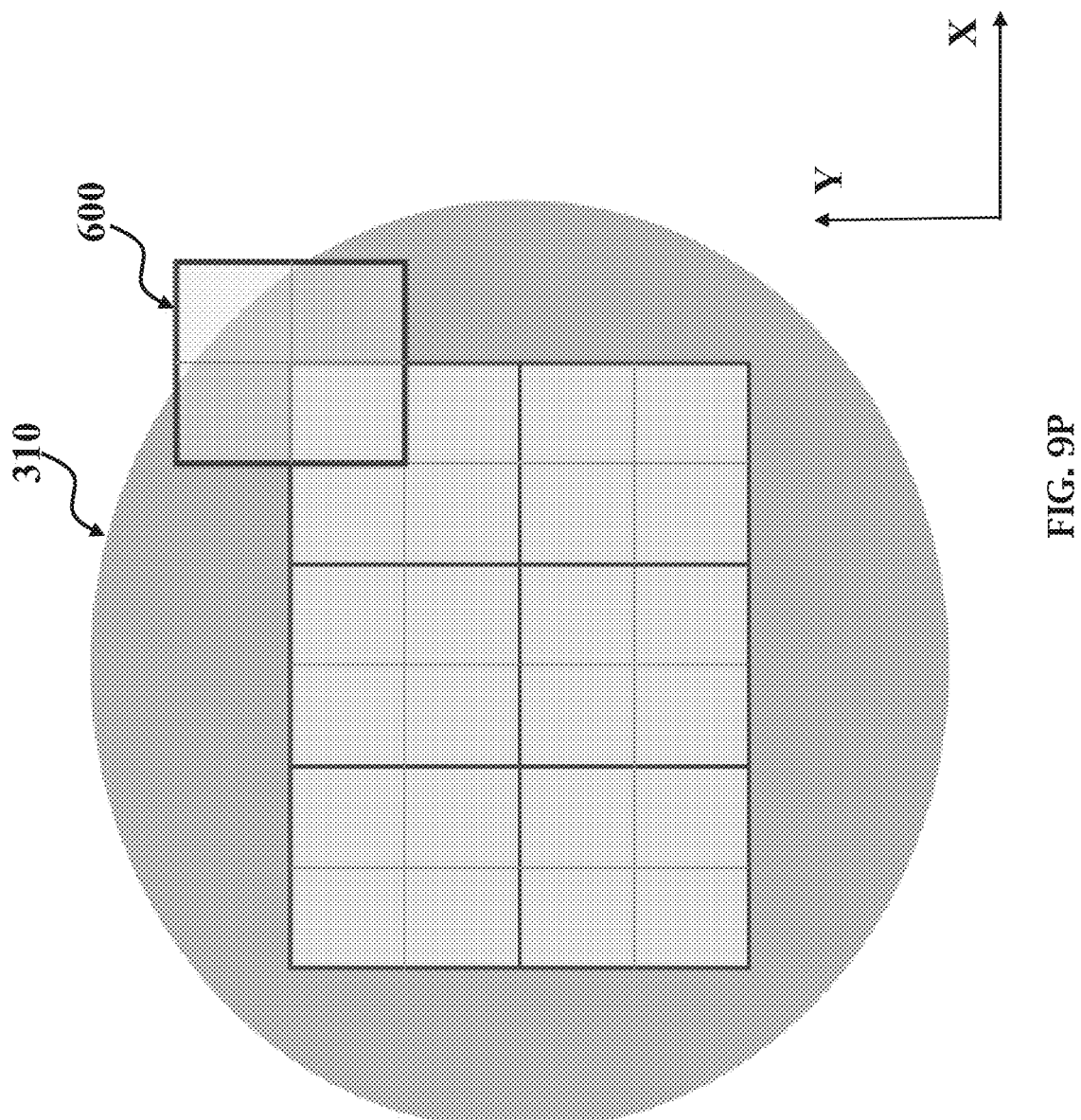

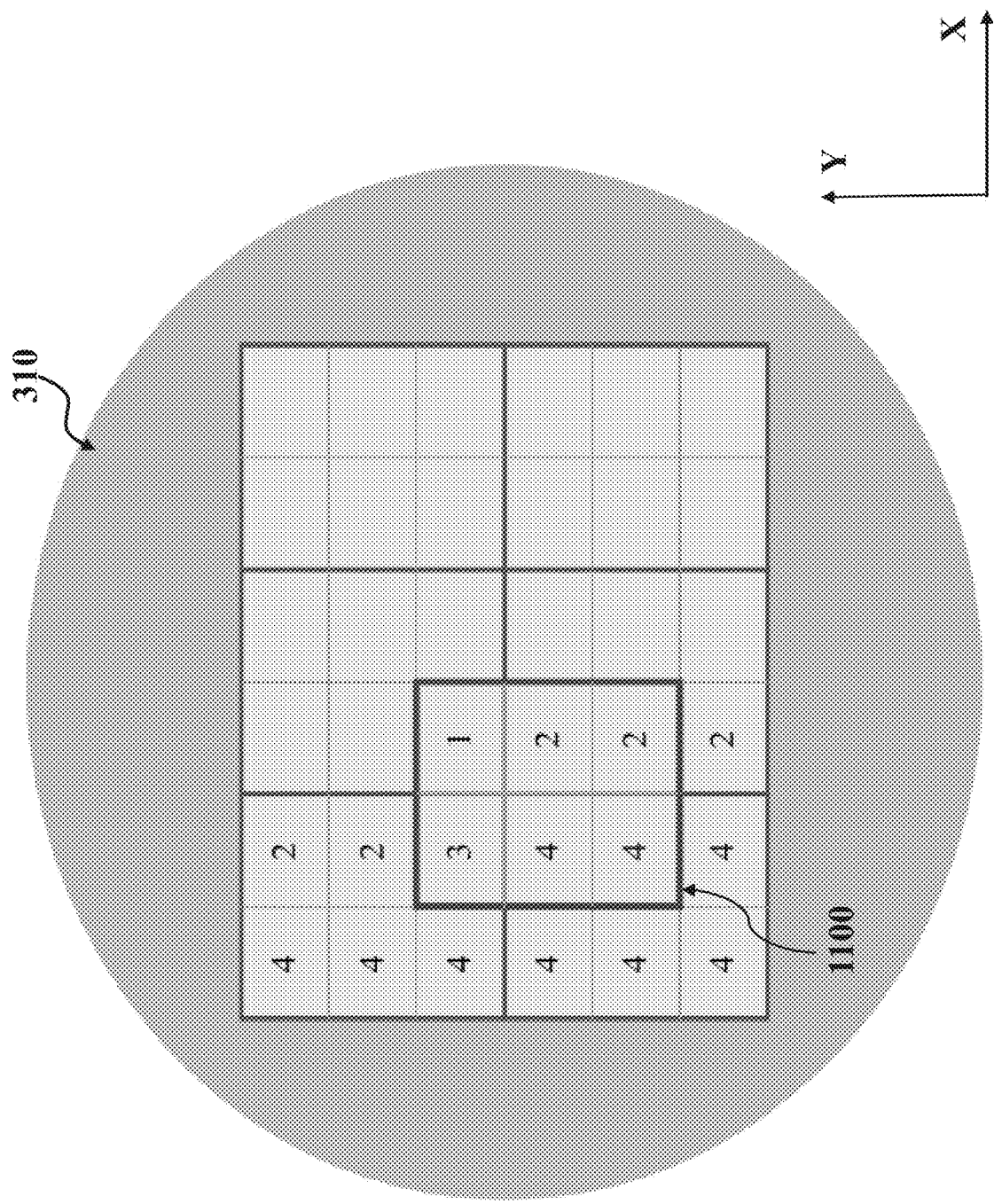

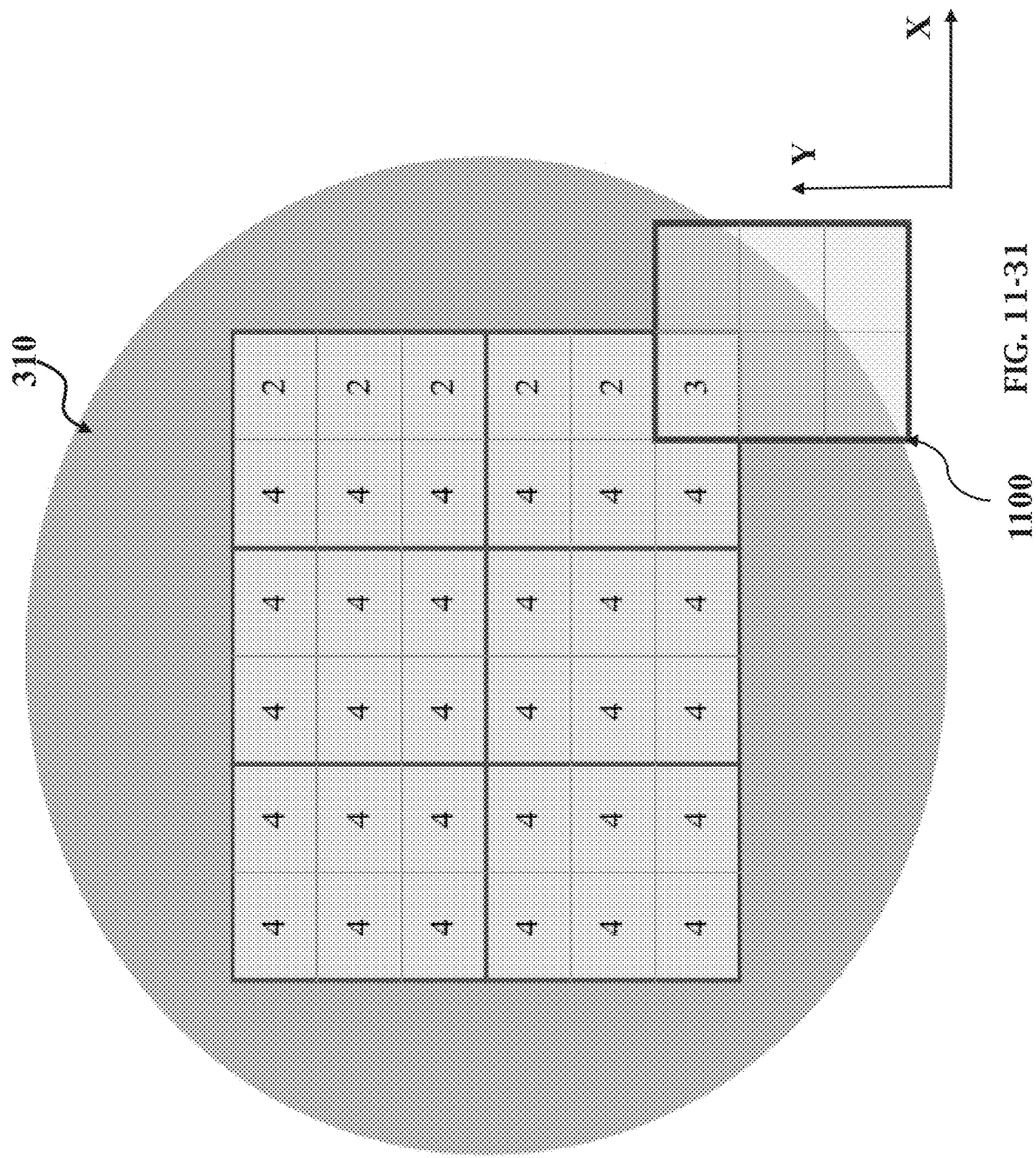

LITHOGRAPHY METHOD WITH REDUCED IMPACTS OF MASK DEFECTS

PRIORITY

This application is a divisional of U.S. patent application Ser. No. 15/861,156 filed on Jan. 3, 2018 which claims priority to U.S. Provisional Application Ser. No. 62/537,987 filed Jul. 28, 2017, each of which is herein incorporated by reference.

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also increased the complexity of processing and manufacturing ICs and, for these advances to be realized, similar developments in IC processing and manufacturing are needed. For example, higher resolution lithography processes, such as extreme ultraviolet (EUV) lithography processes, are implemented to meet size constraints approaching critical dimension tolerances of 32 nm technology nodes and below. EUV lithography uses a reflective mask (also referred to as a reticle) to transfer a pattern of a layer of an integrated circuit device to a wafer. A reflective mask typically includes a reflective multilayer coating (multi-layered mirror stack) disposed on a substrate. Any defects, including microscopic defects, in the substrate cause disturbances (or deformations) in material layers of the reflective multilayer coating that undesirably affect printability of the pattern of the reflective mask. Such defects are often difficult to inspect and, even if detected, difficult to repair. Accordingly, although existing EUV masks and methods of manufacturing EUV masks have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 9A, 9B, 9C, 9D, 9E, 9F, 9G, 9H, 9I, 9J, 9K, 9L, 9M, 9N, 9O, and 9P are top schematic views of patterning a resist layer by hybrid lithography exposure process according to various aspects of the present disclosure in some embodiments.

FIGS. 11-1, 11-2, 11-3, 11-4, 11-5, 11-6, 11-7, 11-8, 11-9, 11-10, 11-11, 11-12, 11-13, 11-14, 11-15, 11-16, 11-17, 11-18, 11-19, 11-20, 11-21, 11-22, 11-23, 11-24, 11-25, 11-26, 11-27, 11-28, 11-29, 11-30, 11-31, 11-32, 11-33, 11-34, and 11-35 are top schematic views of patterning a resist layer by hybrid lithography exposure process according to various aspects of the present disclosure in some embodiments.

DETAILED DESCRIPTION

Figure 1:
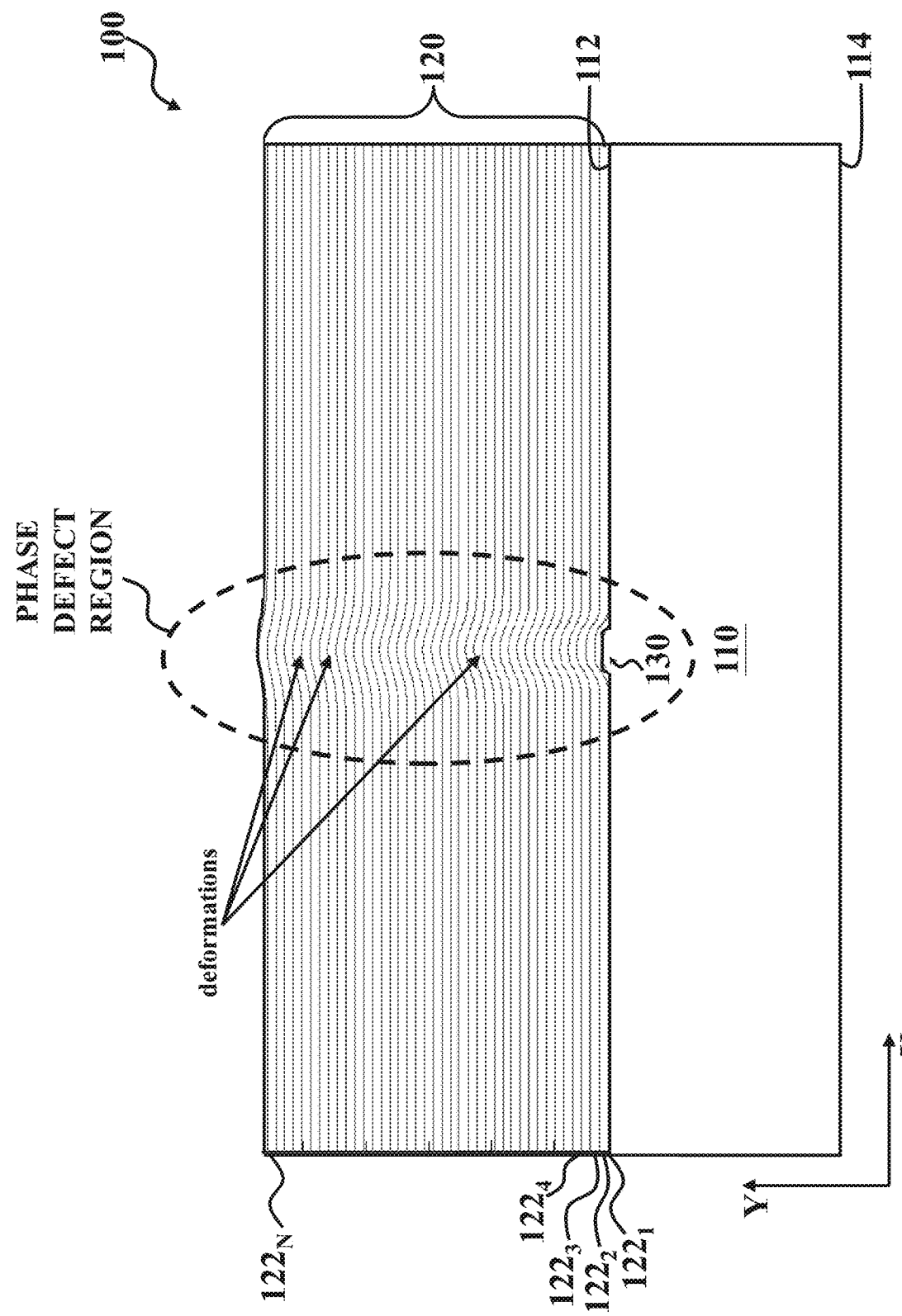
FIG. 1 is a diagrammatic cross-sectional side view of a mask according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a diagrammatic cross-sectional side view of a mask 100 (also referred to as a photomask or a reticle) according to various aspects of the present disclosure. In the depicted embodiment, the mask 100 is a mask blank that will undergo a mask fabrication process to pattern the mask blank with a design of a layer of an integrated circuit (IC) device, such that the mask 100 can be used during IC device fabrication. FIG. 1 has been simplified for the sake of clarity to better understand the inventive concepts of the present disclosure. Additional features can be added in the mask 100, and some of the features described below can be replaced or eliminated for additional embodiments of the mask 100.

The mask 100 includes a substrate 110. The substrate 110 has a surface 112 and a surface 114 that is opposite the surface 112. In the present example, the substrate 110 includes a low thermal expansion material (LTEM). In an example, the LTEM substrate includes titania ($TiO_2$) doped fused silica ($SiO_2$). Alternatively, the substrate 110 includes other materials, such as quartz or glass, depending on design requirements of the mask 100.

A reflective multilayer coating (RMLC) 120 (also referred to as a multilayer mirror (MLM)) is deposited over the substrate 110, particularly over a surface 112 of the substrate 110. The RMLC 120 includes multiple material layers $122_1$, $122_2$, $122_3$, $122_4$, ..., $122_N$, where N is a total number of the material layers of the RMLC 120. Hereafter, for ease of discussion, "a material layer" or "material layers" is simply referred to as "a layer" or "layers." In the present example, in relation to the surface 112 of the substrate 110, the layer $122_1$ may be referred to as a bottommost layer of the RMLC 120, and the layer $122_N$ may be referred to as the topmost layer of the RMLC 120. In furtherance of the present example, the multiple layers $122_1$, $122_2$, $122_3$, $122_4$, ..., $122_N$ form a number of layer pairs, where each layer pair includes two layers having different refractive indices (in other words, a combination of a first material and a second material, where a refractive index of the first material is different than a refractive index of the second material). For example, a layer pair includes layer $122_1$ and layer $122_2$, another layer pair includes layer $122_3$ and layer $122_4$, and so forth. The combination of the materials in the layer pair is selected to provide a large difference in refractive indices between the two layers (for example, to achieve large reflectivity at an interface of the two layers according to Fresnel equations), yet provide small extinction coefficients for the layers (for example, to minimize absorption). In an example, the RMLC 120 includes molybdenum-silicon (Mo/Si) layer pairs. In another example, the RMLC 120 includes molybdenum-beryllium (Mo/Be) layer pairs. A thickness of each layer of each layer pair of the RMLC 120 is adjusted depending on a wavelength and an angle of incidence of light (such as extreme ultraviolet (EUV) radiation) incident on the mask 100, such that the mask 100 achieves maximum constructive interference of light reflected from different interfaces of the RMLC 120. In general, reflectivity of the RMLC increases as a number of layer pairs of the RMLC 120 increases. Accordingly, in principle, if the number of layer pairs is sufficiently large and extinction coefficients of the materials of the layers are close to zero, reflectivity of the RMLC 120 can approach 100% regardless of the difference of the refractive indices of the materials of the layers in the layer pairs. However, in the EUV wavelength range, the highest reflectivity that can be achieved is limited by the extinction coefficients of the materials employed for the layers of the RMLC 120. In the present example, the number of layer pairs of the RMLC 120 is from twenty to eighty. For example, in the depicted embodiment, to achieve more than 90% of the maximum achievable reflectivity (with the chosen materials) of the RMLC 120 and minimize mask blank manufacturing time and costs, the RMLC 120 includes about forty layer pairs, such as forty Mo/Si pairs (where N=80; layers $122_1$, $122_3$, ..., $122_{79}$ include silicon and have a thickness of about 3 nm to 5 nm (for example, about 4 nm); and layers $122_2$, $122_4$, ..., $122_{80}$ include molybdenum and have a thickness of about 2 nm to 4 nm (for example, about 3 nm). Alternatively, the RMLC 120 includes any other number of layer pairs, depending on reflectivity specifications for the mask 100. In other alternatives, the RMLC 120 may include layer groups, in other words, groups of three or more layers having different refractive indices and other characteristics to maximize reflectivity.

The RMLC 120 includes a phase-defect region that alters a phase of light reflected from the RMLC 120. In the depicted embodiment, a defect 130, such as a bump defect, is located on the surface 112 of the substrate 110. As illustrated in FIG. 1, the defect 130 causes a deformation in the layers of the RMLC 120 deposited on the surface 112 of the substrate 110. More specifically, a deformation occurs in each of the layers $122_1$, $122_2$, $122_3$, $122_4$, ..., $122_N$ of the RMLC 120. The defect 130 thus propagates into each successively formed layer, such that the phase-defect region of the RMLC 120 extends from the bottommost layer (layer $122_1$) to the topmost layer (layer $122_N$). Alternatively, the phase-defect region extends through a limited number of the layers $122_1$, $122_2$, $122_3$, $122_4$, ..., $122_N$ of the RMLC 120. In yet another alternative, where the phase-defect region extends through a limited number of the layers $122_1$, $122_2$, $122_3$, $122_4$, ..., $122_N$, a defect in/on one of the layers causes deformations in the subsequently deposited layers, such that the deformations in the subsequently deposited layers are associated with the defect in/on the layer, instead of a defect on the surface of the substrate 110, such as the defect 130. The deformations of the RMLC 120 may have a different profile depending on the type of defects associated with the deformations and the processing conditions during the forming of the layers $122_1$, $122_2$, $122_3$, $122_4$, ..., $122_N$ of the RMLC 120.

Light reflected from the RMLC 120 consists of all the light reflected from the various, different interfaces of the RMLC 120. In the present example, portions of the reflected light are phase shifted (in other words, have phase errors) because of the deformations of the layers $122_1$, $122_2$, $122_3$, $122_4$, ..., $122_N$ in the RMLC 120 (here, resulting from the defect 130). The illustrated phase-defect region (the collection of deformations in the layers of the RMLC 120) thus largely impacts a phase of the light reflected from the RMLC 120, though it may minimally impact amplitude of such reflected light. When small imaging wavelengths, such as EUV wavelengths, are used to illuminate the mask 100, the phase errors introduced in the reflected light by the phase-defect region of the RMLC 120 can be large, even if the deformations in the layers $122_1$, $122_2$, $122_3$, $122_4$, ..., $122_N$ associated with the phase-defect region of the RMLC 120 may be small. For example, when the imaging wavelength is 13.5 nm, a defect having a height or depth of about 3.4 nm (about one fourth of the imaging wavelength) can introduce a phase error as much as 180°. Such phase shifts (errors) resulting from the phase-defect region of the RMLC 120 thus negatively impact the lithography processes using the mask 100. In fact, a phase error of only a small fraction of 180°, for example, as small as 30°, can negatively impact a lithography process window or patterning fidelity using the mask 100. Accordingly, it is desired that the substrate 110 (particularly the surface 112 of the substrate 110), as well as the RMLC 120, is free of defects, such as bump defects, pit defects, and other types of defects. However, achieving a defect-free substrate, as well as a defect-free RMLC, is difficult using conventional technology. The following discussion thus examines how to reduce the impact of such defects, particularly, the impact of phase-defect regions that result from such defects. The further discussion provides a method to implement an EUV lithography process to effectively eliminate the impacts from the defects and further reduce or minimize the manufacturing fabrication cost.

Figure 2:
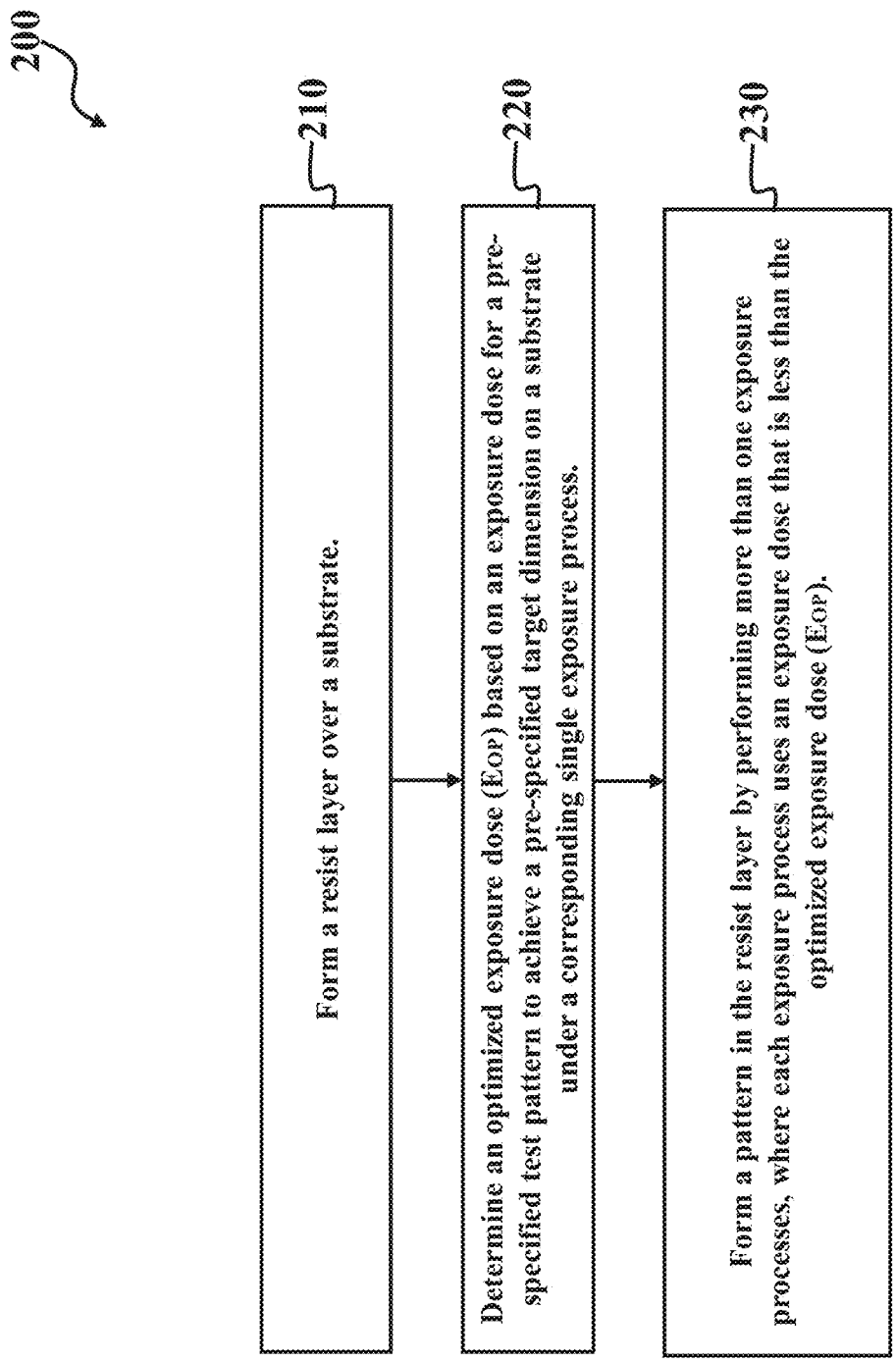
FIG. 2 is a flowchart of a method for forming a patterned resist layer according to various aspects of the present disclosure.

FIG. 2 is a flow chart of a method for forming a patterned resist layer according to various aspects of the present disclosure. The method 200 begins at block 210 where a resist layer is formed over a substrate. At block 220, an optimized exposure dose ($E_{OP}$) is determined. A given resist layer undergoing a given lithographic process has a definite threshold exposure dose ($E_{TH}$) that is the minimum exposure dose to reliably alter the behavior of an exposed portion of the resist layer compared to an unexposed portion (when patterns on the mask are large compared to the wavelength of the employed radiation source). For example, where the resist layer includes a positive-tone resist material, the exposed portions of the resist layer become soluble beyond the threshold exposure dose, such that the exposed portions of the resist layer are removed during a developing process and the developed resist layer includes the pattern. In another example, where the resist layer includes a negative-tone resist material, the exposed portions of the resist layer become insoluble beyond the threshold exposure dose, such that the unexposed portions of the resist layer are removed during a developing process and the developed resist layer includes the pattern. However, a variety of real-world effects may cause the threshold dose to be insufficient. For example, the effect of diffraction which reduces the contrast of the aerial image becomes prominent when the size of patterns on the mask is close to or smaller than the wavelength of the employed radiation source. In another example, a post-exposure baking process may exhibit effects such as acid diffusion in a chemically amplified resist, acid annihilation by a quencher, etc. To correct for these, in some embodiments, an optimized exposure dose may be determined based on an exposure dose for a pre-specified test pattern to achieve a pre-specified target dimension on a wafer under a corresponding single exposure process.

At block 230, a pattern is formed in the resist layer by a hybrid lithography exposure process and a developing process. The hybrid lithography exposure process includes multiple exposure processes by using different masks and different pattern regions of a same mask, respectively. This will be described below in details. In some embodiments, the multiple exposure processes are performed using extreme ultraviolet radiation (EUV), and the radiation for each exposure process may have approximately the same wavelength. In the multiple exposure processes of block 230, each exposure process may utilize an exposure dose that is less than the optimized exposure dose and the total exposure dose ($E_T$) of the multiple exposure process approximately equals the optimized exposure dose (in other words, $E_1<E_{OP}$, $E_2<E_{OP}$, ..., $E_L<E_{OP}$ and $E_T=E_1+E_2+E_3 \ldots +E_L \approx E_{OP}$, where L is a total number of exposure processes performed).

During the multiple exposure processes, the resist layer is exposed multiple times a same area with a same pattern, such as a same integrated circuit (IC) pattern. However, the same IC pattern is from different mask patterns, including multiple masks (the number of the masks is M) and multiple portions (the number of the portions is N) of each mask. The portions of the mask are also referred to as sub-regions in the following description. Each exposure process is implemented using the IC pattern from a different mask or a different portion of a mask. Therefore, the multiple exposure processes are collectively referred as a hybrid lithography exposure process. The hybrid lithography exposure process includes a total L of exposure processes, wherein L=M*N. This is further described below in details.

The multiple exposure processes are grouped into groups of exposure processes, each group is associated with a same mask. In this case, each exposure process in the same group associated with a mask uses a different portion of the mask to expose the resist layer, where each portion of the mask has the same pattern. A different group of exposure processes uses a different mask to expose the resist layer in a same way. Different masks and different portions of a mask can include defects (such as bump defects, pit defects, other types of defects, or combinations thereof) and phase-defect regions. However, those defects are usually randomly distributed and contribute to only one of the multiple exposure processes, such as contributing an exposure dose less than $E_T/L$. When L is larger enough, such as L>10, then the dose variation from one defect is too less than $E_T$ to cause physical changes to the developed resist pattern. Thus, the hybrid lithography exposure process reduces the impact from defects. Thus, even the masks having reasonable number of defects (such as one or two), it is still usable. Overall, the manufacturing cost is reduced.

Forming the pattern in the resist layer may further include a developing process, where a developing solution is applied to the exposed resist layer. The resist layer may also be exposed to a baking process before and/or after the resist layer is exposed. Additional steps can be provided before, during, and after the method 200, and some of the steps described can be replaced, eliminated, or moved around for additional embodiments of the method 200. The discussion that follows illustrates various embodiments of a resist layer that can be patterned according to the method 200 of FIG. 2.

Figure 3A:
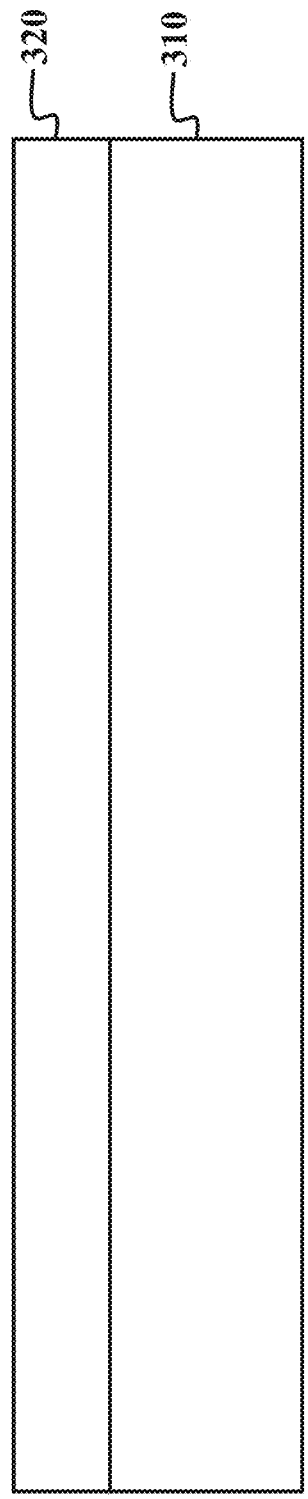
FIGS. 3A, 3B, 3C, 3D, and 3E are diagrammatic cross-sectional views of a resist layer during various stages of the method of FIG. 2 according to various aspects of the present disclosure.

FIGS. 3A-3E are various diagrammatic cross-sectional views of a resist layer during various stages of the method 200 of FIG. 2. FIGS. 3A-3E have been simplified for the sake of clarity to better understand the inventive concepts of the present disclosure. In FIG. 3A, a wafer 310 is provided. The wafer 310 is a substrate, a mask (also referred to as a photomask or reticle), or any base material on which processing is conducted to provide layers of material to form various features of an integrated circuit (IC) device. In the depicted embodiment, the wafer 310 is a semiconductor substrate including silicon (in other words, a silicon wafer). Alternatively or additionally, the wafer 310 includes another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the wafer 310 is a semiconductor on insulator (SOI) substrate. The wafer 310 may alternatively be referred to as a material layer, or the wafer 310 may include a material layer upon which a resist layer will be formed. In an example, the material layer is a metal layer, a semiconductor layer, or a dielectric layer. In another example, the material layer is a hard mask layer, such as a silicon oxide layer or a silicon nitride layer.

A resist layer 320 is deposited over the wafer 310, for example, by a spin-on coating technique. The resist layer 320 is also referred to as a photoresist layer, photosensitive layer, imaging layer, patterning layer, or radiation sensitive layer. A rinsing process, such as a de-ionized (DI) water rinse, may be performed on the wafer 310 before depositing the resist layer 320. The resist layer 320 may be subjected to a baking process, such as a soft baking process (also referred to as a post-applied baking process). In the depicted embodiment, the resist layer 320 includes positive-tone resist material. Alternatively, the resist layer 320 includes negative-tone resist material. The resist layer 320 has any suitable thickness, such as a thickness of about 10 nanometers (nm) to about 1,000 nm.

Figure 3B:
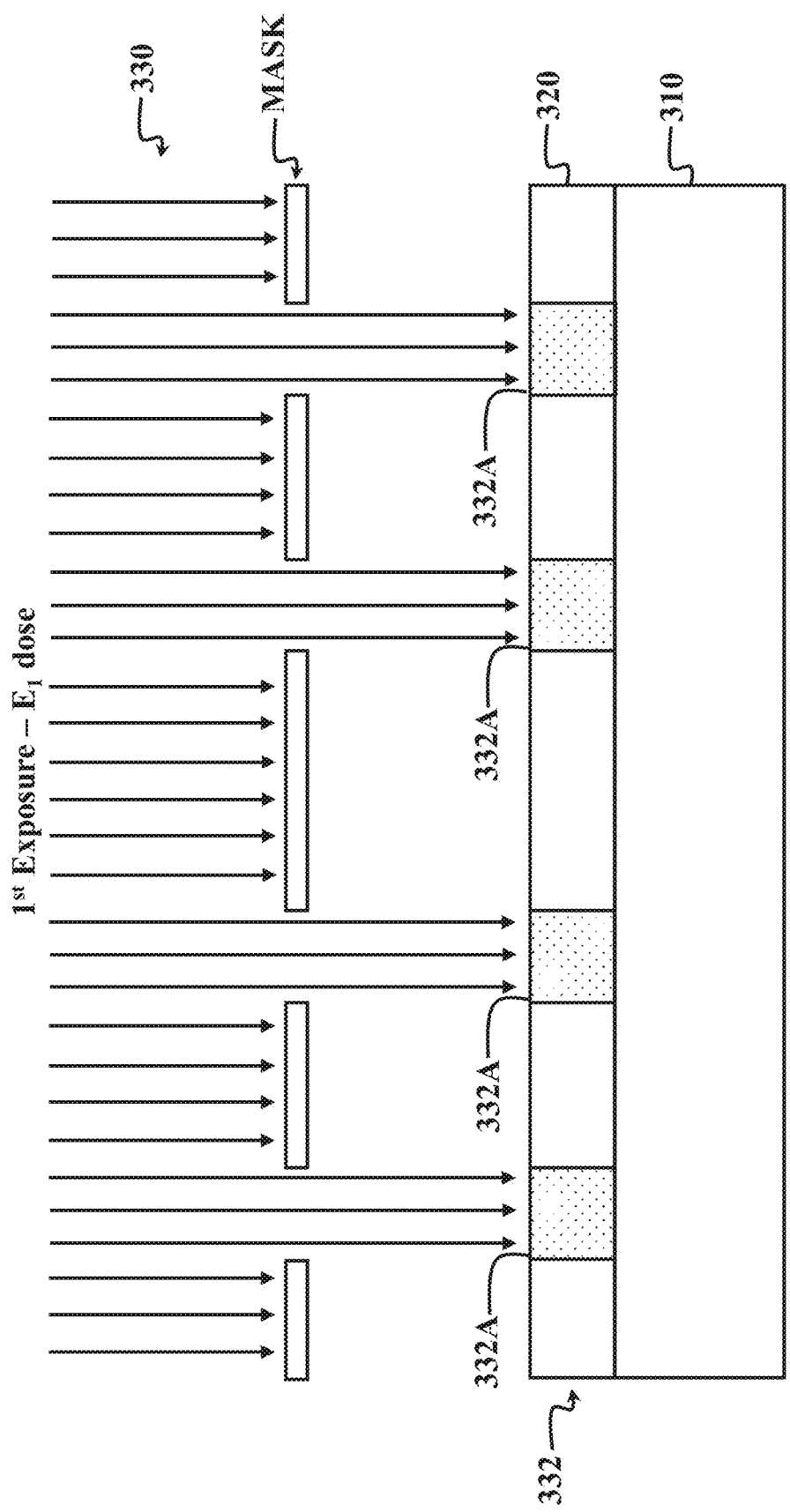
Figure 3C:
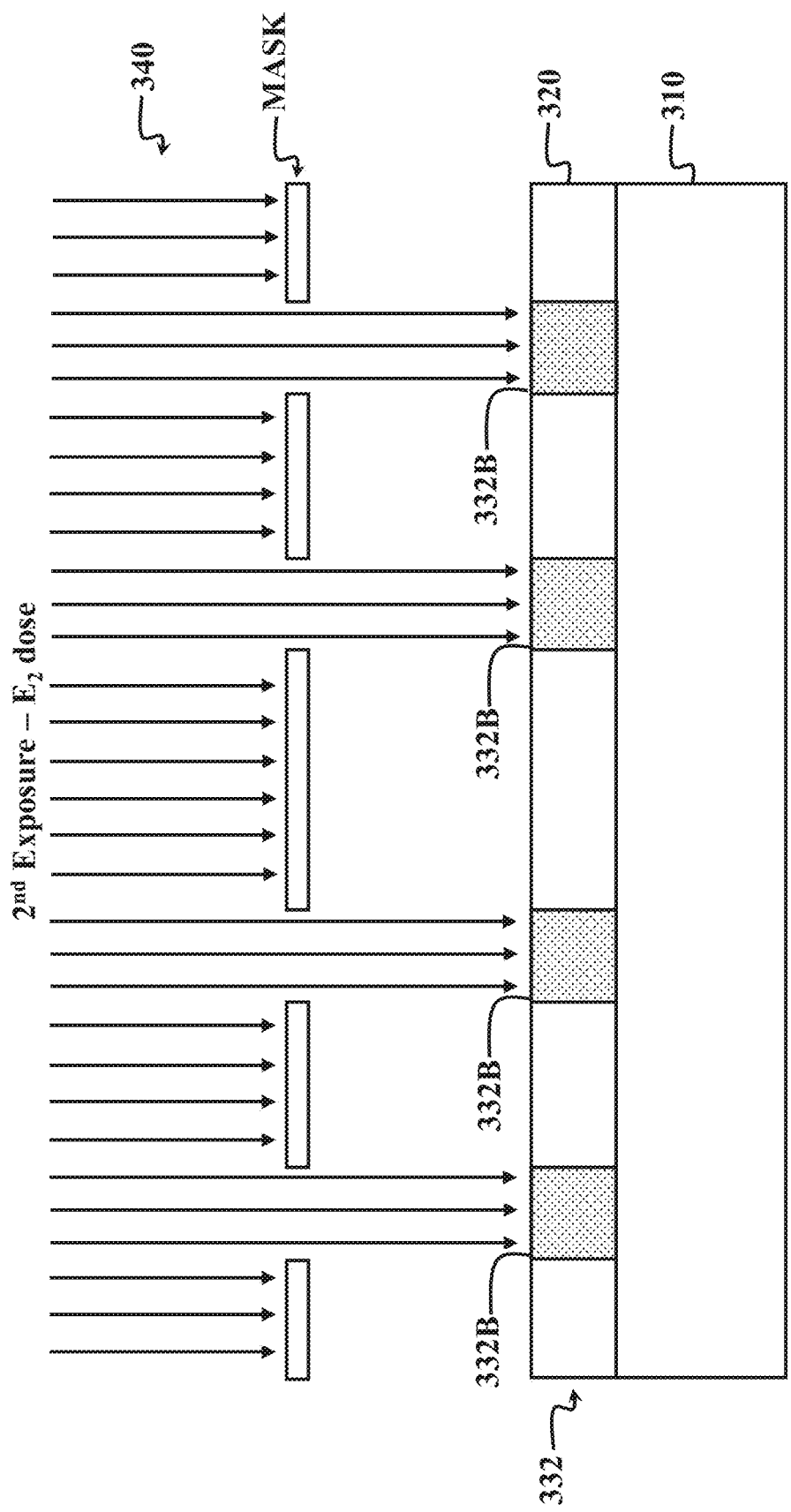
Figure 3D:
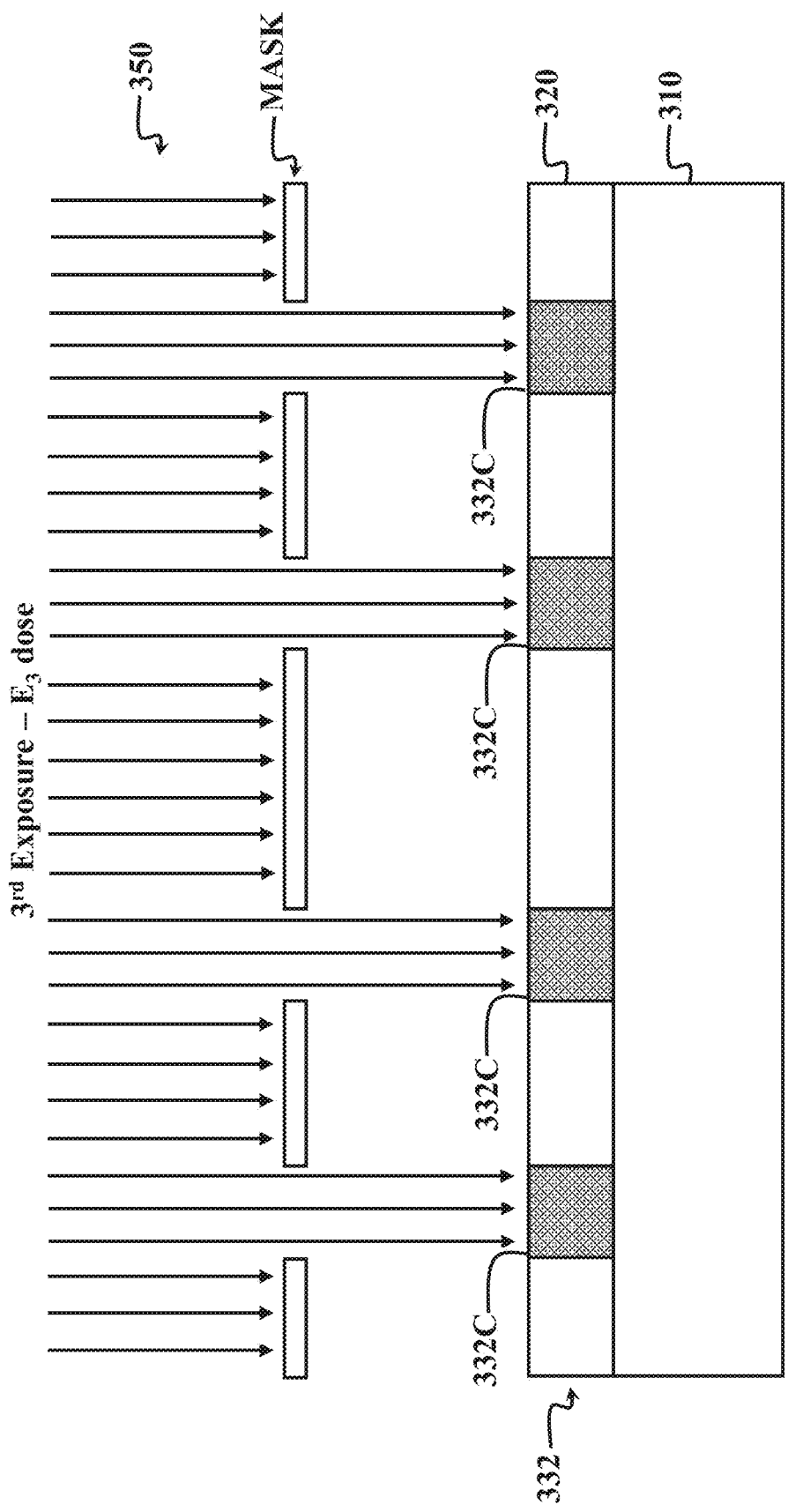

In FIGS. 3B-3E, the resist layer 320 is patterned to form a patterned resist layer 320A. Patterning the resist layer 320 includes performing a hybrid lithography exposure process that includes more than one exposure process as depicted in FIGS. 3B-3D, where each exposure process uses an exposure dose less than the optimized exposure dose $E_{OP}$ for a corresponding single exposure process. In the depicted embodiment, a first exposure process 330 (FIG. 3B), a second exposure process 340 (FIG. 3C), and a third exposure process 350 (FIG. 3D) each use a different mask patterns to selectively illuminate the resist layer 320 respectively with a first exposure dose ($E_1$), a second exposure dose ($E_2$), and a third exposure dose ($E_3$) of radiation, thereby forming a latent image pattern 332 in the resist layer 320. Here a mask pattern refers to the same IC pattern formed in a different portion of a mask or a different mask. In the present case, exemplary three exposure processes are described only for better illustration and explanation. It is not limiting to the total exposure number L. The first exposure dose ($E_1$), the second exposure dose ($E_2$), and the third exposure dose ($E_3$) are each less than the optimized exposure dose ($E_{OP}$). Further, in the present example, a total exposure dose ($E_T$) of the first exposure dose ($E_1$), second exposure dose ($E_2$), and third exposure dose ($E_3$) is approximately equal to the optimized exposure dose ($E_{OP}$) (in other words, $E_T=E_1+E_2+E_3 \geq E_{OP}$), so that the latent image pattern 332 is developable after the third exposure process 350. In the depicted embodiment, the first exposure process 330, the second exposure process 340, and the third exposure process 350 illuminate the resist layer 320 with radiation having a wavelength less than about 100 nm, such as radiation in an extreme ultraviolet (EUV) range, x-ray range, deep ultraviolet range, vacuum ultraviolet range, or combinations thereof. In an example, the radiation is EUV radiation having a wavelength equal to about 13.5 nm. Alternatively, the radiation has a wavelength range greater than about 100 nm. For example, a radiation source may be a light source, such as a krypton fluoride (KrF) excimer laser with a wavelength of 248 nm, an argon fluoride (ArF) excimer laser with a wavelength of 193 nm, a fluorine dimer ($F_2$) excimer laser with a wavelength of 157 nm, or other light sources. It is noted that, in alternate embodiments, only two exposure processes or more than three exposure processes may form a developable latent image pattern in the resist layer 320.

The mask patterns used in the first exposure process 330, the second exposure process 340, and the third exposure process 350 include a pattern, such as an integrated circuit pattern according to a design layout, which is transferred to the resist layer 320 during each of the exposure processes 330, 340, and 350. In an example, different mask patterns having the same integrated circuit pattern are used in the first exposure process 330, the second exposure process 340, and the third exposure process 350.

Figure 4A:
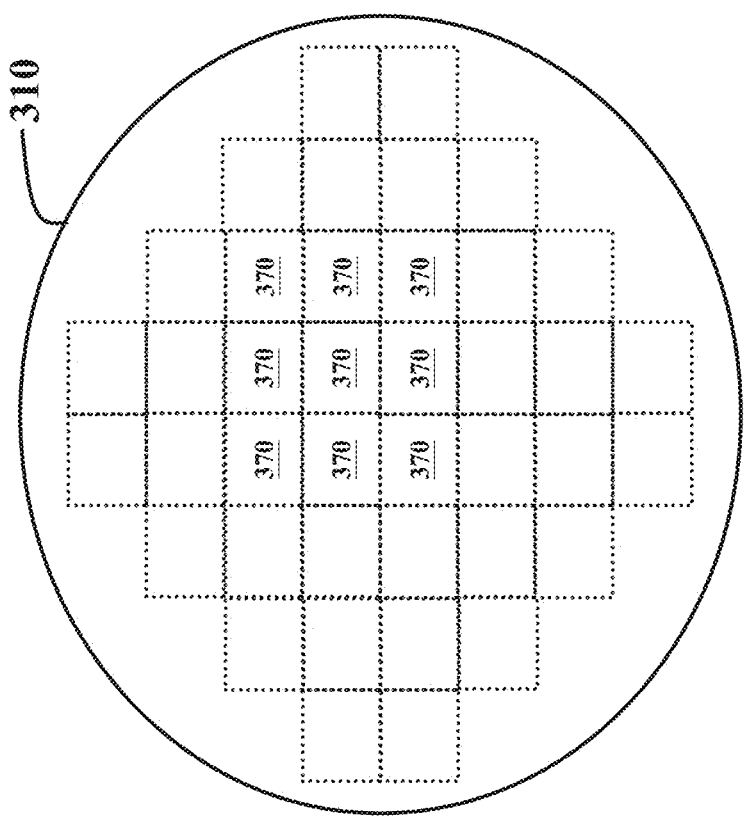
FIGS. 4A, 4B, 4C, 4D and 4E are top schematic views of patterning a resist layer (such as the resist layer in FIGS. 3A-3E) using different mask patterns in the method of FIG. 2 according to various aspects of the present disclosure.
Figure 4A:
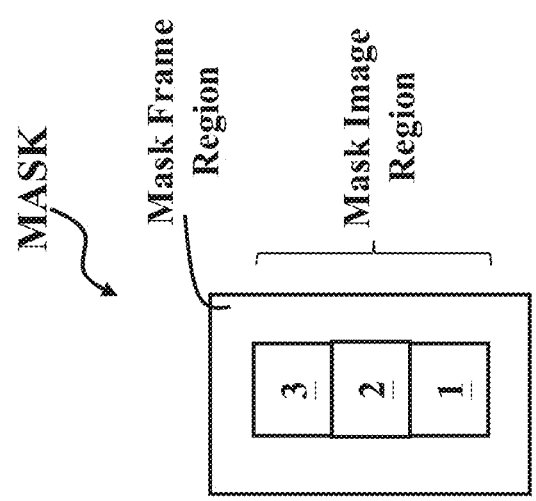
Figure 4C:
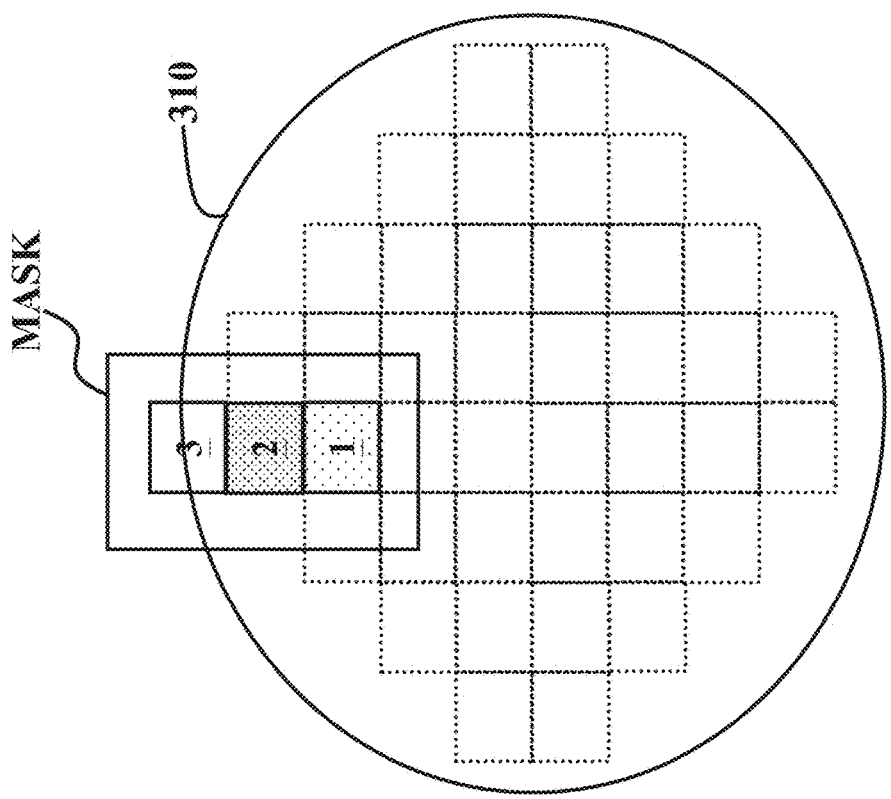

In the following example, a group of exposure processes associated with one mask is further described. Different portions of a same mask having the same integrated circuit pattern are used in the first exposure process 330, the second exposure process 340, and the third exposure process 350. For example, referring to FIGS. 4A-4E, a first portion of a mask having the integrated circuit pattern is used in the first exposure process 330, a second portion of the mask (that is different than the first portion) having the same integrated circuit pattern is used in the second exposure process 340, and a third portion of the mask (that is different than the first portion and the second portion) having the same integrated circuit pattern is used in the third exposure process 350. Those portions of the mask are referred to as sub-regions of the mask. IC pattern defined on those sub-regions of the mask are identical. In FIG. 4A, a MASK includes a mask imaging region and a mask frame region, where the mask imaging region includes a first portion (or a first mask sub-region) that includes an integrated circuit pattern 1, a second portion (or a second mask sub-region) that includes an integrated circuit pattern 2, and a third portion (or a third mask sub-region) that includes an integrated circuit pattern 3. In the depicted embodiment, the integrated circuit patterns 1, 2, and 3 are the same integrated circuit patterns. The MASK is used to transfer the integrated circuit patterns 1, 2, and 3 (which are the same) to a wafer 310, particularly to the resist layer 320 (not shown in FIGS. 4A-4E) deposited on the wafer 310, multiple times. For example, the MASK is used in a multiple exposure process to transfer the integrated circuit pattern to various subfields of the wafer 310. Those sub-regions of the MASK have the same pattern defined thereon. Each field represents an area of the wafer 310 that will be exposed at a given time, and each field corresponds to the mask image region. Each subfield represents an area of the wafer 310 that will be exposed at a given time, and in the depicted embodiment, each subfield corresponds to a mask sub-region. A subfield is indicated as 370 in FIG. 4A. A subfield may define an integrated circuit die that will eventually be cut off from the wafer 310 and be packaged into a single circuit chip. Alternatively, a subfield may define a plurality of integrated circuit dice that will eventually be packaged into a plurality of circuit chips. In the existing method, the lithography process is field-based process while the disclosed method is subfield-based process. This will be further explained through the following description. In one example, an exposure tool (such as a stepper or a scanner) processes one or more subfields, then processes next one or more subfields, and so on, such that each subfield 370 is exposed to the integrated circuit patterns 1, 2, and 3 defined in the first, second, and third sub-regions of the MASK, respectively.

Figure 4B:
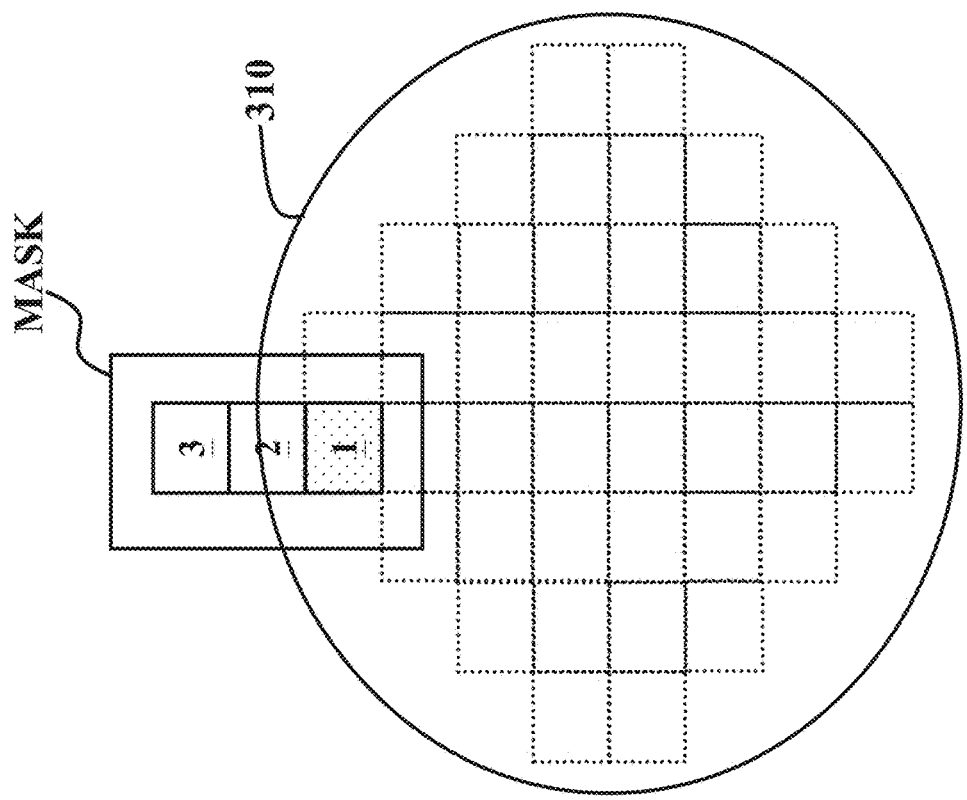

For ease of discussion, the present example illustrates full exposure of a single integrated circuit device area 370 (top, left integrated circuit device area 370 of the wafer 310). However, it is understood that multiple integrated circuit device areas 370 are processed and fully exposed during wafer fabrication. Referring to FIG. 3B and FIG. 4B, the first exposure process 330 aligns the first sub-region of the MASK having the integrated circuit pattern 1 with one of subfields 370 (here, the top, left subfields 370) and projects radiation of the first exposure dose ($E_1$) onto the MASK. A portion of the radiation is transmitted to the resist layer 320, thereby transferring the integrated circuit pattern 1 of the first sub-region of the MASK to the resist layer 320 to form the latent image pattern 332 that includes latent image portions 332A. In the depicted embodiment, where the resist layer 320 includes a positive-tone resist material, the latent image portions 332A become partially soluble. Then, referring to FIG. 3C and FIG. 5C, the second exposure process 340 aligns the second portion of the MASK having the integrated circuit pattern 2 with the same subfields 370 (here, the top, left subfields 370) and projects radiation of the second exposure dose ($E_2$) onto the MASK. The first sub-region of the MASK also aligns with another subfield 370 of the wafer 310 during the second exposure process 340. A portion of the radiation is transmitted to the resist layer 320, thereby transferring the integrated circuit patterns 1 and 2 of the first and second sub-regions of the MASK to the resist layer 320, respectively. In the present example, solubility of the latent image pattern 332, particularly the latent image portions 332A, is increased in the top, left subfields 370. The latent image pattern 332 thus includes latent image portions 332B, which are more soluble than the latent image portions 332A. The solubility of the latent image portions is increased because of the additional exposure dose provided in the second exposure process 340. In furtherance of the present example, the other subfields 370 exposed to the first portion of the MASK include the latent image portions 332A since it has been subjected to only the second exposure process 340. Referring to FIG. 3D and FIG. 4D, the third exposure process 330 aligns the third sub-region of the MASK having the integrated circuit pattern 3 with the same subfields 370 (here, the top, left subfields 370) and projects radiation of the third exposure dose ($E_3$) onto the MASK. A portion of the radiation is transmitted to the resist layer 320, thereby transferring the integrated circuit patterns 1, 2, and 3 of the first, second, and third sub-regions of the MASK to the resist layer 320, respectively. In the present example, solubility of the latent image pattern 332, particularly the latent image portions 332B, is increased in the top, left subfields 370. The latent image pattern 332 thus includes latent image portions 332C, which are more soluble than the latent image portions 332B. This procedure is repeated to other masks until all M masks are implemented. Because the total exposure dose of the first exposure dose ($E_1$), the second exposure dose ($E_2$), the third exposure dose ($E_3$), . . . , and the $L^{th}$ exposure dose are approximately equal to the optimized exposure dose ($E_{OP}$), the latent image portions are soluble so that latent image pattern 332 is developable in the top, left integrated circuit device area 370. Those exposure doses ($E_i$) are equal to or different from each other according to various embodiments. In one example where the exposure doses ($E_i$) are equal from each other, then each exposure dose $E_i = E_{OP}/L = E_{op}/(M*N) = E_{op}/(M*N_x*N_y)$. In the above formula, N represents a total number of sub-regions of the MASK and those subfields are configured on the MASK as an $N_x \times N_y$ array. In the example of the MASK in FIG. 4A, the MASK includes 3 sub-regions configured in an 1*3 array, therefore, N, $N_x$ and $N_y$ are 3, 1 and 3, respectively, in this example.

Figure 4E:
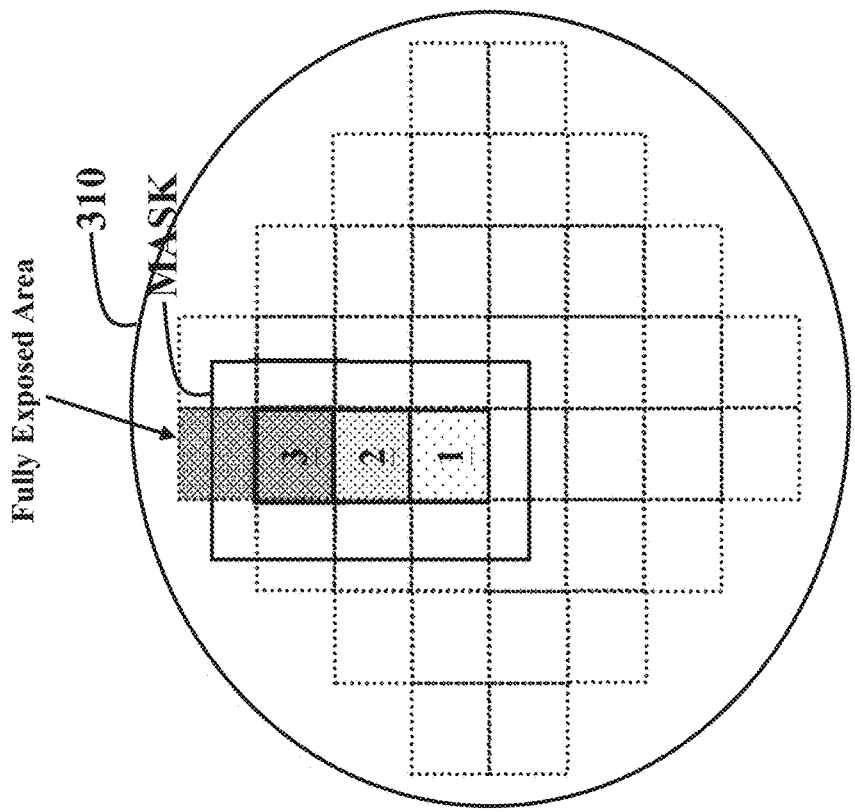
Figure 4D:
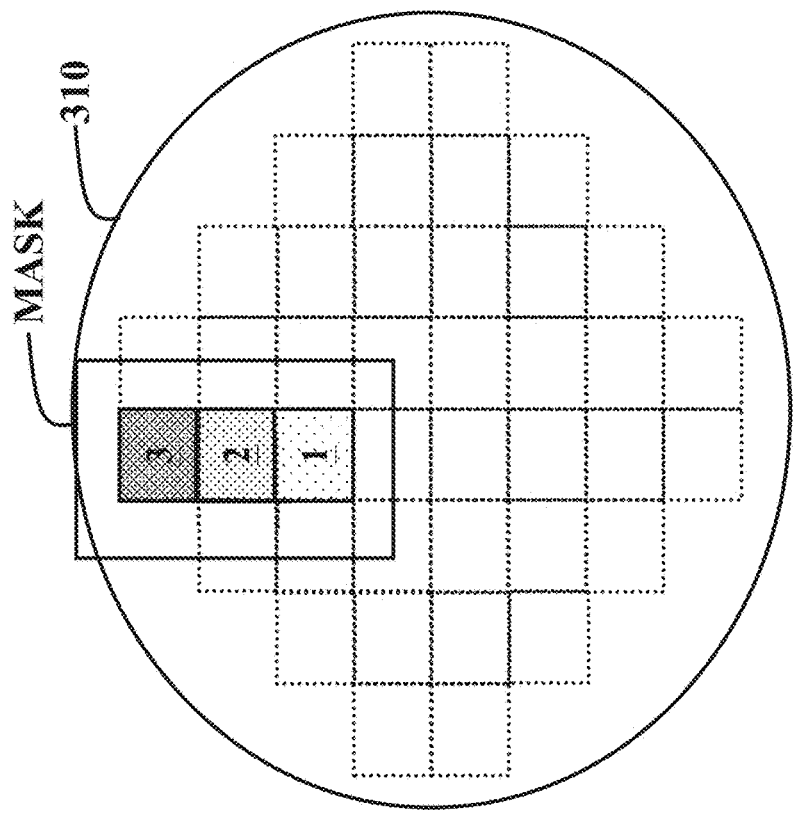

In FIG. 4E, as a subsequent exposure process is performed, the top left subfield 370 has been fully exposed since it has received the optimized exposure dose. The aforementioned multiple exposure process is fully compatible with the actions taken by a scanner when exposing the whole wafer by stepping and scanning. The wafer stage of the scanner only needs to move by a fraction of the field size (one or more subfields of the wafer or one or more sub-regions in term of the MASK) in the scanning direction during stepping in the scanning direction and move by the full field size in the scanning direction during scanning. The impact to wafer throughput resulting from the multiple exposure process can thus be minimized. Besides reducing the impact of randomly distributed mask defects (including phase defects, pattern defects, and particles), the method is also effective in reducing the impacts of other random errors, such as line edge roughness and registration errors of mask patterns.

Using a multiple exposure process to form the latent image pattern 332 in the resist layer 320, where each exposure process exposes the resist layer 320 to a same pattern using an exposure dose that is less than the optimized exposure dose, reduces impact of defects or defect regions of the masks used during the multiple exposure process. For example, in the depicted embodiment, the masks used during the first exposure process 330, the second exposure process 340, and the third exposure process 350 have defects or defect regions, such as those described with reference to the mask 100 illustrated in FIG. 1. When different mask patterns are used, including different masks or different sub-regions of the masks, one or more of the different mask patterns include a phase-defect region. Because the exposure dose projected onto one mask pattern (defined in a sub-region of one mask) is less than the optimized exposure dose, only contributes a small fraction of the total exposure dose (such as $E_{op}/(M*N_x*N_y)$ in one example, and the impact of such phase-defect from the corresponding sub-region of one mask is greatly reduced. Since such defects are randomly located on the various masks or various sun-regions of the mask, no defect will receive a full exposure dose. More specifically, an aerial image intensity impacted by each individual defect is reduced, thereby reducing printability of such defect. Different embodiments may have different advantages, and no particular advantage is required of any embodiment. In an example, the exposure dose for each exposure process approximately equals the optimized exposure dose ($E_{OP}$) divided by L, where L is a total number of exposure processes. Accordingly, in the present example, the first exposure dose ($E_1$), the second exposure dose ($E_2$), . . . , and the $L^{th}$ exposure dose ($E_1$) are equal to 1/L of the optimized exposure dose ($E_{OP}$). Alternatively, the first exposure dose ($E_1$), the second exposure dose ($E_2$), . . . , and the $L^{th}$ exposure dose ($E_1$) are approximately equal to varying fractions of the optimized exposure dose ($E_{OP}$). The exposure dose of each of the plurality of EUV exposure processes can be adjusted according to defect printability. For example, if a defect on a mask is printable, the exposure dose for the mask is then reduced and becomes unprintable.

Figure 3E:
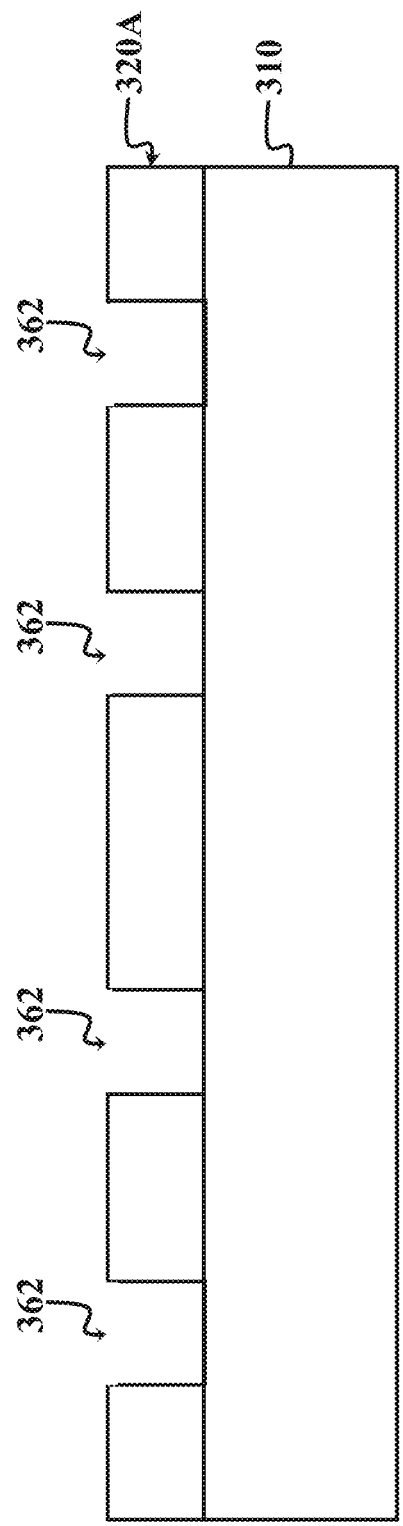

Subsequently, the resist layer 320 may be subjected to a post-exposure bake (PEB) process. Referring to FIG. 3E, a developing process is performed on the resist layer 320, thereby forming the patterned resist layer 320A. During the developing process, a developing solution is applied to the resist layer 320. In an example, the developing solution is a basic solution, such as tetramethylammonium hydroxide (TMAH). Any concentration level of TMAH developer solution is utilized depending on characteristics of the resist layer 320, such as approximately 2.38% TMAH developer solution. The developing solution removes exposed or unexposed portions of the resist layer 320 depending on the resist material. For example, in the present example, the resist layer 320 includes positive-tone resist material, so the developing process removes (dissolves) the exposed portions of the resist layer 320 (the latent image pattern 322), leaving the unexposed portions of the resist layer 320 over the wafer 310. Alternatively, where the resist layer 320 includes negative-tone resist material, the developing process removes (dissolves) the unexposed portions of the resist layer 320, leaving the exposed portions of the resist layer 320 over the wafer 310. A rinsing process, such as a de-ionized (DI) water rinse. The rinsing process may remove residue particles. The patterned resist layer 320A includes openings 362 that expose portions of the underlying wafer 310. Subsequent processes may include etching the portions of the wafer 310 exposed within the openings of the patterned resist layer 320A. Alternatively, metal deposition, ion implantation, or other processes can be carried out over/on the wafer 310. The patterned resist layer 320A may then be removed (or stripped) by any suitable process. For example, the patterned resist layer 320A may be removed with a fluid (or stripping solution). In some instances, where the exposed portions of the wafer 310 are subjected to an ion bombardment or plasma treatment process, the fluid strips the ion bombarded, patterned resist layer 320A and/or the plasma treated, patterned resist layer 320A. After the patterned resist layer 320A is removed, subsequent processing may continue to complete fabrication of an integrated circuit device. For example, additional patterning processes, etching processes, deposition processes, and other processes may be performed to form additional features of the integrated circuit device.

Figure 5:
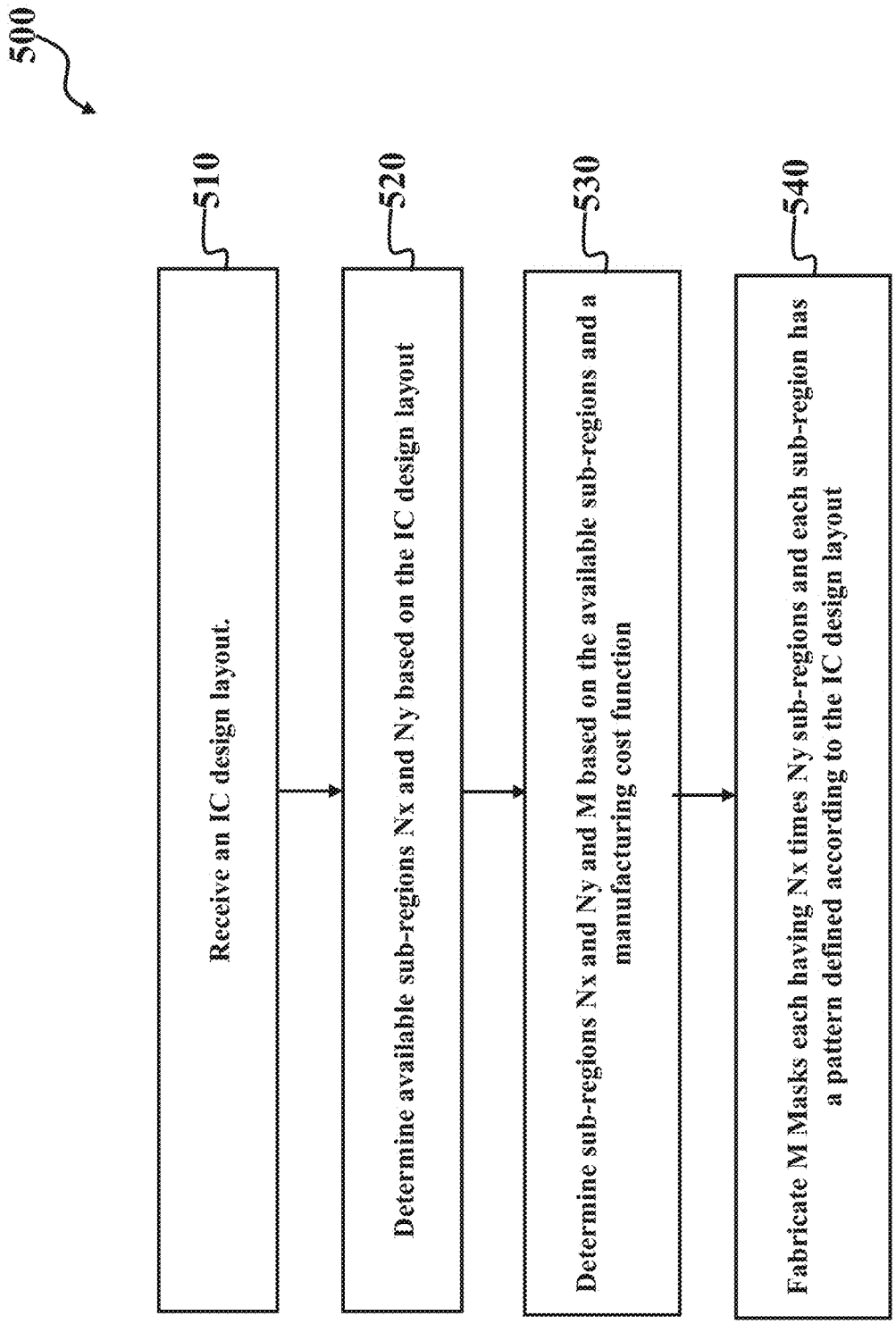
FIG. 5 is a flowchart of a method for a hybrid lithography exposure process according to various aspects of the present disclosure.

FIG. 5 is a flowchart of a method 500 for a hybrid lithography exposure process in accordance with some embodiments. The method begins at block 510 by receiving an IC design layout or simply an IC pattern. The IC pattern may be a portion of an integrated circuit, such as a pattern to be formed on one material layer of a semiconductor die. The IC pattern is either from an IC designer or further modified by a mask maker according to semiconductor fabrication technology. For example, the IC pattern is further incorporated with various dummy features to the IC pattern to improve fabrication, such as reducing loading effects (etching or polishing loading effect) and smoothing the pattern density. In another example, the IC pattern is modified according optical proximity correction (OPC) for resolution enhancement to the lithography exposure process.

The method proceeds to an operation 520 by determining available sub-regions (also referred to as candidate sub-regions) based on the IC pattern. This is described with reference to FIG. 4A. As illustrated in FIG. 4A, a mask includes a mask image region that further includes multiple mask image sub-regions. Those mask image sub-regions are also simply referred to as sub-regions. The patterns formed in the sub-regions of the mask are identical. Furthermore, the patterns formed in the sub-regions of M masks are all identical. In one example, any sub-region includes an IC pattern for one chip. As noted above, the sub-region may include a pattern for multiple chips, such as a chip array. The number of sub-regions can be achieved depends on the chip size since the sub-region includes at least one chip. In the example of the MASK of FIG. 4A, the MASK includes three sub-regions, each having the IC pattern formed therein, in which the IC pattern may correspond one or more chips. The number ("N") of the sub-regions is determined according to the IC pattern in the operation 520. The number N may be 1*3, 2*2, 2*3 or other suitable integer.

Figure 6A:
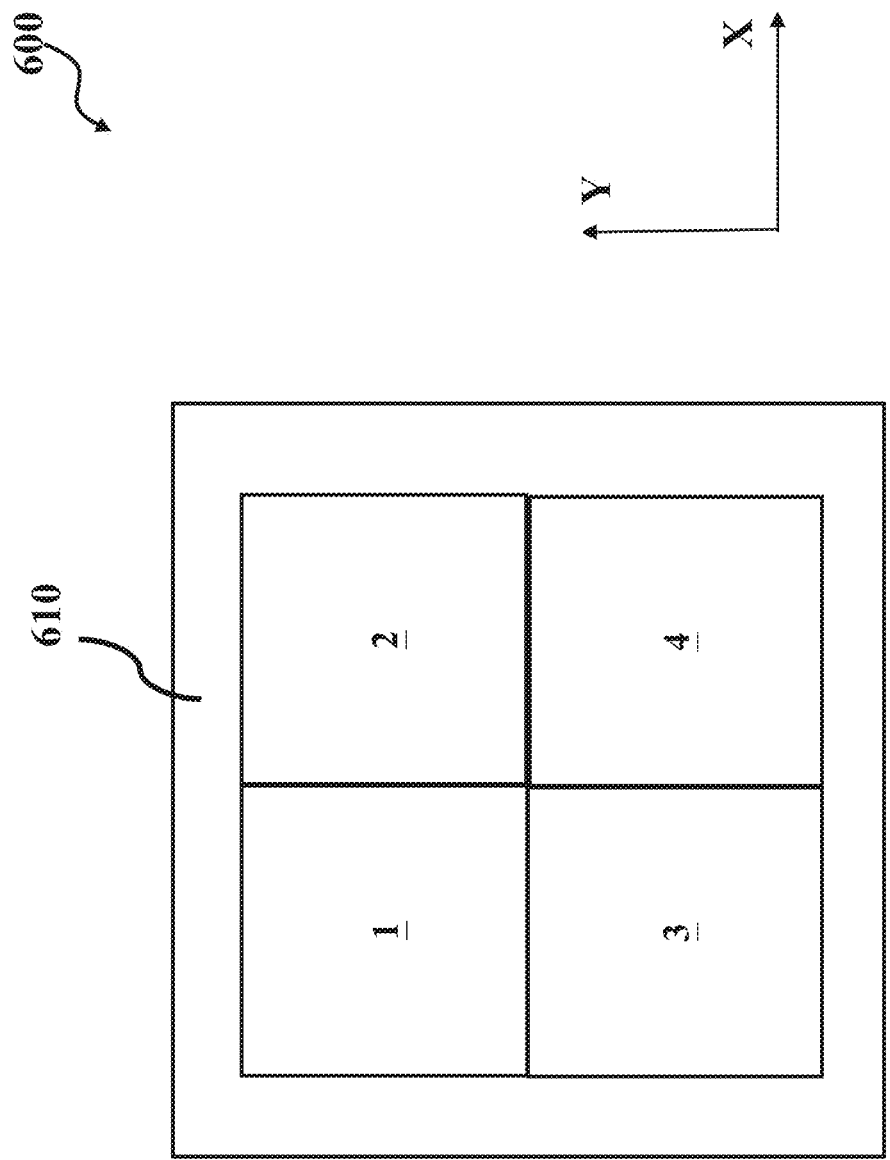
FIG. 6A is a top view of a mask in accordance with some embodiments.
Figure 6B:
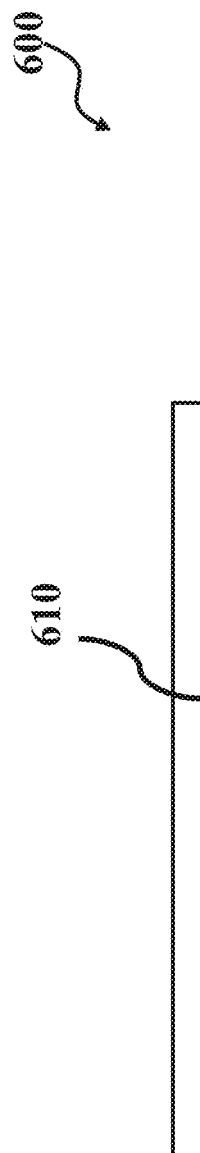
FIG. 6B is a top view of a mask in accordance with some embodiments.

FIG. 6A illustrates a mask 600 having 4 sub-regions. The mask 600 includes a mask frame region 610 and 4 mask image regions as sub-regions 1, 2, 3, and 4, respectively. Each sub-region includes the IC pattern formed therein. Those 4 sub-regions are arranged in in a 2*2 array. Alternatively, the 4 sub-regions are arranged in in a 1*4 array, as illustrated in FIG. 6B. Generally, the sub-regions are arranged in an array having $N_x$ sub-regions along one direction (X direction in FIG. 6A) and $N_y$ sub-regions along another direction (Y direction in FIG. 6A). The number N of the sub-regions on the mask is $N_x*N_y$, or $N=N_x*N_y$. Therefore, the operation 520 also determines available $N_x$ and $N_y$. In the present example, the available $N_x$ and $N_y$ are 2 and 2, respectively. Each sub-region may include an IC pattern corresponding to a single chip or alternatively multiple chips. For example, each sub-region may represent a pattern for 2*2 chips. Thus, the following operation may have freedom to choose 2*2, 2*4, 4*2 or 4*4 sub-regions. In other words, available $N_x*N_y$ includes 2*2, 2*4, 4*2 and 4*4.

When the mask is imaged to a wafer, the corresponding area on the wafer is a field, as noted above. Similarly, the sub-regions correspond to sub-areas of the field. Those sub-areas on the wafer are referred to subfields.

The method 500 proceeds to an operation 530 by determining sub-regions $N_x$ and $N_y$, and mask number M based on the available sub-regions and a manufacturing cost function. The sub-regions $N_x$ and $N_y$ can only be chosen from the available sub-regions determined at the operation 520. For example, the available sub-regions $N_x*N_y$ includes 2*2, 2*4, 4*2 and 4*4. The sub-regions $N_x$ and $N_y$ can only be chosen from those available. In the operation 530, the sub-regions $N_x$ and $N_y$ is determined further according to the manufacturing cost function. The manufacturing cost function is a function to evaluate the overall fabrication cost that includes mask making cost and wafer making cost associated to the hybrid lithography exposure process. The mask making cost further includes blank mask cost (the cost of mask substrates not patterned yet) C1, mask patterning cost C2 and mask repair cost C3. In some example, the mask making cost additionally includes a cost associated with mask complexity, such as represented by a mask complexity parameter. When the mask pattern is more complicated, the mask patterning cost is higher. In the present case, the multiple masks (the number is M) are used. The blank mask cost equals to the one blank mask cost times M. However, since masks with defects can be used for this purpose and the masks with defects are much cheaper. The blank mask cost (the cost of a blank mask with defects times M) can be reasonable low, may be even lower than the cost of a single blank mask without defect). The mask patterning cost includes the cost of patterning the blank masks and other associated cost. When multiple e-beam writing technology is mature, this cost can be reduced substantially. The mask repair cost includes the cost to repair a mask with defects. Since the hybrid lithography exposure process can tolerate most defects, this cost can be reduced or eliminated. The wafer making cost C4 includes the cost of the associated lithography exposure process. The hybrid lithography exposure process costs more since it includes multiple exposure processes, which includes the cost associated with scanning time and stepping time. Each lithography exposure process includes actions for stepping to a field and scanning a field with associated times. As noted above, the scanning time of the hybrid lithography exposure process is substantially similar to the scanning time of a single conventional lithography exposure process since each exposure process of the hybrid lithography exposure process uses a fraction of (about 1/L) the scanning time of the single conventional lithography exposure process. However, the stepping time of the hybrid lithography exposure process is greater than the stepping time of the single conventional lithography exposure process. The manufacturing cost function Fc can be defined as Fc=f(C1, C2, C3, C4). This function can be linear, such as Fc=a1*C1+a2*C2+a3*C3+a4*C4. The coefficients a1, a2, a3 and a4 are determined according to above cost model. Among the available sub-regions $N_x$ and $N_y$, the sub-regions $N_x$ and $N_y$ are determined from the available sub-regions such the manufacturing cost is minimized or the manufacturing cost function is minimized. In various examples, M, $N_x$ and $N_y$ are determined as [3, 2, 2], [3, 4, 1] or [3, 1, 4].

The method 500 proceeds to an operation 540 by fabricating a number of masks, wherein the number M is determined in the operation 530. Those masks are patterned identically. Particularly, the IC pattern is formed on $N_x$ and $N_y$ sub-regions on each of those masks. The mask fabrication process may use multiple e-beam writing.

Figure 7:
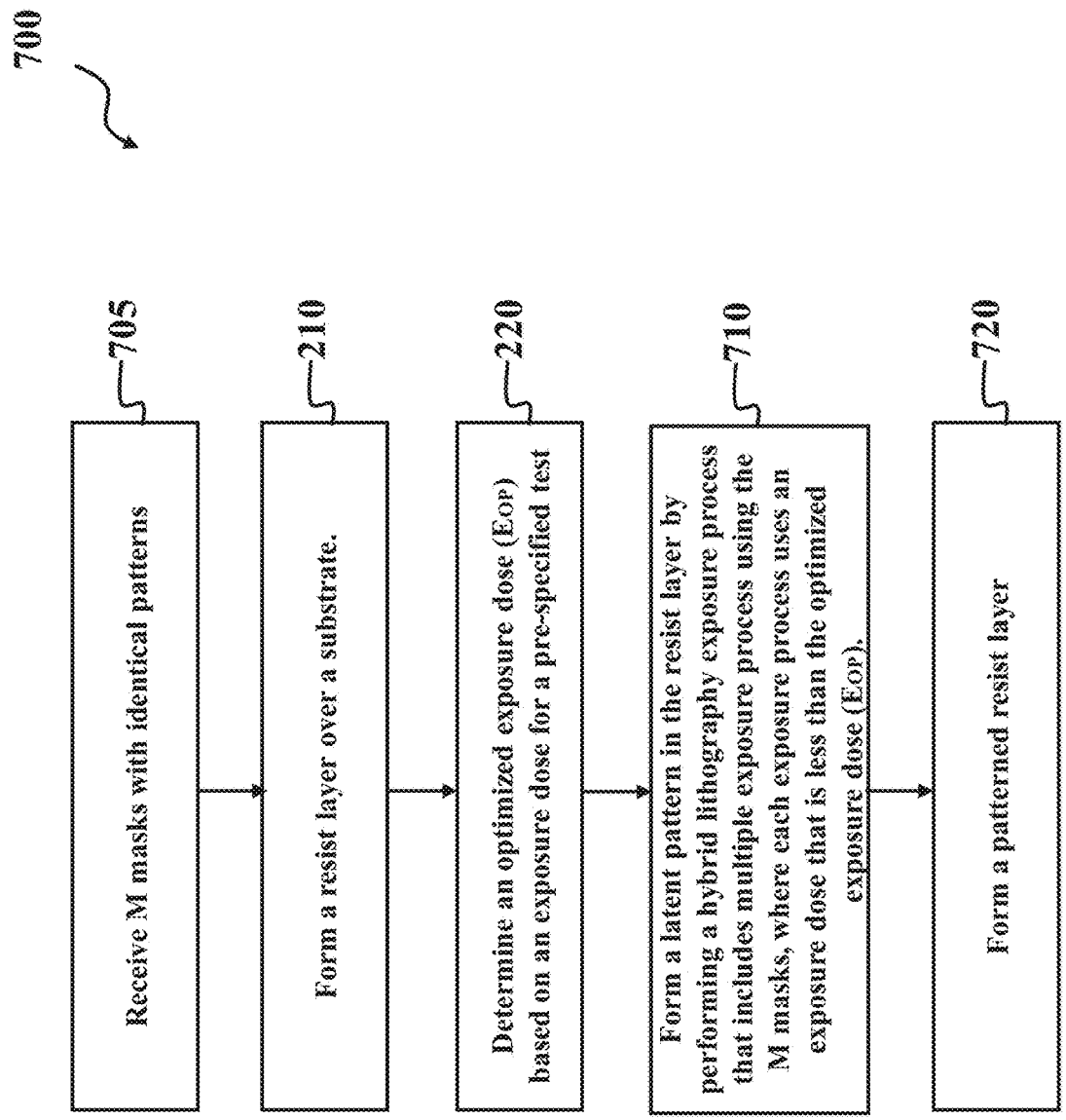
FIG. 7 is a flowchart of a method for forming a patterned resist layer by hybrid lithography exposure process according to various aspects of the present disclosure.

FIG. 7 is a flowchart of a method 700 for a hybrid lithography exposure process in accordance with some embodiments. In one embodiment, the method 700 follows and continues from the method 500. For example, the method 700 may begin at a block 705 by receiving the M masks, which are defined in the operation 540.

The method 700 proceeds to an operation 210 by forming a resist layer on a substrate, such as a semiconductor wafer.

The method 700 proceeds to an operation 220 by determining an optimized exposure dose ($E_{OP}$), as described above in FIG. 2.

The method 700 proceeds to an operation 710 to form a pattern in the resist layer by performing a hybrid lithography exposure process that includes multiple exposure process using the M masks, where each exposure process uses an exposure dose that is less than the optimized exposure dose ($E_{OP}$). The hybrid lithography process includes a number of exposure processes, wherein the number L equals to $M*N_x*N_y$. The parameters M, $N_x$, and $N_y$ are determined at the operation 530 of the method 500. Furthermore, M identical masks are made at the operation 540 of the method 500.

The multiple exposure processes in the hybrid lithography exposure process are divided into M groups paired with M masks, and each group includes multiple (e.g., $N_x*N_y$) exposure processes using the paired mask. Each group is similar to other groups.

Still referring to FIG. 7, after the completion of the hybrid lithography exposure process at the operation 710, the method 700 proceeds to an operation 720 to form a patterned resist layer. The operation 720 includes a developing process using a suitable developer. The operation 720 may further include other processing steps. For example, the operation 720 may include a post-exposure baking before the developing step; cleaning after the developing, and a hard baking after the developing.

Figure 8:
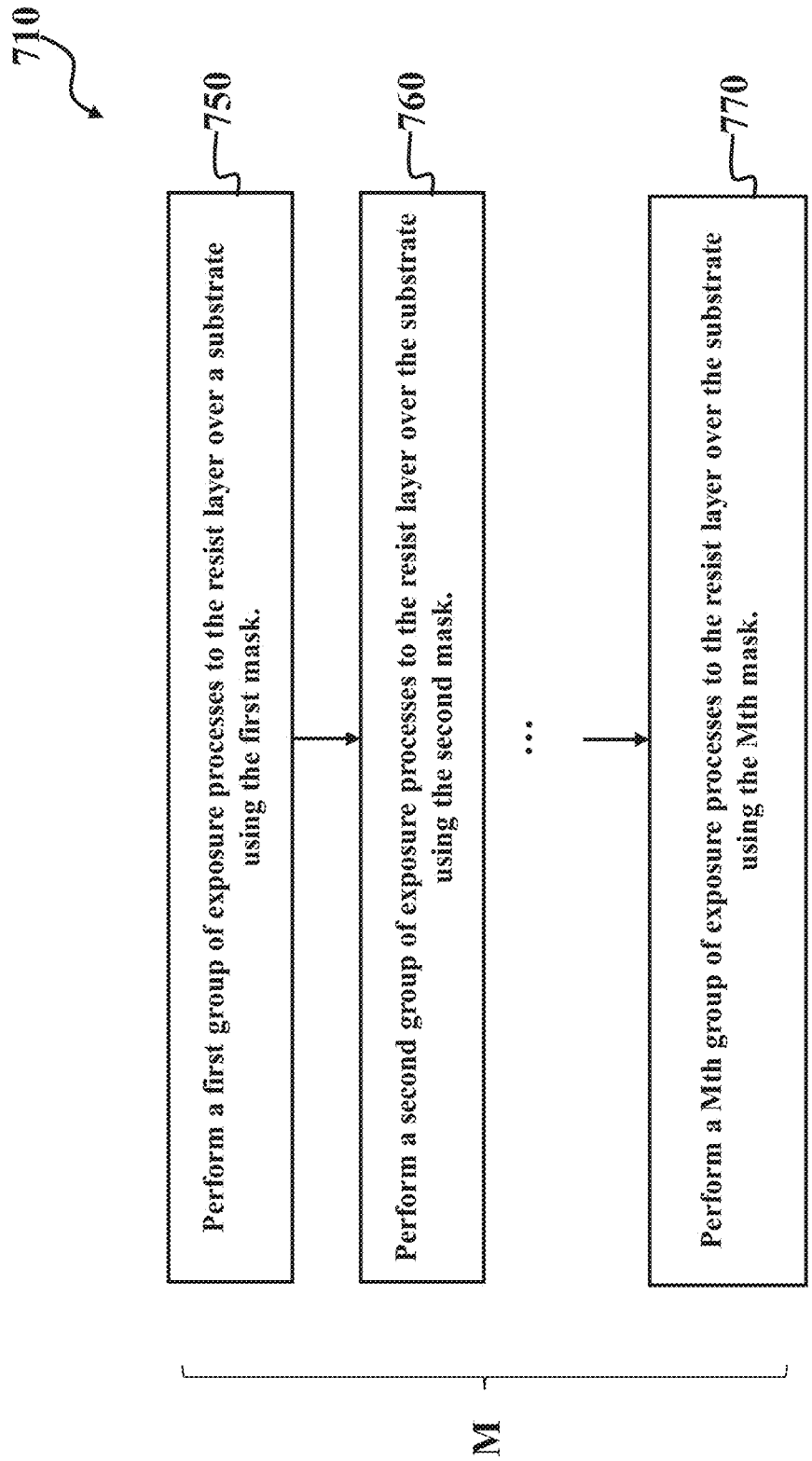
FIG. 8 is a flowchart of an operation in FIG. 7 for forming a patterned resist layer by hybrid lithography exposure process according to various aspects of the present disclosure.

Referring to FIG. 8, the operation 710 includes M groups of exposure processes, such as a first group of exposure processes to the resist layer over a substrate using the first mask at block 750; a second group of exposure processes to the resist layer over a substrate using the first mask at block 760; . . . ; and a $M^{th}$ group of exposure processes to the resist layer over a substrate using the $M^{th}$ mask at block 770. Since each group of exposure processes is same to other groups except for using respective masks, only one group (such as the first group in the block 750) of exposure processes is described in details. One group of exposure processes are all implemented by using a same mask, which is one of the M masks.

Figure 9A:
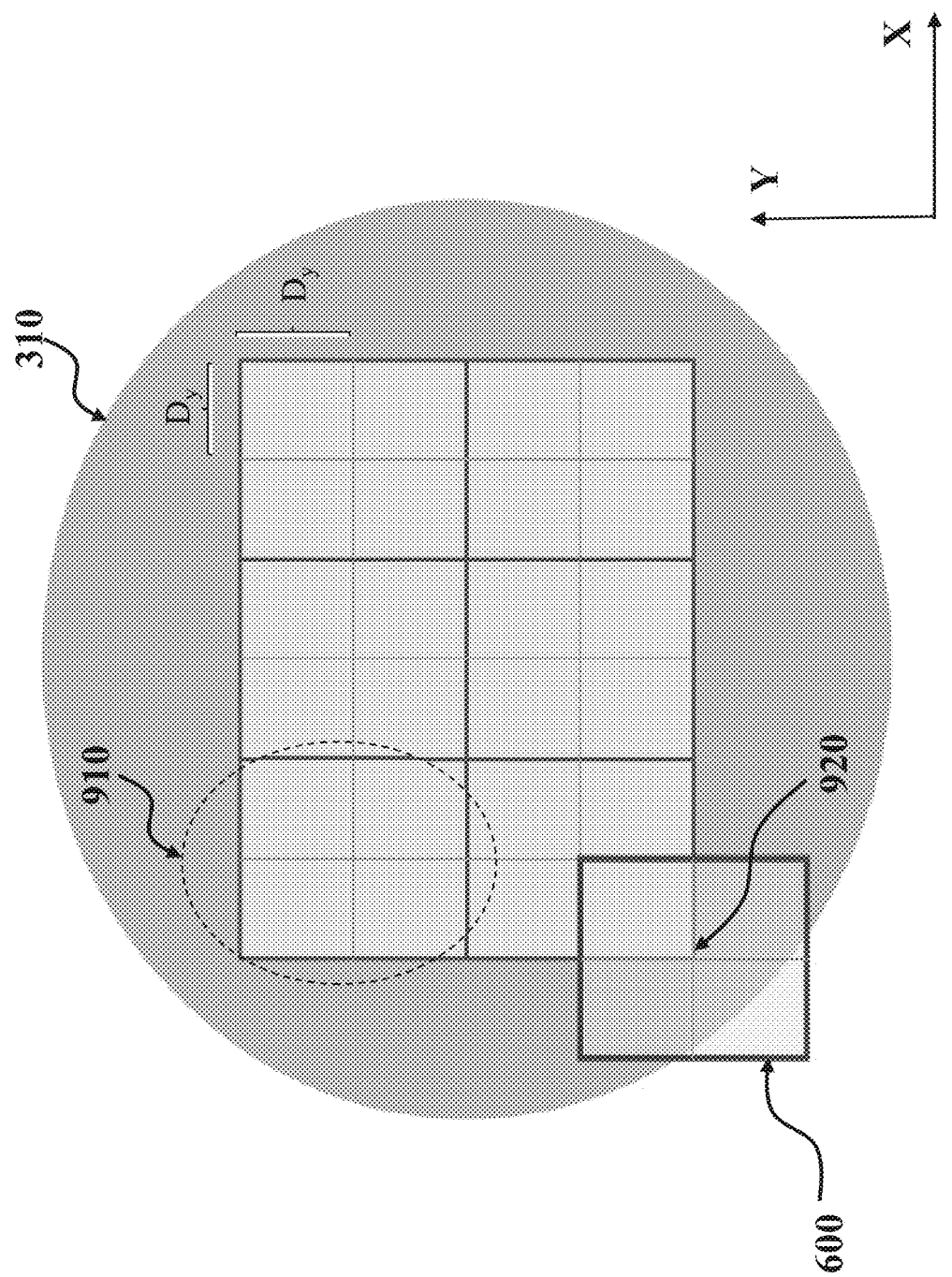

As an example for illustration, assume $N_x$ and $N_y$ are 2 and 2, respectively, as illustrated in FIG. 6A, which means that the mask 600 includes 2*2 sub-regions and a group of exposure processes includes 2*2 exposure processes. One group of exposure processes is illustrated through FIGS. 9A, 9B, 9C, 9D, 9E, 9F, 9G, 9H, 9I, 9J, 9K, 9L, 9M, 9N, 9O, and 9P. In FIG. 9A, the substrate 310 includes only 6 exemplary fields (or 3*2 fields) 910 for illustration. Each field includes $N_x*N_y$ subfields, corresponding to $N_x*N_y$ sub-regions of the mask 310. In the present example, each field includes 2*2 subfields, corresponding to 2*2 sub-regions of the mask 310. A subfield on the wafer is labeled as (i, j), which represents a subfields of an $i^{th}$ along X direction and $j^{th}$ along Y direction, starting from the left-bottom subfield as (1, 1).

The first group of exposure processes in the block 750 are collectively described and illustrated in FIGS. 9A through 9P. Starts at FIG. 9A, the mask 600 is stepped to a position such that the first subfield (1, 1) is covered by the first sub-region of the mask 310. Specifically, the mask 600 is stepped, from the vertex 920 of the first subfield (1, 1), a first distance $D_x$ (corresponding to a dimension of a subfield) in the X direction and a second distance $D_y$ (corresponding to a dimension of a subfield) in the Y direction. Note FIG. 9A is shown in a way for better understanding. Usually, the sub-region has different dimensions from the dimension of the subfield. However, the image of the IC pattern in the sub-region is aligned and mapped to the subfield with same dimensions. It is further noted that the stepping is a relative motion between the mask and the wafer 310. Usually, it is the wafer moves relative to the mask. For simply description and better understanding, it is described as the mask moves by stepping relative to the wafer. Then mask 600 is scanned to form the IC pattern on the first subfield (1, 1) with an exposure dose less than the optimized exposure dose $E_{OP}$. Due to the location of the mask, only the first subfield is exposed by one sub-regions of the mask 600.

Figure 9B:
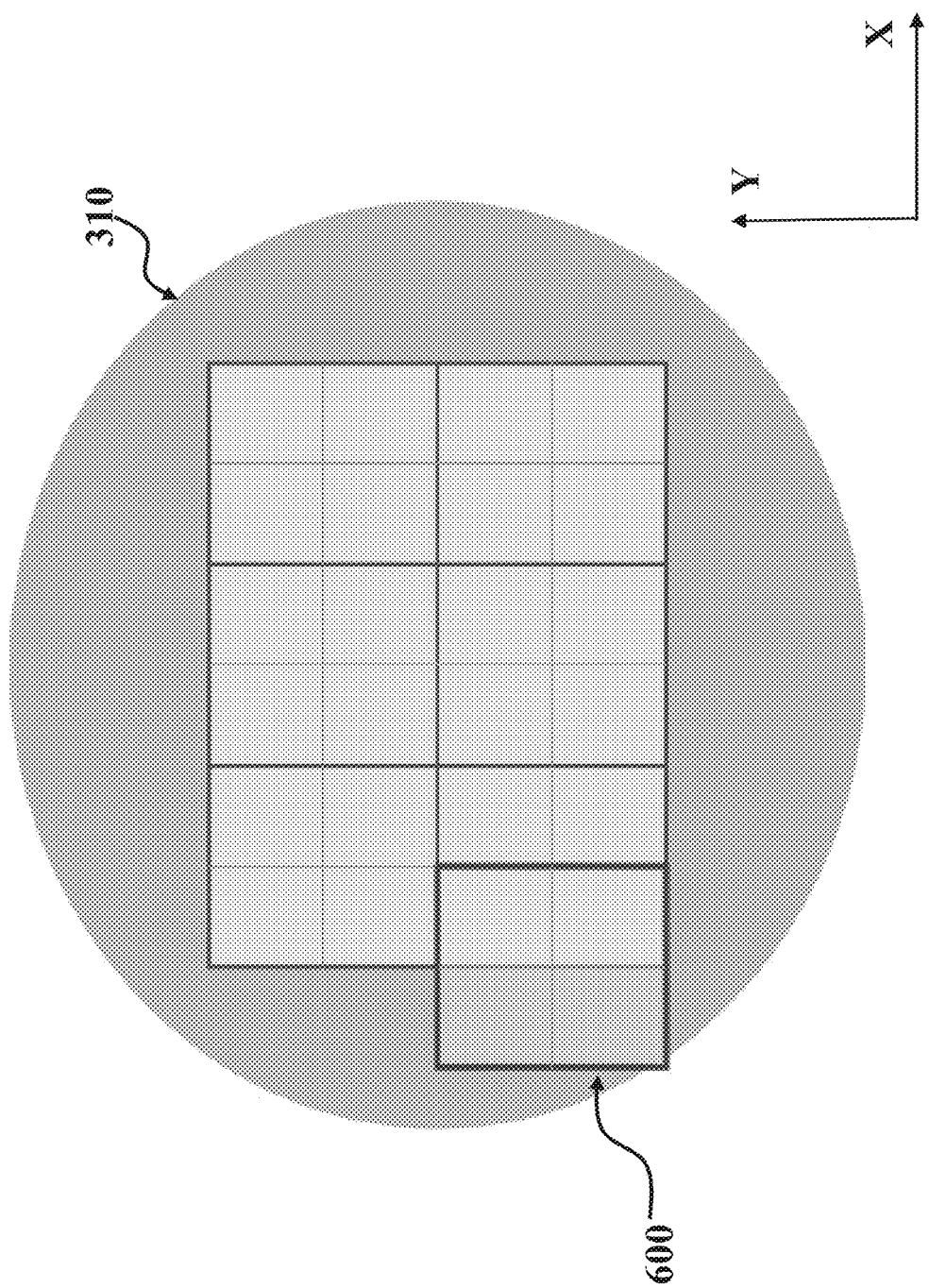

Referring to FIG. 9B, the mask 600 is then stepped $D_y$ along the Y direction to cover another subfield. Then the mask 600 is scanned to form the IC pattern on the two subfields (1, 1) and (1, 2). In other words, only those two subfields (1, 1) and (1, 2) are exposed.

Figure 9C:
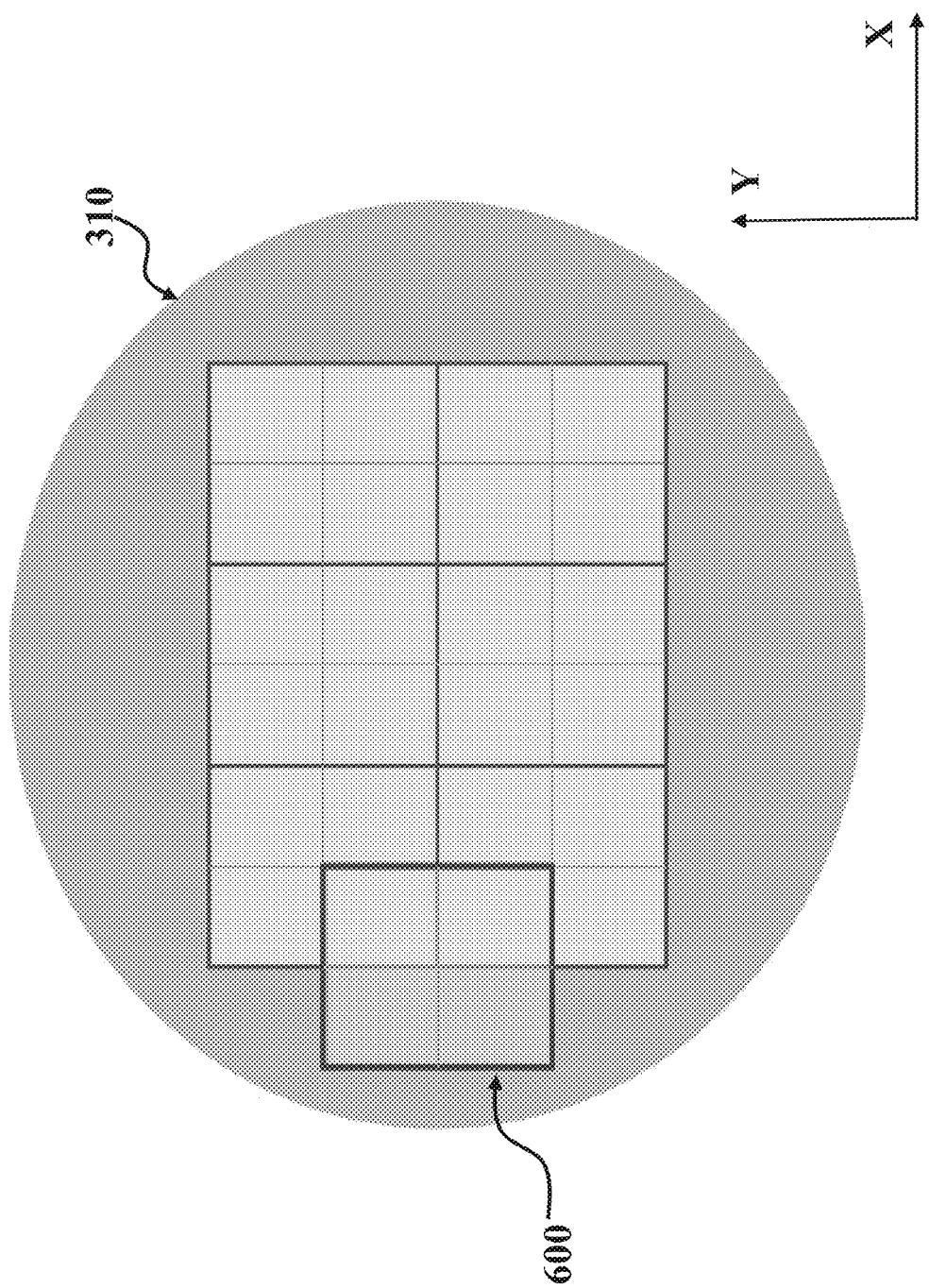

Referring to FIG. 9C, the mask 600 is then stepped another $D_y$ along the Y direction to cover another subfield. Afterward, the mask 600 is scanned to form the IC pattern on two subfields (1, 2) and (1, 3), respectively.

Figure 9D:
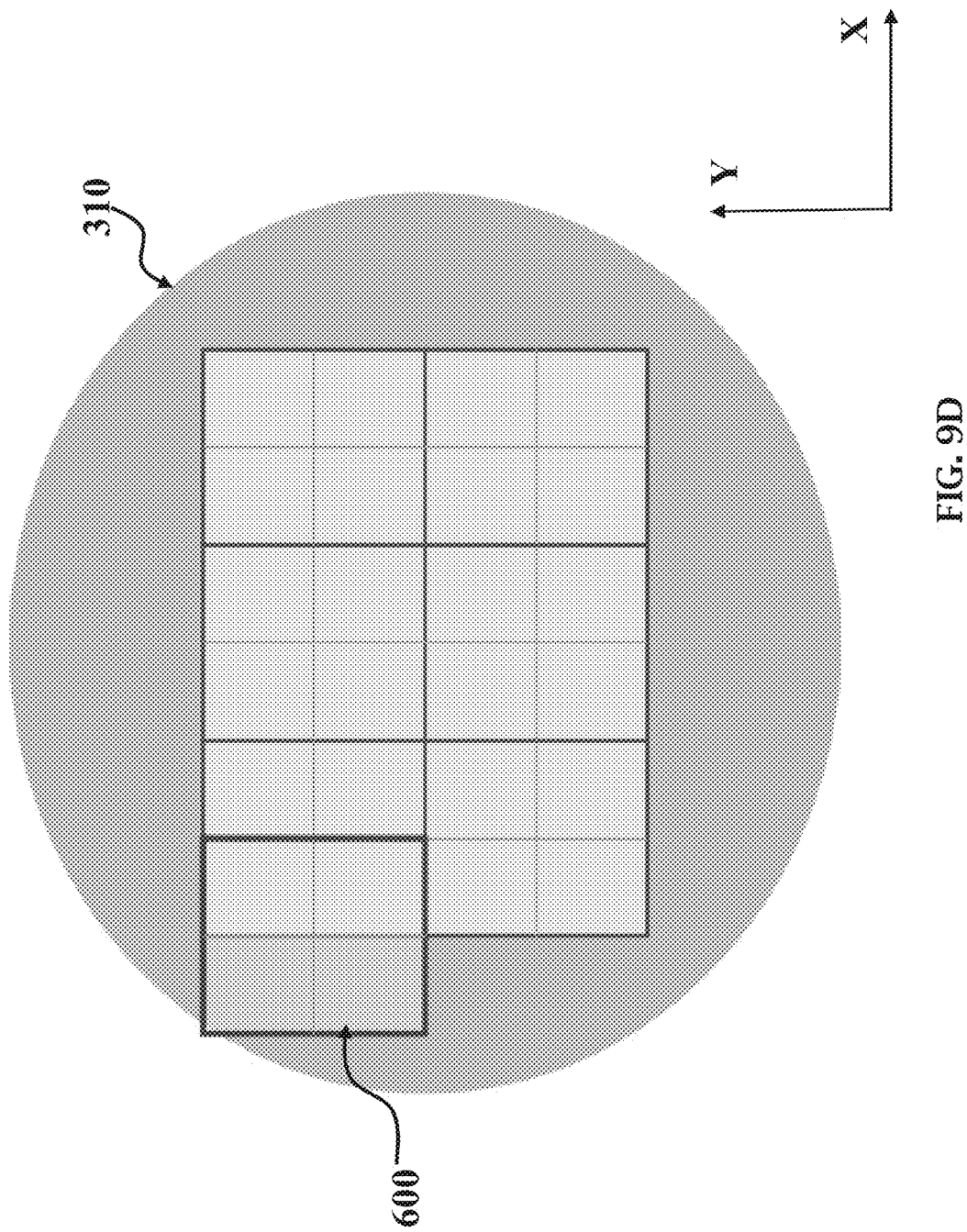

Referring to FIG. 9D, the mask 600 is then stepped another $D_y$ along the Y direction. Afterward, the mask 600 is scanned to form the IC pattern on two subfields (1, 3) and (1, 4). In this case, still two subfields are exposed.

Figure 9E:
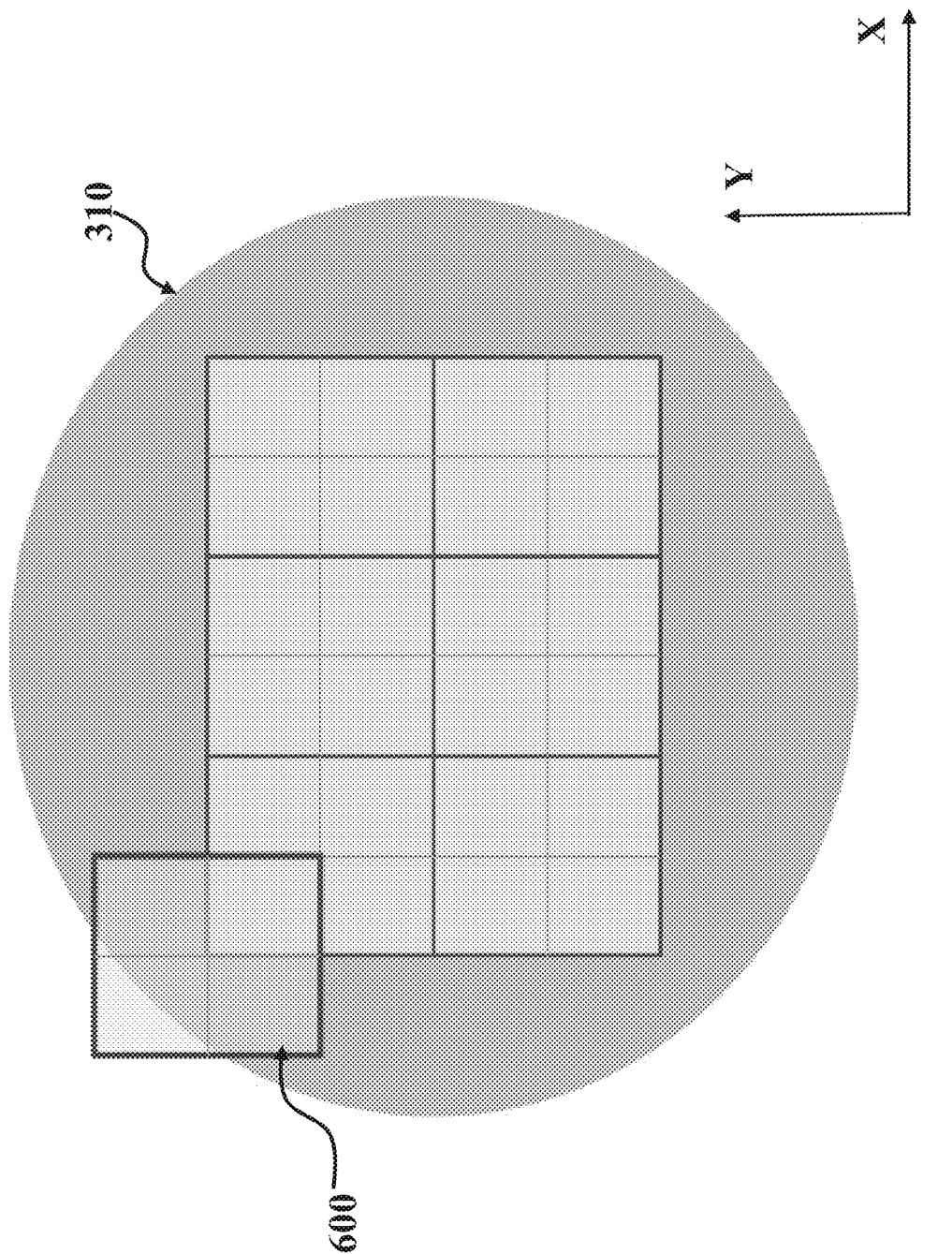

Referring to FIG. 9E, the mask 600 is then stepped $D_y$ along the Y direction. Afterward, the mask 600 is scanned to form the IC pattern only on one subfield (1, 4).

Figure 9F:
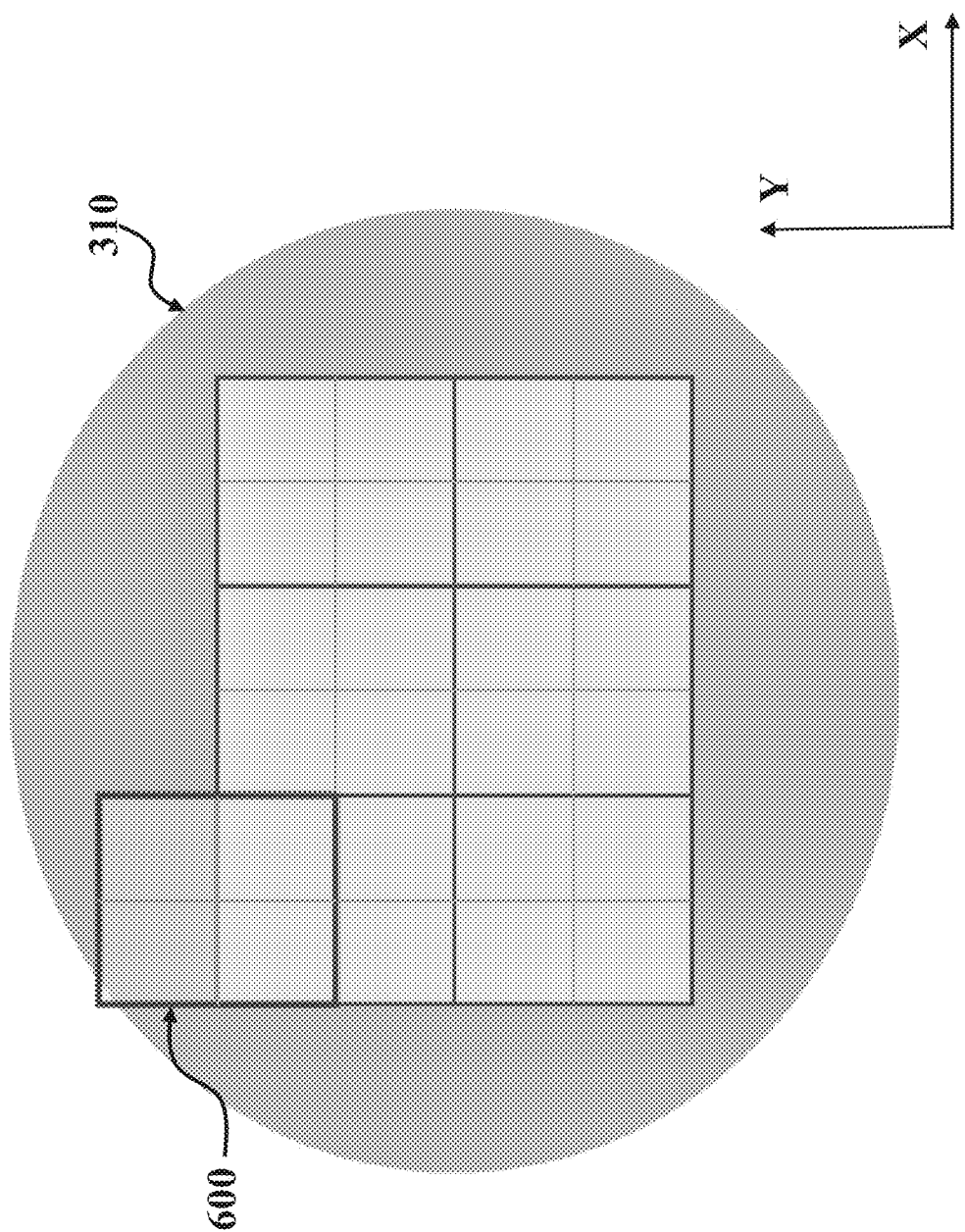

Referring to FIG. 9F, the mask 600 is then stepped $D_x$ along the X direction. Afterward, the mask 600 is scanned to form the IC pattern on two subfields (1, 4) and (2, 4).

Figure 9G:
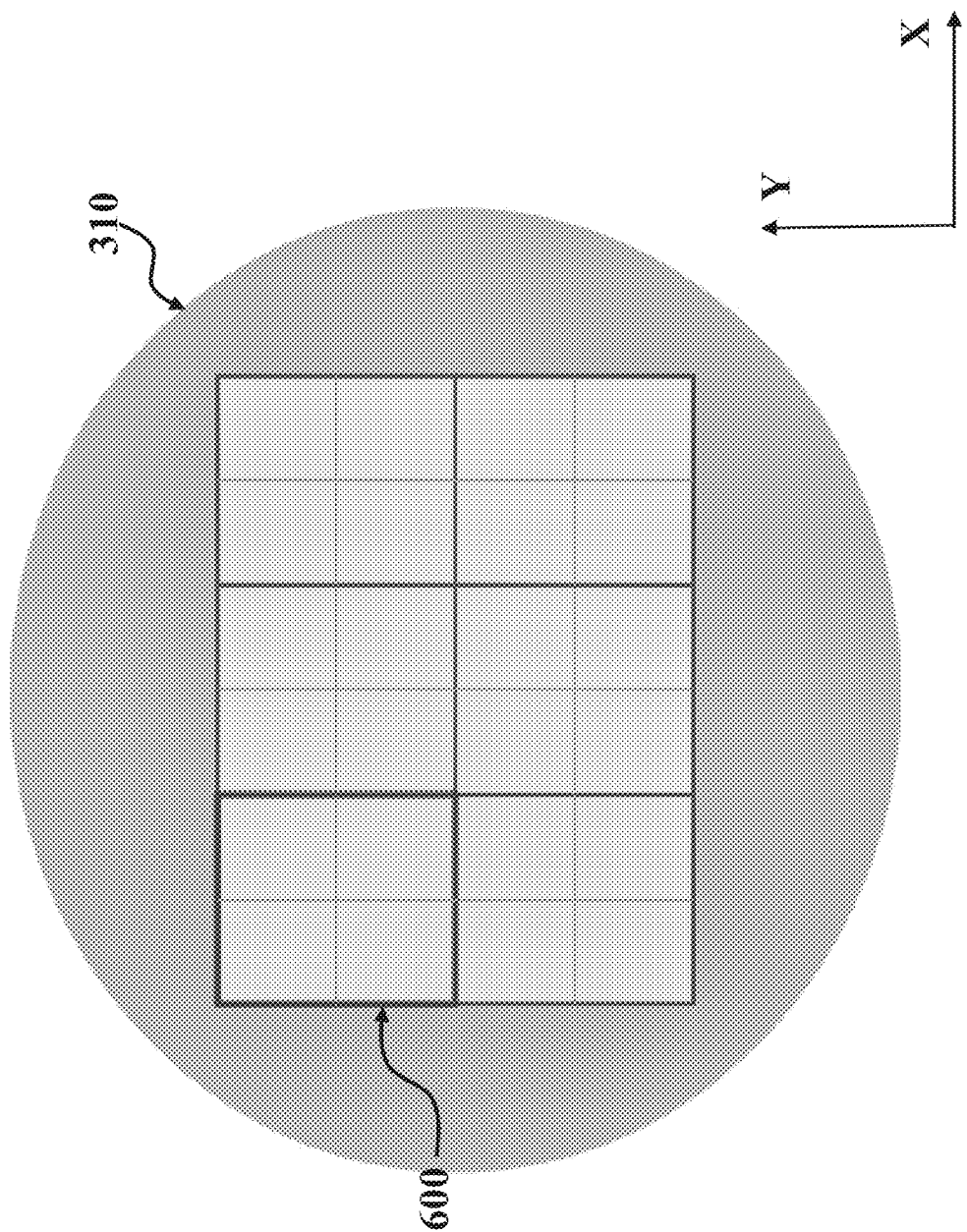

Referring to FIG. 9G, the mask 600 is then stepped $D_y$ along the -Y direction. Afterward, the mask 600 is scanned to form the IC pattern on a full field that includes four subfields (1, 4), (1, 3), (2, 3) and (2, 4).

Figure 9H:
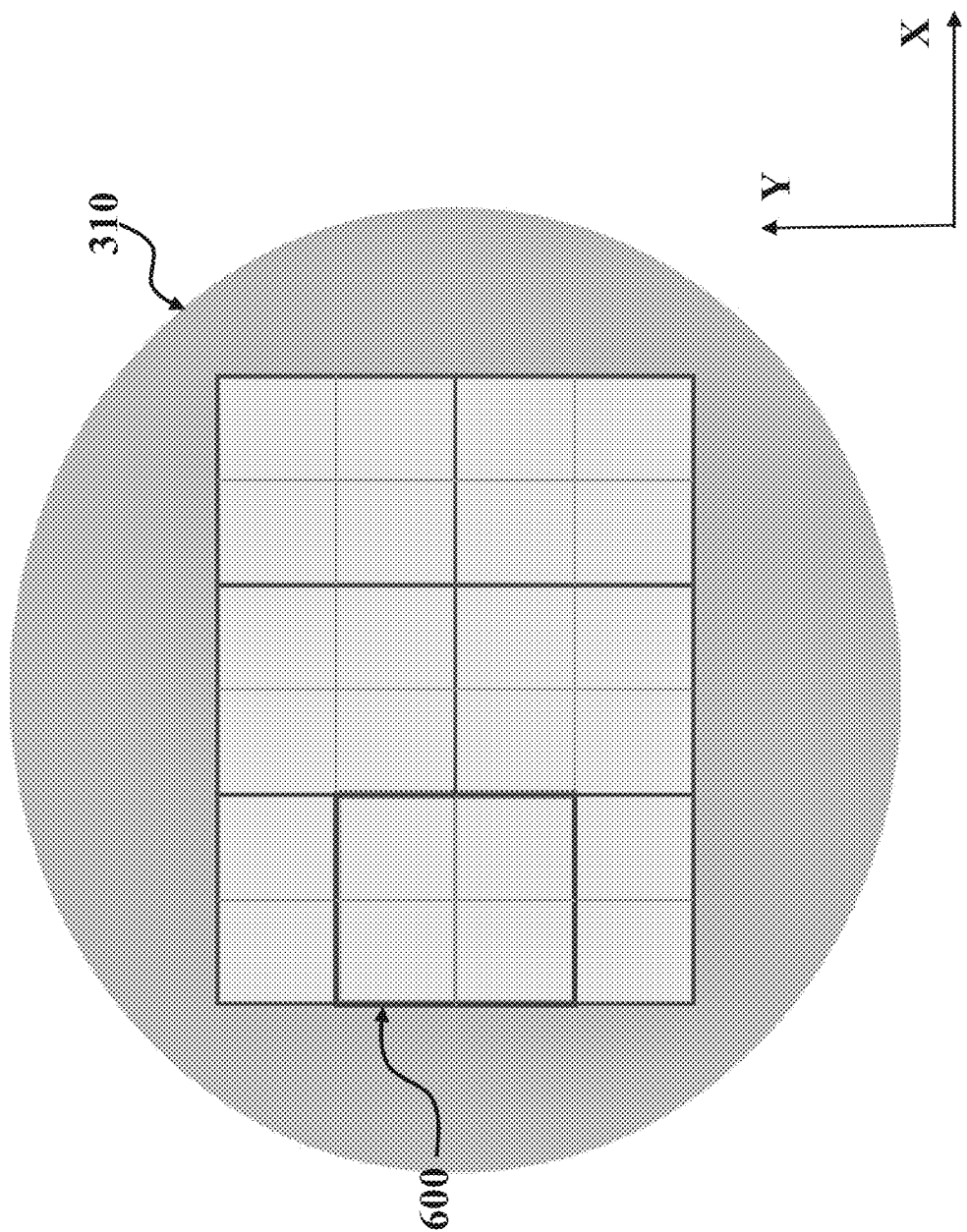

Referring to FIG. 9H, the mask 600 is then stepped $D_y$ along the -Y direction. Afterward, the mask 600 is scanned to form the IC pattern on four subfields (1, 2), (1, 3), (2, 2) and (2, 3).

Figure 9I:
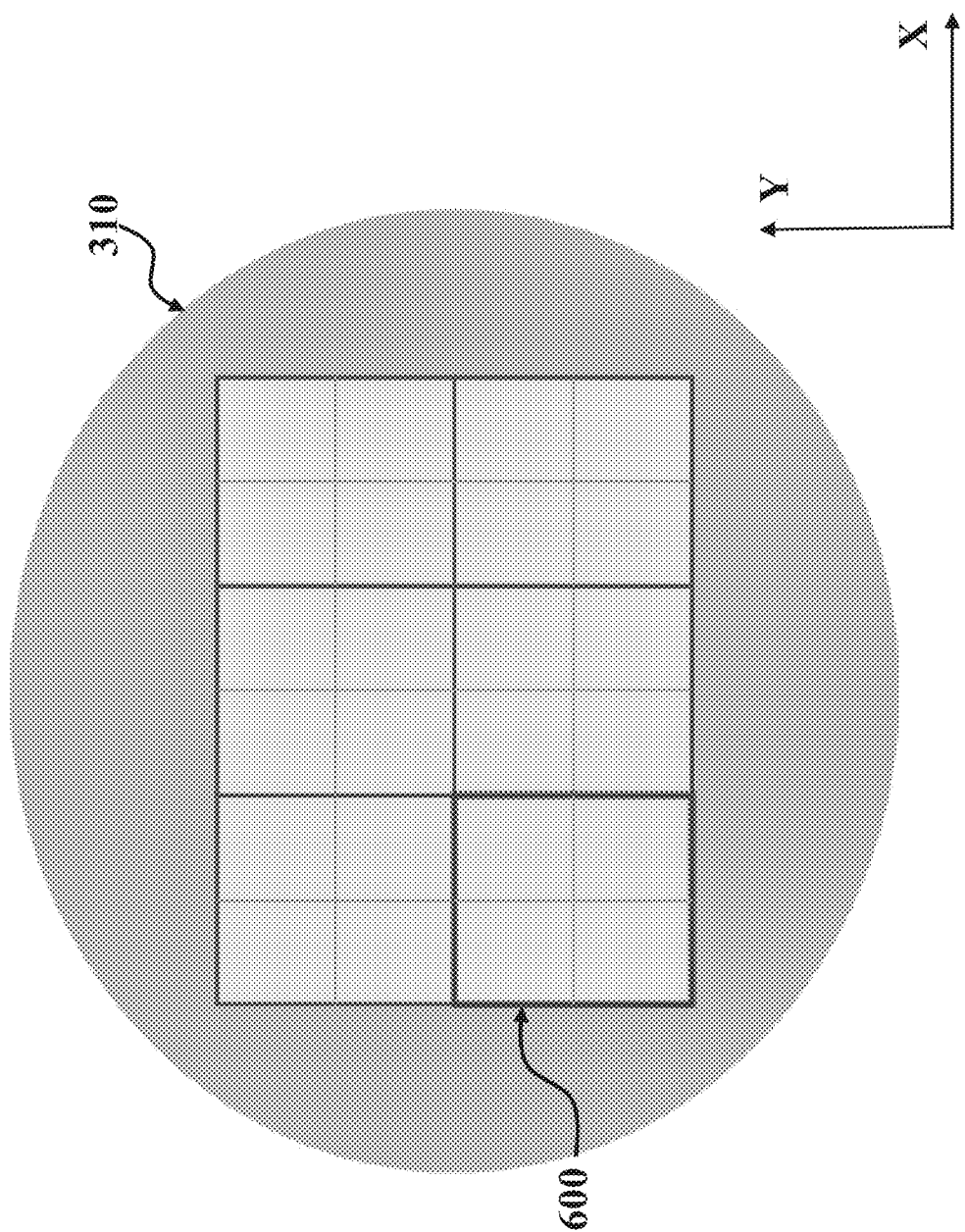

Referring to FIG. 9I the mask 600 is then stepped $D_y$ along the -Y direction. Afterward, the mask 600 is scanned to form the IC pattern on four subfields (1, 1), (1, 2), (2, 1) and (2, 2).

Figure 9J:
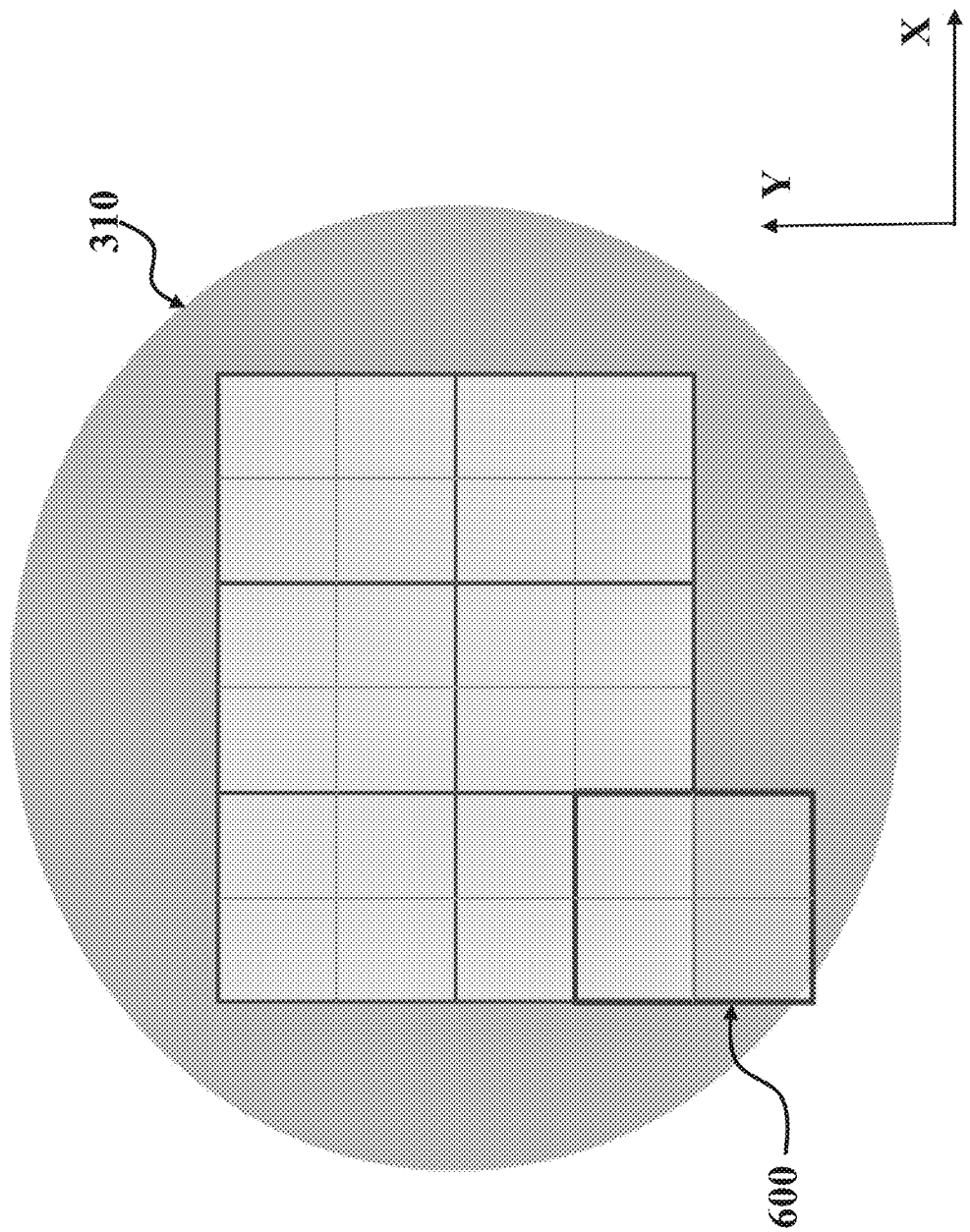

Referring to FIG. 9J the mask 600 is then stepped $D_y$ along the -Y direction. Afterward, the mask 600 is scanned to form the IC pattern only on two subfields (1, 1) and (2, 1).

Figure 9K:
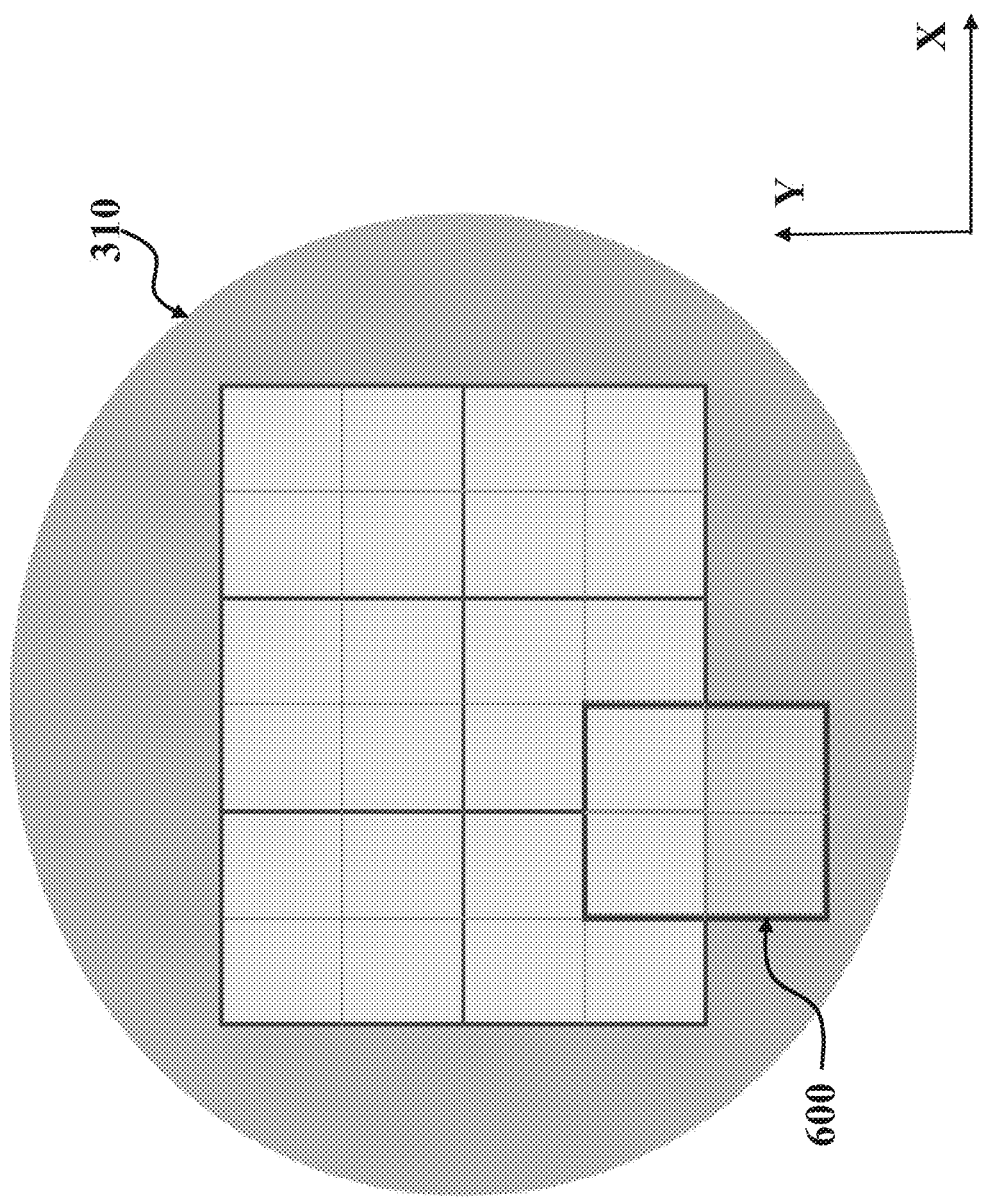

Referring to FIG. 9K the mask 600 is then stepped $D_x$ along the X direction. Afterward, the mask 600 is scanned to form the IC pattern only on two subfields (2, 1) and (3, 1).

Similarly, this step-and-scan procedure continues until the subfields in the substrate 310 are exhausted, as illustrated in FIG. 9K through FIG. 9P. Particularly, this step-and-scan procedure continues until each subfield on the substrate 310 is exposed $N_x*N_y$ times by the IC pattern from $N_x*N_y$ sub-regions of the mask 600, respectively. In the present example, each subfield is exposed 2*2 time by the same IC pattern in the four sub-regions, respectively. Thus, the first group of exposure processes is completed. Note the step distances $D_x$ and $D_y$ are different from those in the conventional exposure process. In the conventional exposure process, the step distances are corresponding to the dimensions of the whole field, which are $N_x*D_x$ and $N_y*D_y$ (or $2D_x$ and $2D_y$ in the present example). Since a subset of the above scans do not expose a full field size (some only expose one subfield and some only expose two subfields), thus it needs more step and scan for full coverage (each subfield being exposed $N_x*N_y$). In this case, the first group of exposure processes needs $(3*N_x+1)*(2*N_y+1)$ step-and-scan actions (cycles). This can be understood below. In the conventional single lithography process, the step-and-scan actions include 3*2 if the substrate 310 includes 3*2 fields. In the hybrid lithography exposure process, each subfield is exposed $N_x*N_y$ time. The total step-and-scan actions should be $(3*N_x)*(2*N_y)$. However, due to some steps-and-scan actions not cover a full field (or 4 subfields in the present example). Additional actions are needed. So the first group of exposure processes end up with $(3*N_x+1)*(2*N_y+1)$ step-and-scan actions. This should be taken into consideration for the wafer making cost in the manufacturing cost function.

Referring back to FIG. 8, the hybrid lithography exposure process continues to other groups of exposure processes (similar to the first group described above), such as a second group of exposure processes to the resist layer over a substrate using the first mask at block 760; . . . ; and a $M^{th}$ group of exposure processes to the resist layer over a substrate using the $M^{th}$ mask at block 770.

In the above description in FIGS. 9A through 9P, the first group of exposure processes are collectively described. However, the sequences of step-and-scan actions may be designed differently as long as each subfield is exposed $N_x*N_y$ times by the IC pattern from $N_x*N_y$ sub-regions of the mask 600, respectively. The $N_x*N_y$ exposure processes in the group may be implemented in a different sequence. The first group of exposure processes includes $N_x*N_y$ (that is 2*2 in the present example) exposure processes. Each exposure process in the first group includes stepping and scanning actions but there are three differences. First, the starting step locations are different from each other so that there are shifts among various exposure processes. Second, the step distances are dimensions of the whole field (, which are $N_x*D_x$ along the X direction and $N_y*D_y$ along the Y direction) so that there is overlapping coverage between adjacent scanning actions in the same exposure process. Third, each exposure process may need different numbers of step-and-scan cycles.

Figure 9L:
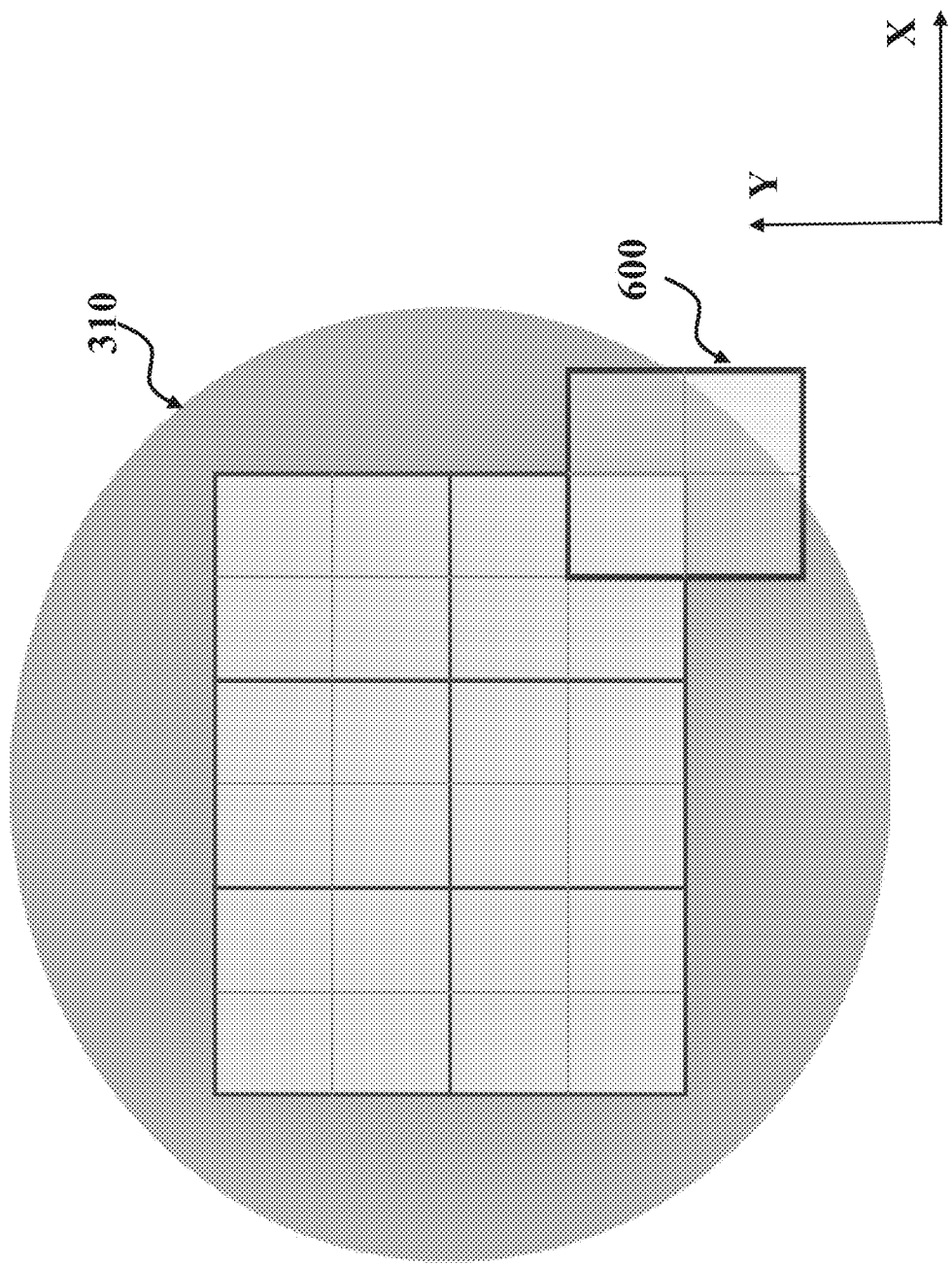
Figure 9N:
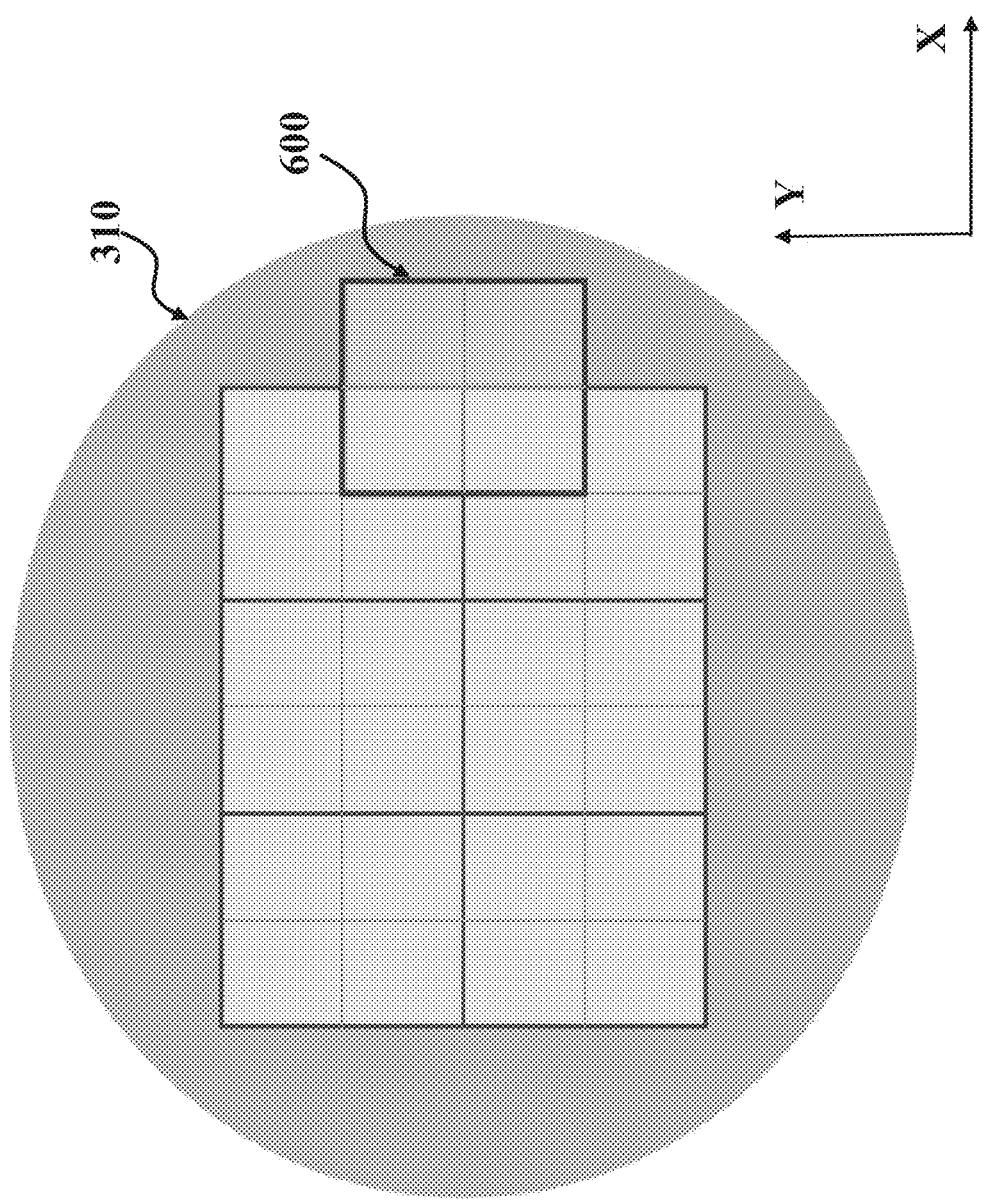
Figure 9O:
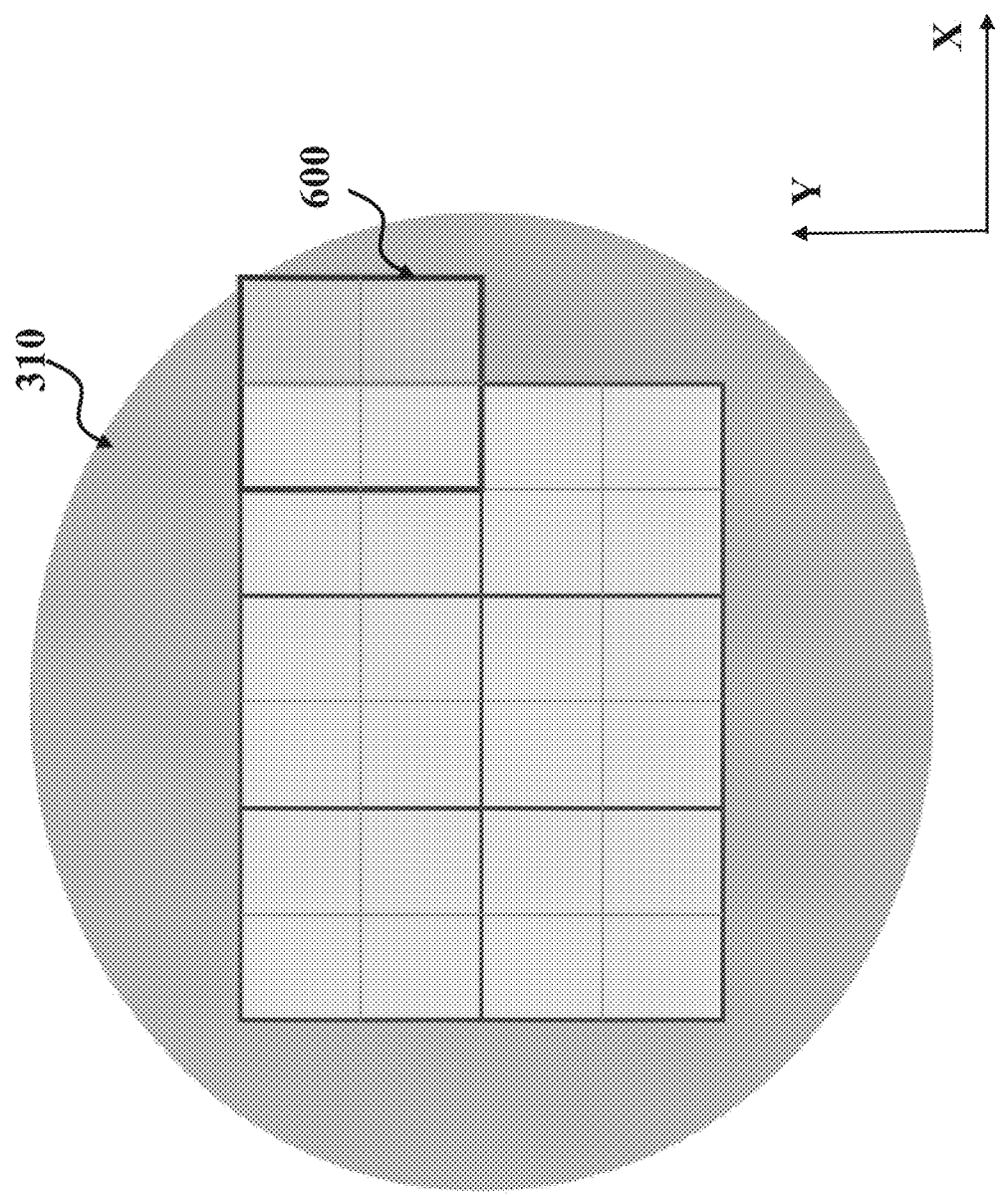

This is further explained using the mask 600 as an example. The mask 600 includes four sub-regions. Accordingly, there are 4 exposure processes in each group associated with one mask. The first exposure process in the first group includes a first stepping with a starting location as illustrated in FIG. 9A. In this case, the first scan only exposes one subfield (1, 1). Then, it step $N_y*D_y$ along the Y direction, as illustrated in FIG. 9C. The second scan only exposes two subfields (1, 2) and (1, 3). Then, it step $N_y*D_y$ along the Y direction, as illustrated in FIG. 9E. The third scan only exposes one subfield (1, 4) Then, it step $N_x*D_x$ along the X direction. The following scan only exposes two subfields (2, 4) and (3, 4). It continues until the last step reaches to the subfield (6, 1) and then scans this subfield as illustrated in FIG. 9L. The first exposure process totally needs 12 step-and-scan cycles.

The second exposure process in the first group includes a first stepping with a starting location as illustrated in FIG. 9B. In this case, the first scan only exposes two subfields (1, 1) and (1, 2). Then, it step $N_y*D_y$ along the Y direction, as illustrated in FIG. 9D. The second scan only exposes two subfields (1, 3) and (1, 4). Then, it step $N_x*D_x$ along the X direction to cover four subfields (2, 3), (3, 3), (2, 4) and (3, 4). The following scan exposes a whole field including above four subfields. It continues until the last step reaches to the subfields (6, 1) and (6, 2) as illustrated in FIG. 9M. The following scan exposes these two subfields. The second exposure process totally needs 8 step-and-scan cycles.

The third exposure process in the first group includes a first stepping with a starting location as illustrated in FIG. 9J. In this case, the first scan exposes two subfields (1, 1) and (2, 1). Then, it step $N_y*D_y$ along the Y direction, as illustrated in FIG. 9H. The second scan a whole field including four subfields (1, 2), (2, 2), (1, 3) and (2, 3). Then, it step $N_y*D_y$ along the Y direction to cover two subfields (1, 4) and (2, 4) as illustrated in FIG. 9F. The following scan exposes those two subfields. It continues until the last step reaches to the subfields (5, 4) and (6, 4). The following scan exposes these two subfields. The third exposure process totally needs 9 step-and-scan cycles.

The fourth exposure process in the first group includes a first stepping with a starting location as illustrated in FIG. 9I. In this case, the first scan exposes a whole field including four subfields (1, 1), (2, 1), (1, 2) and (2, 2). Then, it step $N_y*D_y$ along the Y direction, as illustrated in FIG. 9G. The second scan only exposes a whole field including four subfields (1, 3), (2, 3), (1, 4) and (2, 4). Then, it step $N_x*D_x$ along the X direction to cover four subfields (3, 3), (4, 3), (3, 4) and (4, 4). The following scan exposes a whole field including above four subfields. It continues until the last step reaches to the subfields (5, 3), (6, 3), (5, 4) and (6, 4). The following scan exposes these four subfields. The fourth exposure process totally only need 6 step-and-scan cycles. The total step-and-scan cycles from the fourth exposure processes in the first group are 35, which equals to $(2*N_x+1)*(2*N_y+1)$, as provided previously. The above description is based on the mask 600 (of FIG. 6A) having 2*2 subfields. Other hybrid lithography exposure processes use other masks, such as the mask 600 of FIG. 6B.

Figure 10:
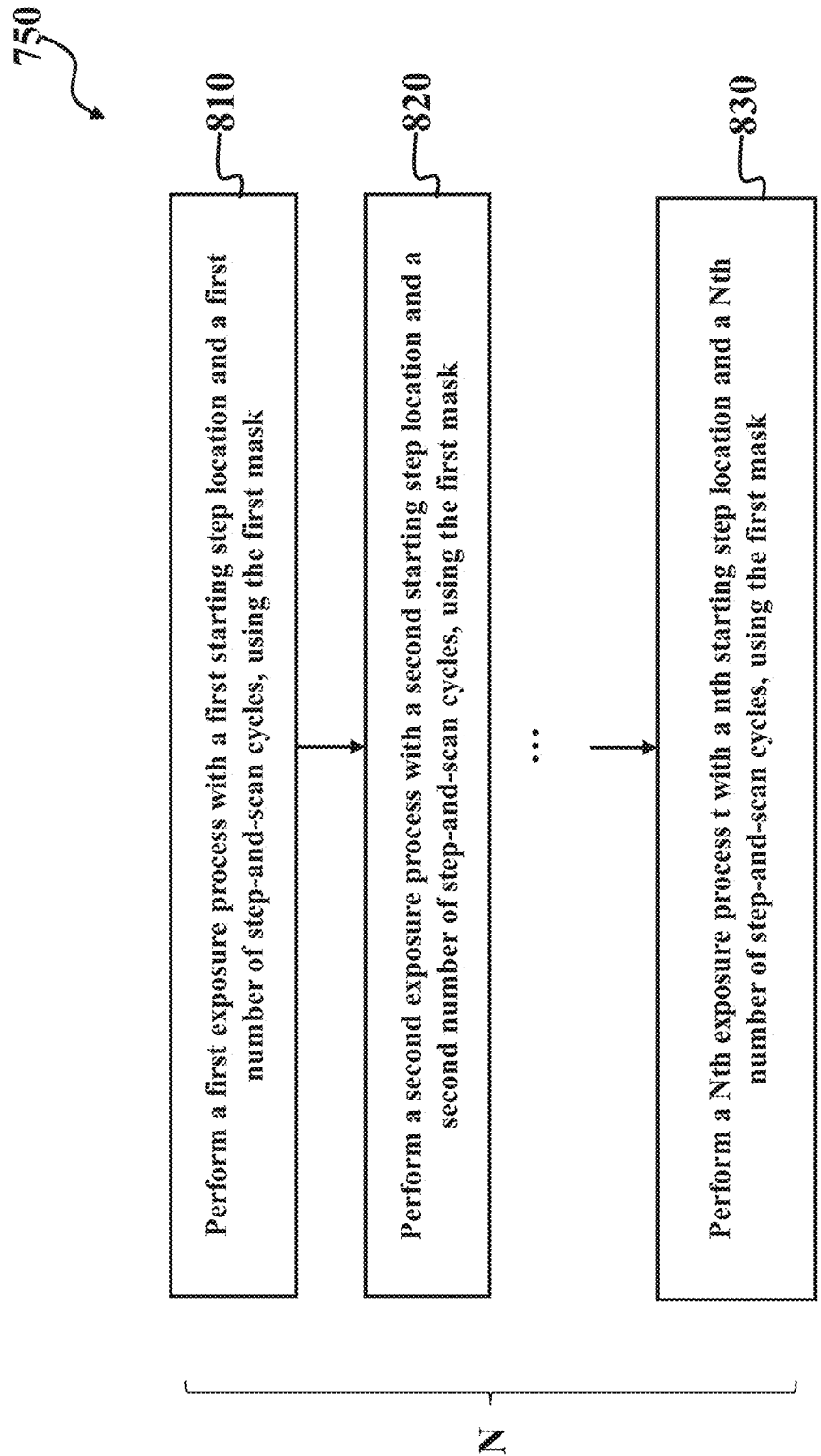
FIG. 10 is a flowchart of the first group of exposure processes in FIG. 8 for forming a patterned resist layer by hybrid lithography exposure process according to various aspects of the present disclosure.

The hybrid lithography process described above is further summarized in FIG. 10 as a flowchart for the first group of exposure processes 750 using the first mask. Other groups are similar. The first group of exposure processes 750 includes a first exposure process 810, a second exposure process 820, . . . , and a $N^{th}$ exposure process 830. The number of the exposure processes in the first group equals to N, which further equals to $N_x*N_y$ (2*2 in the present example). The first exposure process 810 is applied to the resist layer with a first starting step location and a first number of step-and-scan cycles; the second exposure process 820 is applied to the resist layer with a second starting step location and a second number of step-and-scan cycles; . . . ; and the $N^{th}$ exposure process 830 is applied to the resist layer with a $N^{th}$ starting step location and a $N^{th}$ number of step-and-scan cycles. The starting step locations for N exposure processes are different from each other so that each subfield is exposed N times by the IC pattern from N sub-regions of the first mask, respectively. Each exposure process may include different number of step-and-scan cycles due to different starting step locations. Each exposure process exposes a same subfield with the IC pattern on a different sub-region of the first mask.

Figures 1, 11:
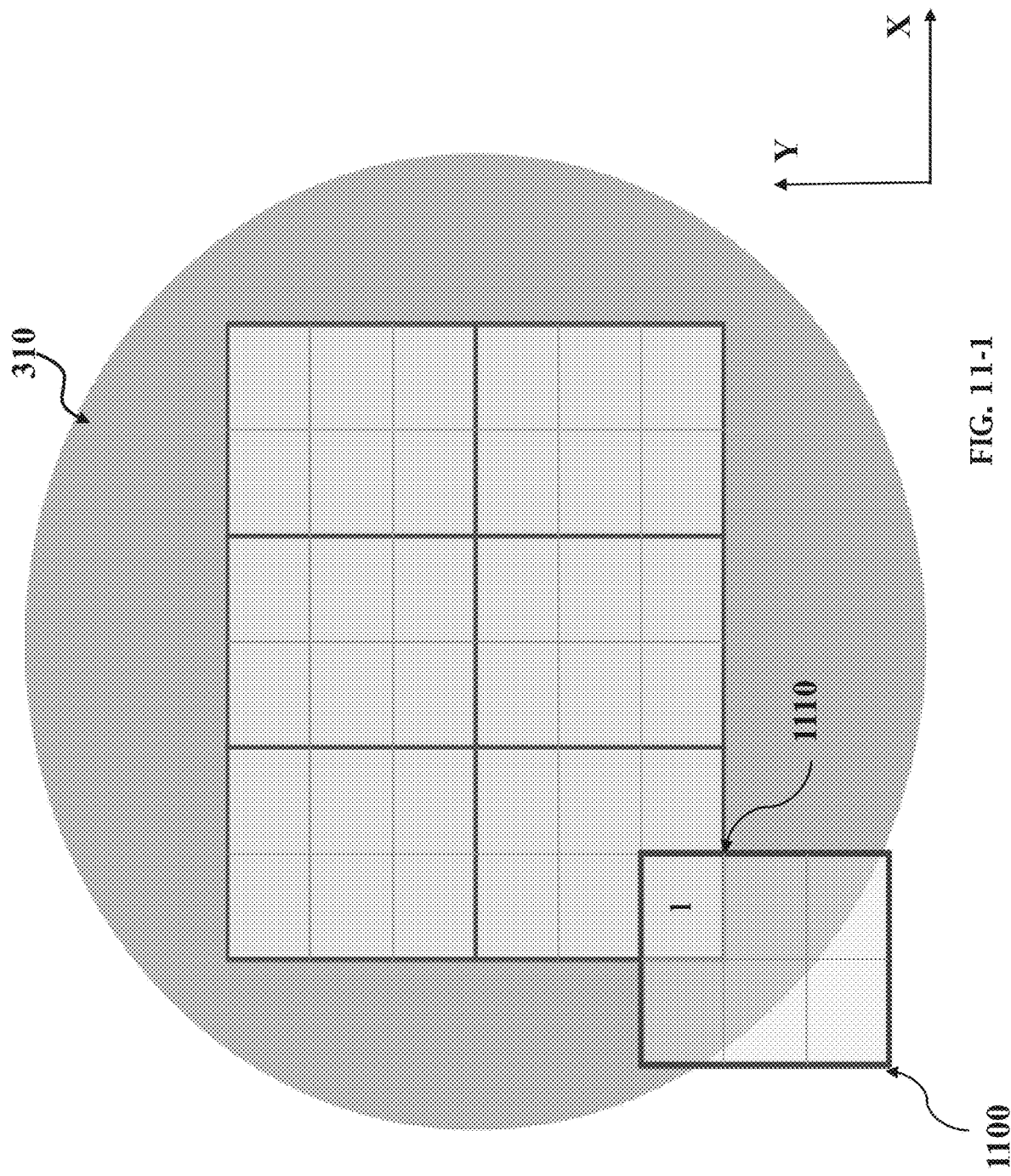
Figures 2, 11:
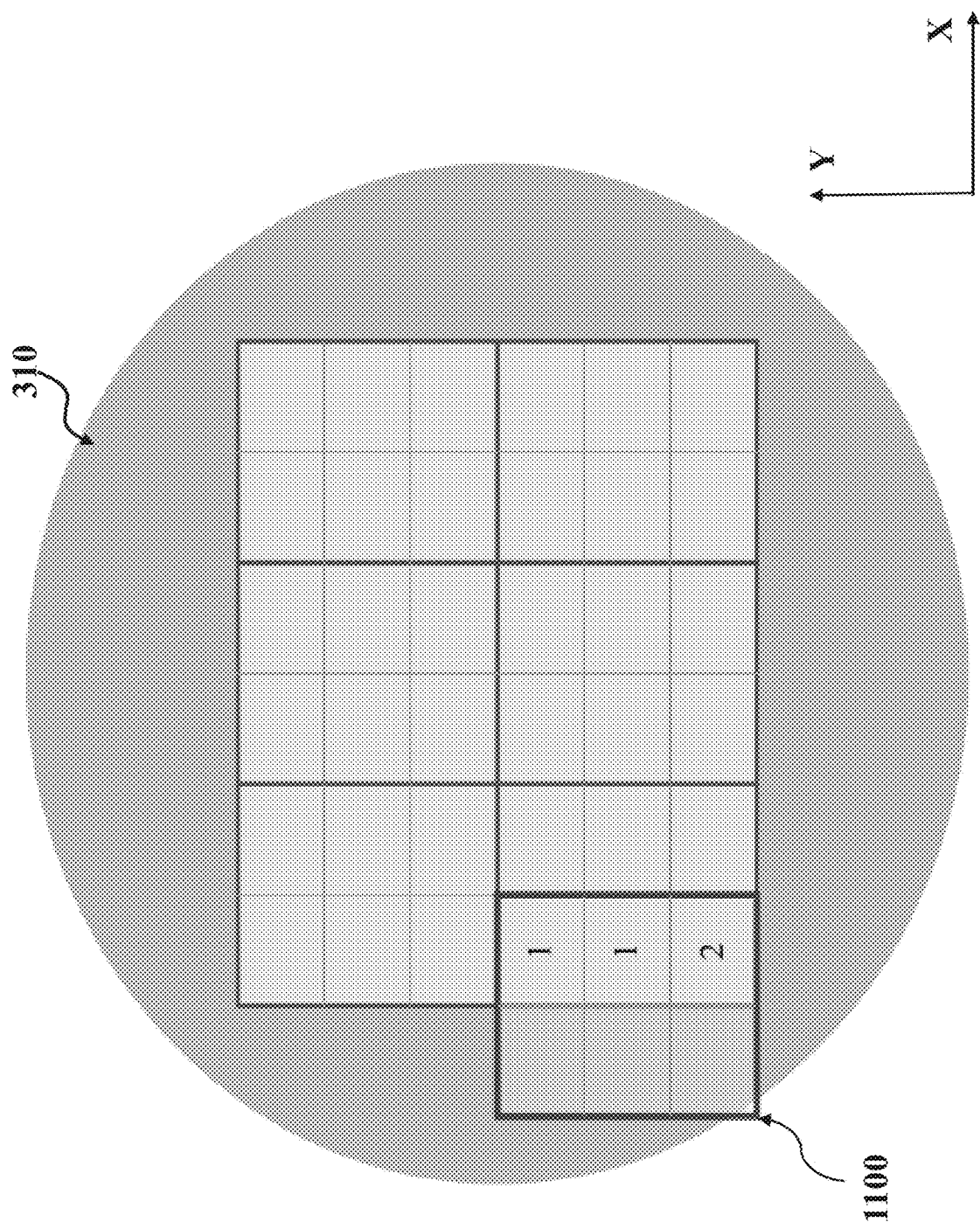

In the above example, the stepping distance is a constant when the mask steps to a next location on the same direction. However, not only the step and scan sequence can be different, the stepping distance may be different or in a varying step distance in other words. FIGS. 11-1 through 11-35 provide another example to further describe the hybrid exposure process with varying step distance. FIGS. 11-1 through 11-35 illustrate a complete step and scan sequence for one mask. This procedure may be repeated to M masks, as described in FIG. 8. As shown in FIG. 11A, the mask 1100 includes 2*3 sub-regions. A sub-regions on the mask is labeled as sub-region (i, j), which represents a sub-region of an $i^{th}$ along X direction and $j^{th}$ along Y direction, starting from the left-bottom sub-region as (1, 1). The wafer 310 includes nine fields and each field includes 2*3 subfields. Accordingly, $N_x$ and $N_y$ are 2 and 3, respectively, in this example. Similarly, a subfield on the mask is labeled as subfield (i, j), which represents a subfield of an $i^{th}$ along X direction and $j^{th}$ along Y direction, starting from the left-bottom sub-region as (1, 1).

Starts at FIG. 11-1, the mask 1100 is stepped to a position such that the first subfield (1, 1) is covered by one sub-region (which is sub-region (2, 3) in the present example) of the mask 310. Assume that the subfield dimensions along X and Y directions are $D_x$ and $D_y$, respectively. In this case, the mask 1100 is stepped, from the vertex 1110 of the first subfield (1, 1), a first distance 0 in the X direction and a second distance $D_y$ in the Y direction, or noted as stepping (0, $D_y$). Note FIG. 11-1 is shown in a way for better understanding. Again as noted above, the sub-region has different dimensions from the dimension of the subfield. However, the image of the IC pattern in the sub-region is aligned and mapped to the subfield with same dimensions. It is further noted that the stepping is a relative motion between the mask and the wafer 310. Usually, it is the wafer that moves relative to the mask. For simply description and better understanding, it is described as the mask moves by stepping relative to the wafer. Then mask 1100 is scanned to form the IC pattern on the first subfield (1, 1) with an exposure dose less than the optimized exposure dose $E_{op}$. Due to the location of the mask, only the first subfield is exposed by one sub-region of the mask 1100. Here the first subfield (1, 1) is labeled by "1", meaning that the first subfield (1, 1) has been exposed one time.

Referring to FIG. 11-2, the mask 1100 is then stepped 2*$D_y$ along the Y direction to cover another subfield. Then the mask 1100 is scanned to form the IC pattern on the three subfields (1, 1), (1, 2) and (1, 3). In other words, only those two subfields (1, 1), (1, 2) and (1, 3) are exposed. The numbers in those subfields represent the number of exposure processes has been completed to the corresponding subfield so far. Note the stepping distance is 2*$D_y$, which is different from the stepping distance of FIG. 11-1. Similarly, the numbers in subfields represent the number of exposure processes have been completed to that subfield. In the present example, the numbers of exposure processes to subfields (1, 1), (1, 2) and (1, 3) are 2, 1, and 1, respectively.

Figures 3, 11:
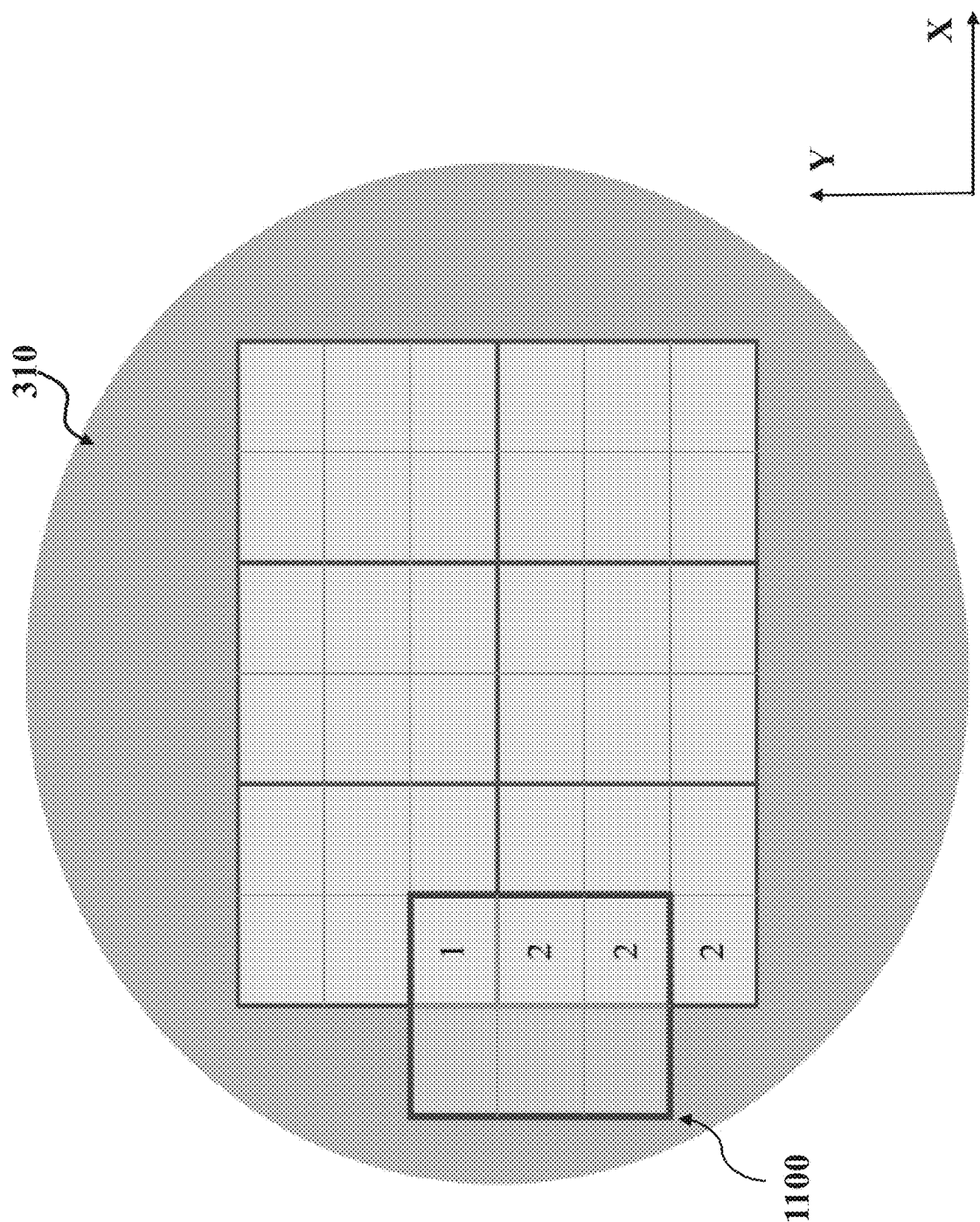

Referring to FIG. 11-3, the mask 1100 is then stepped another $D_y$ along the Y direction to cover another subfield. Afterward, the mask 1100 is scanned to form the IC pattern on two subfields (1, 2), (1, 3) and (1, 4), respectively.

Figures 4, 11:
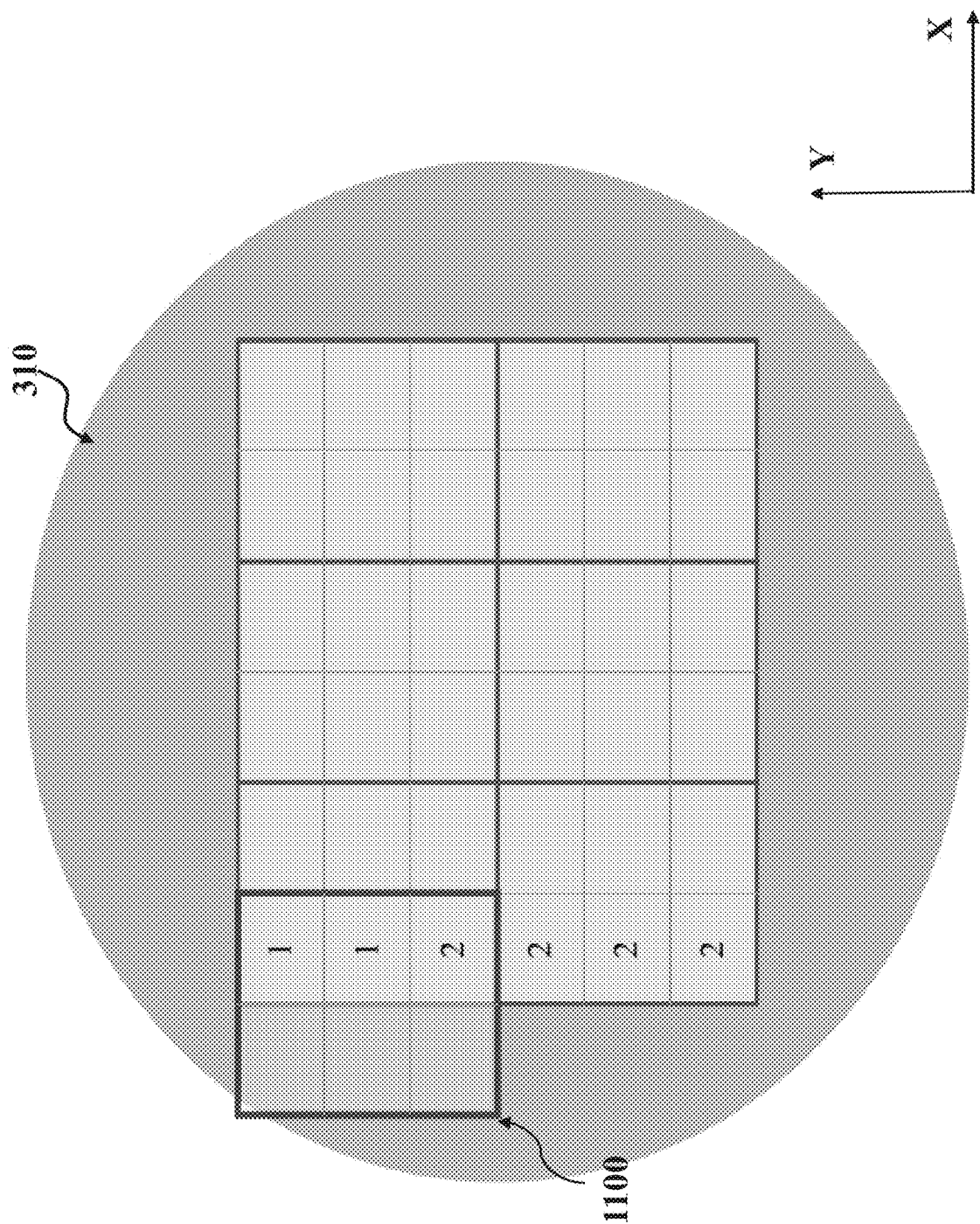
Figures 5, 11:
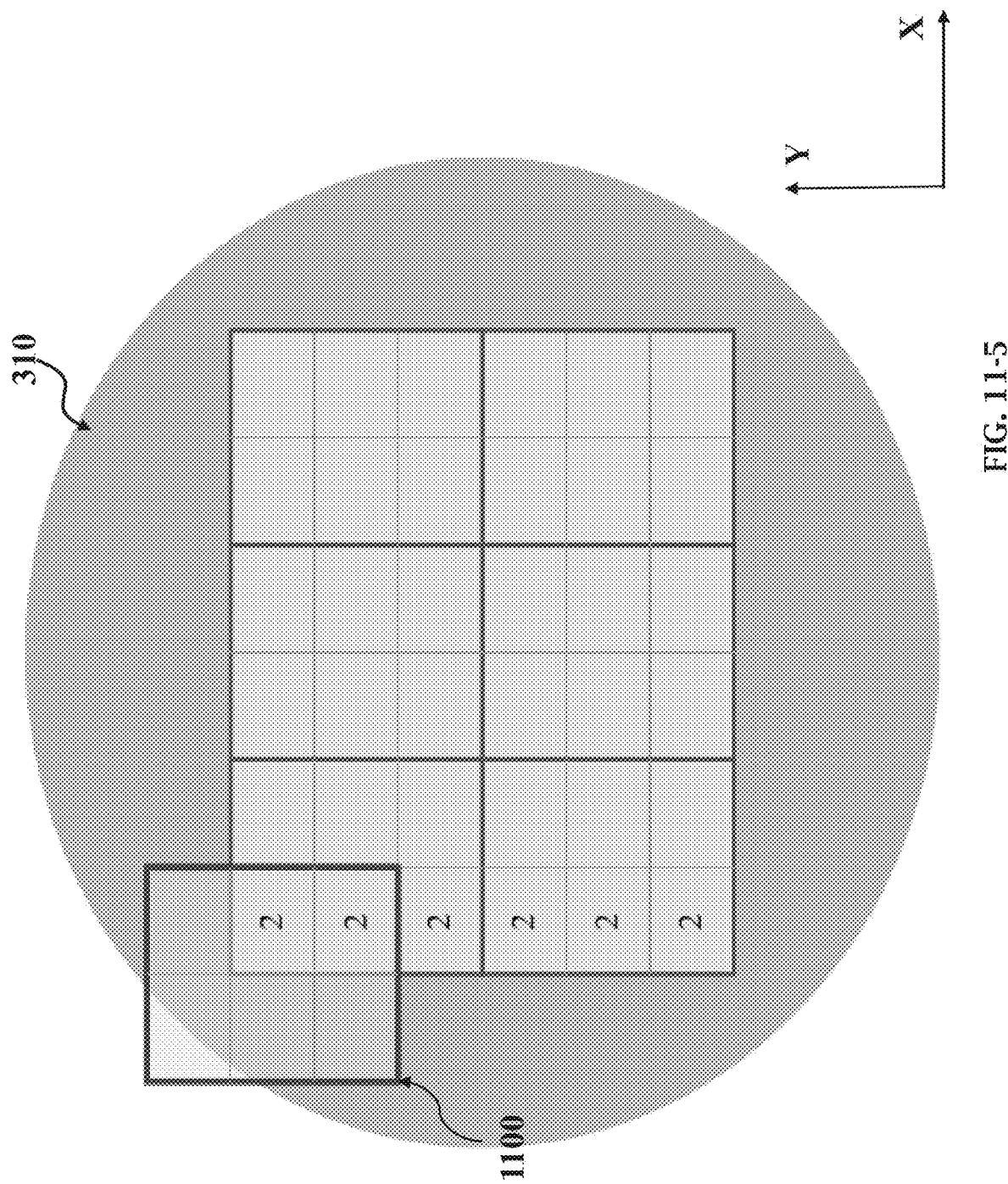
Figures 6, 11:
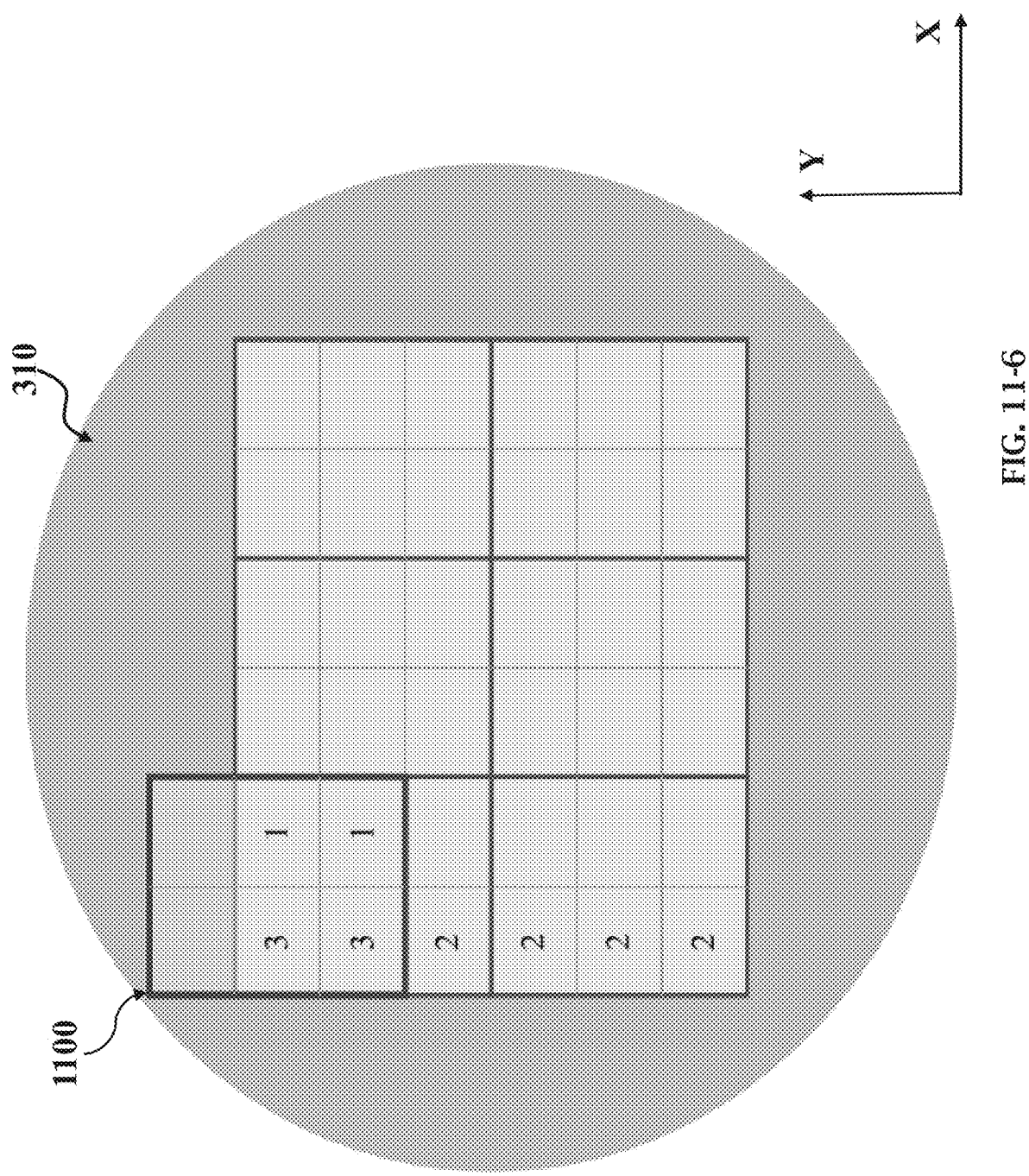
Figures 7, 11:
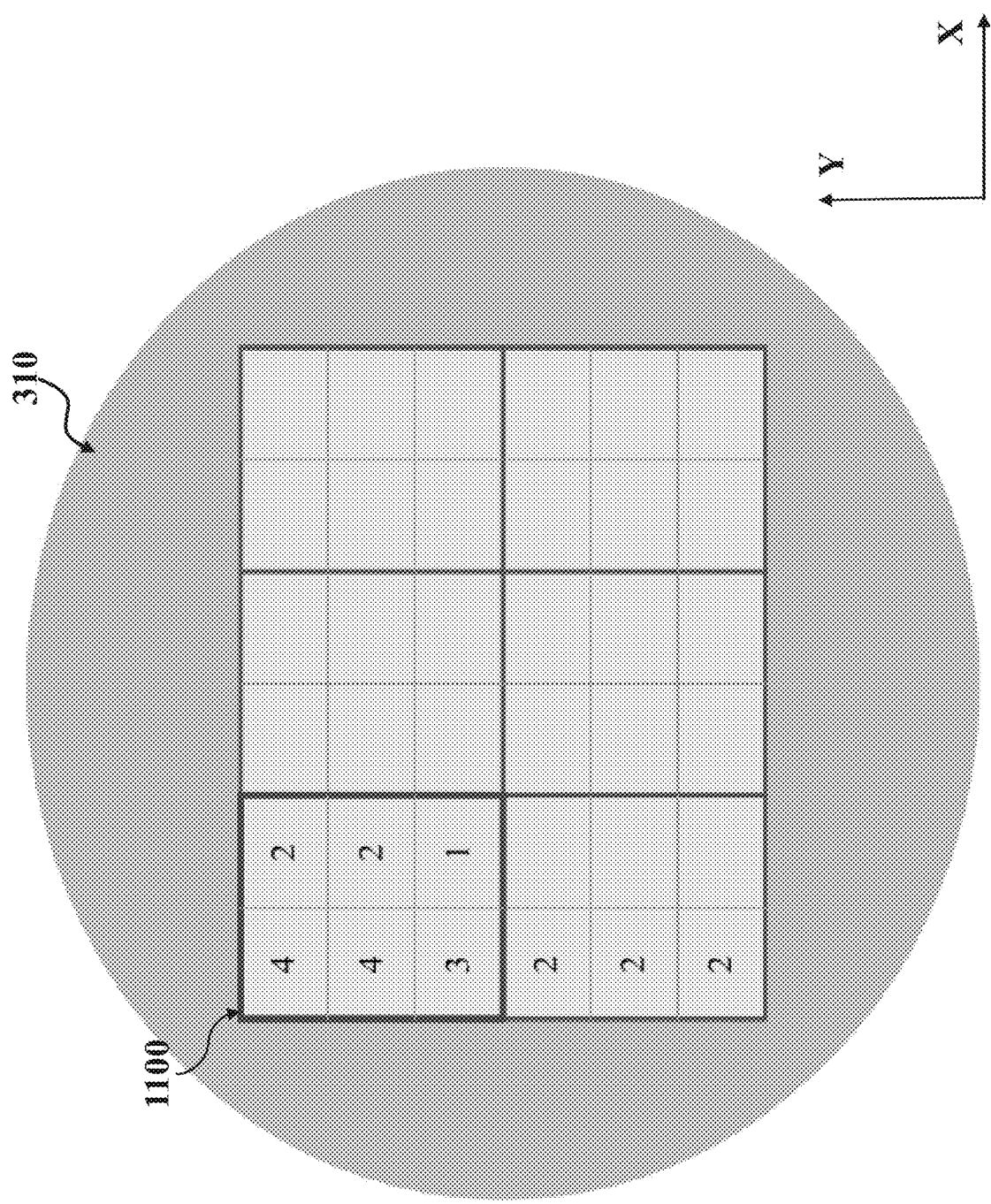
Figures 8, 11:
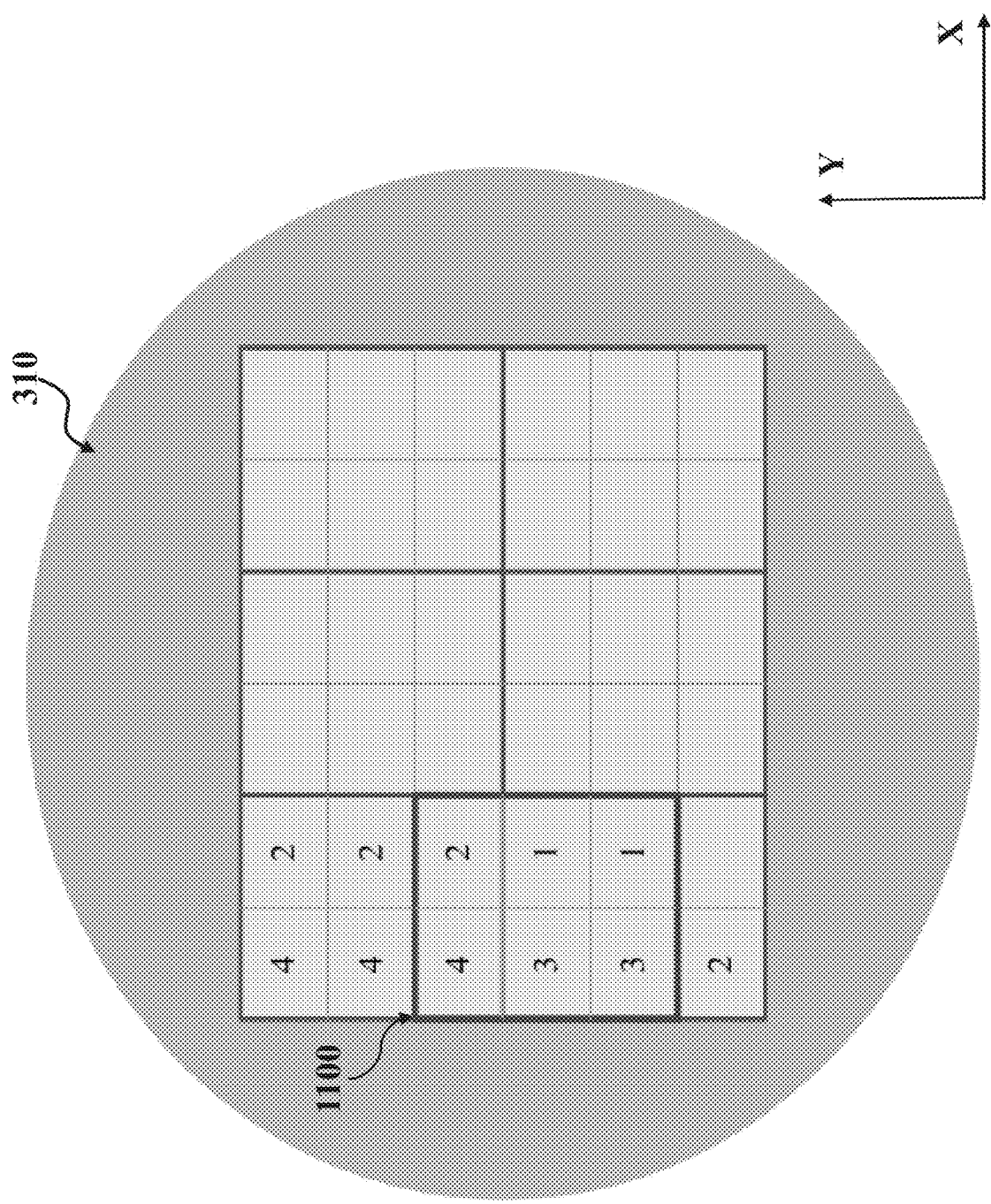
Figures 9, 11:
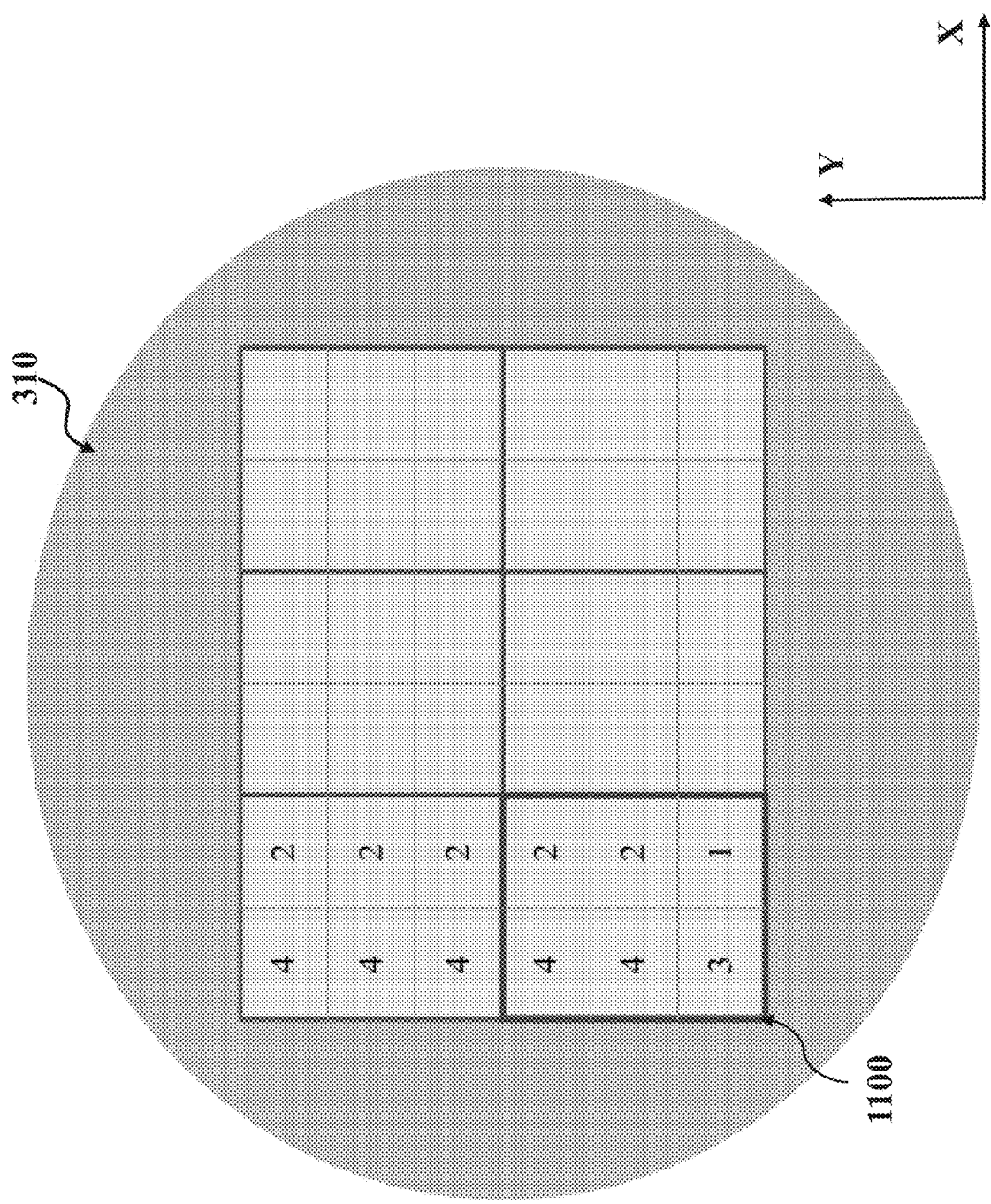
Figures 10, 11:
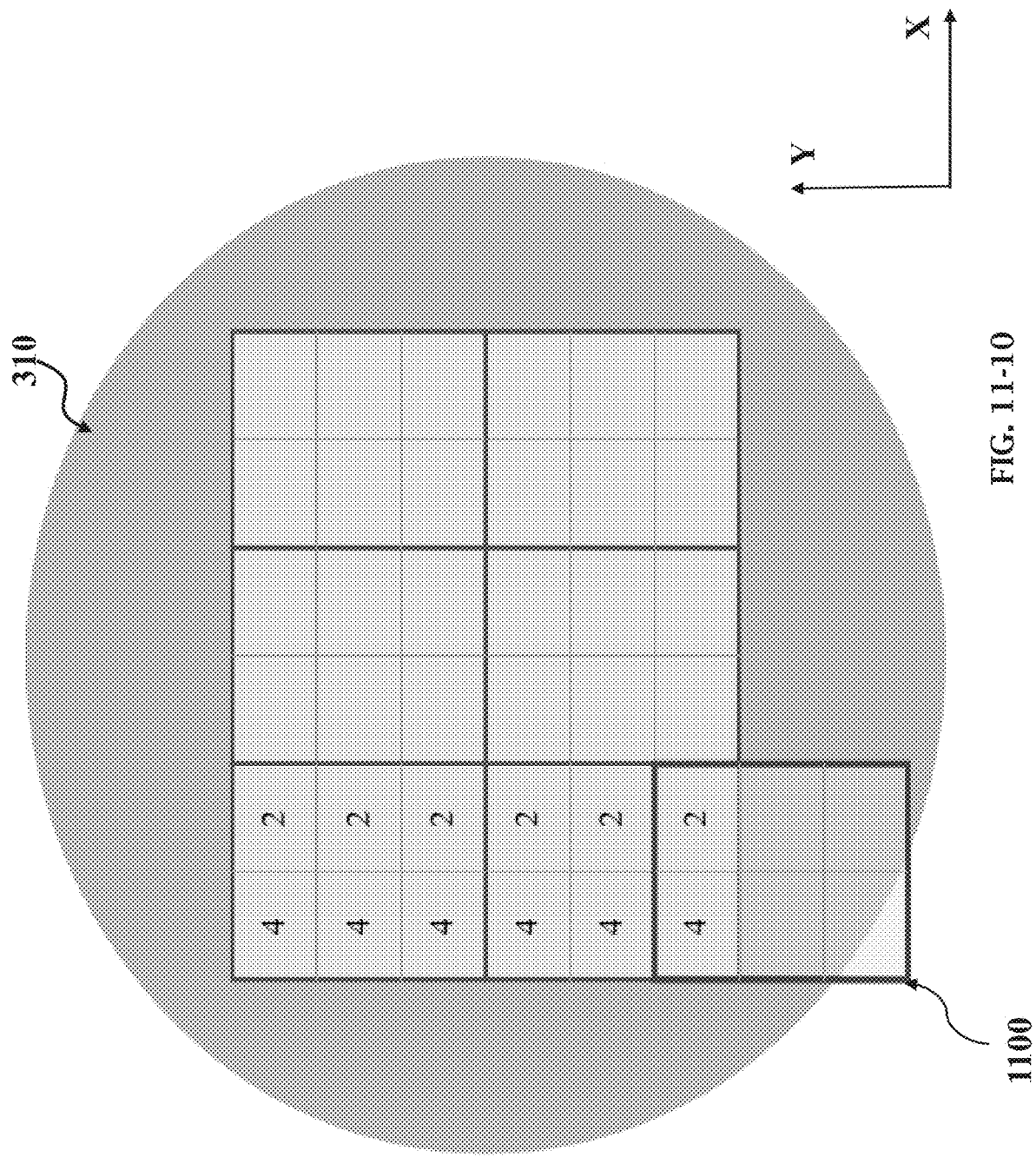
Figure 11:
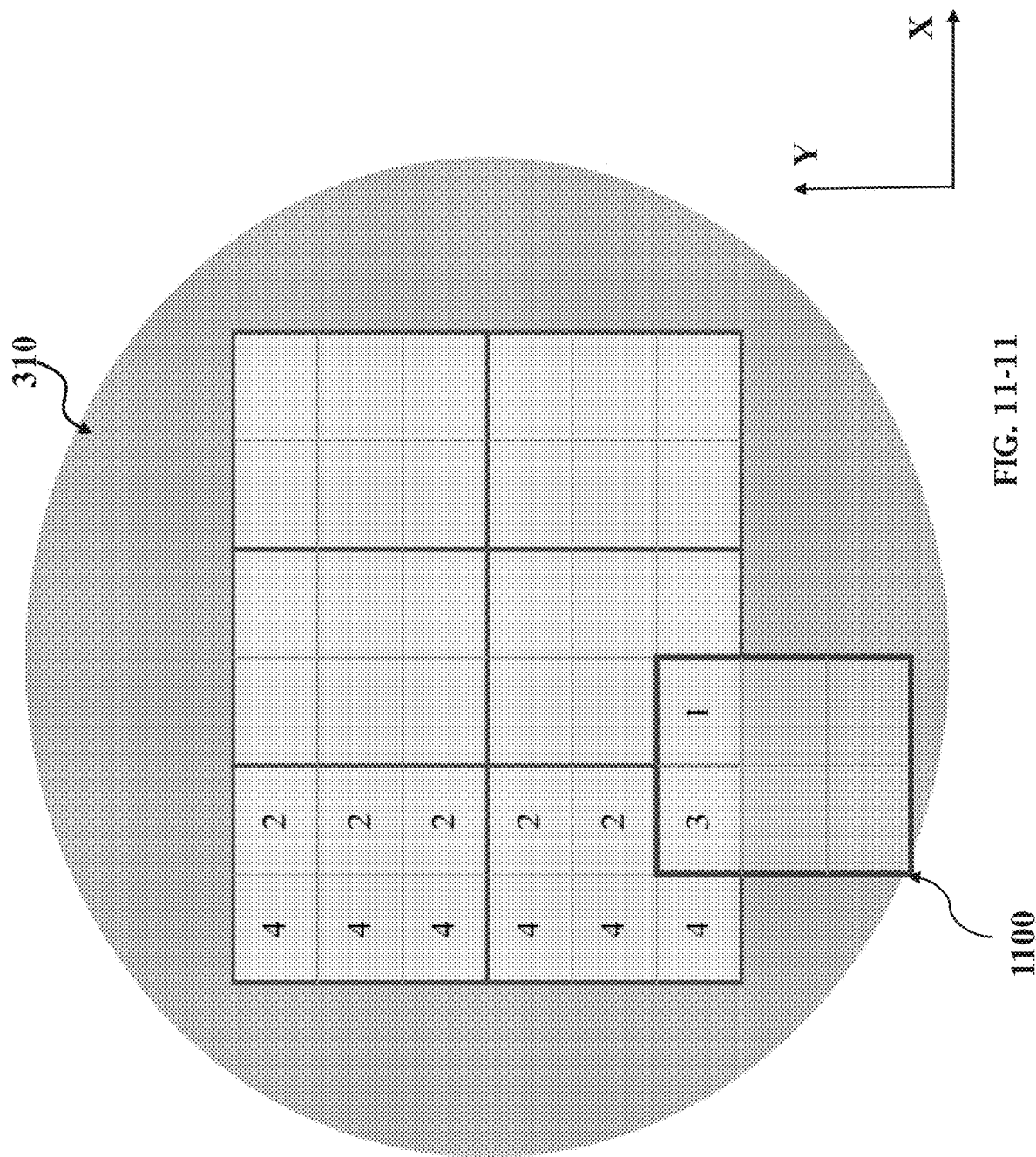
Figures 11, 12:
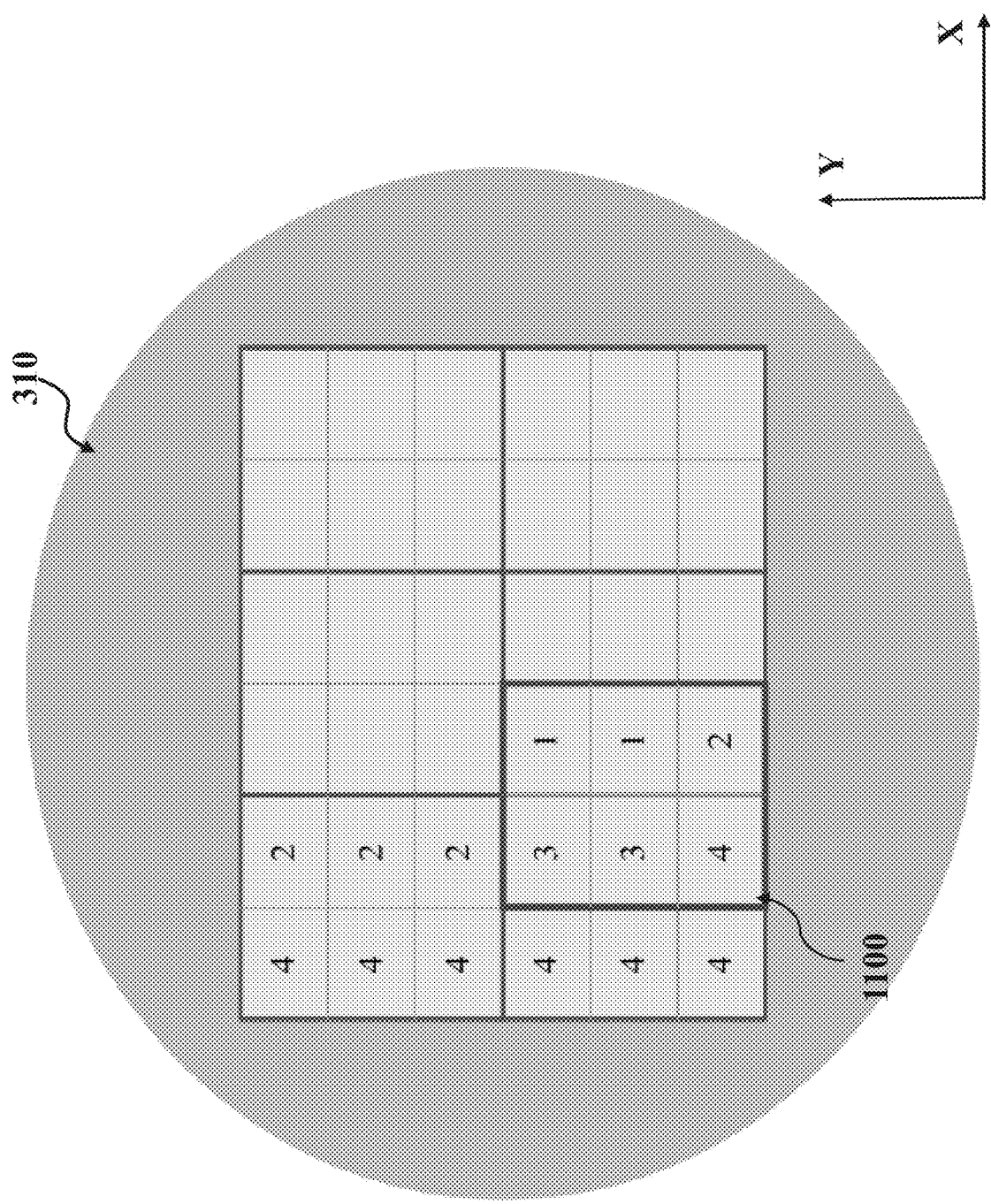
Figures 11, 12, 13, 14:
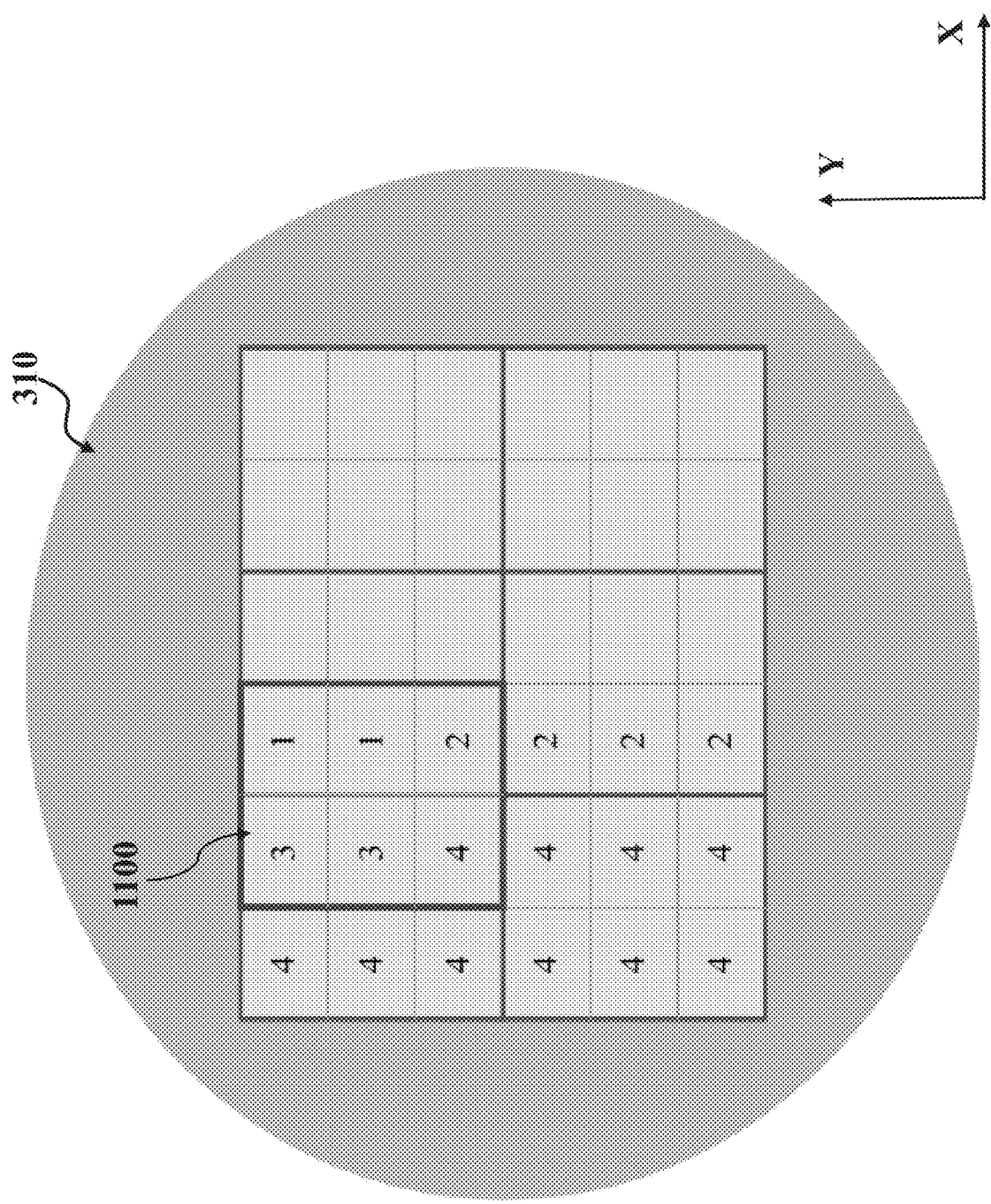
Figures 11, 12, 13, 14, 15:
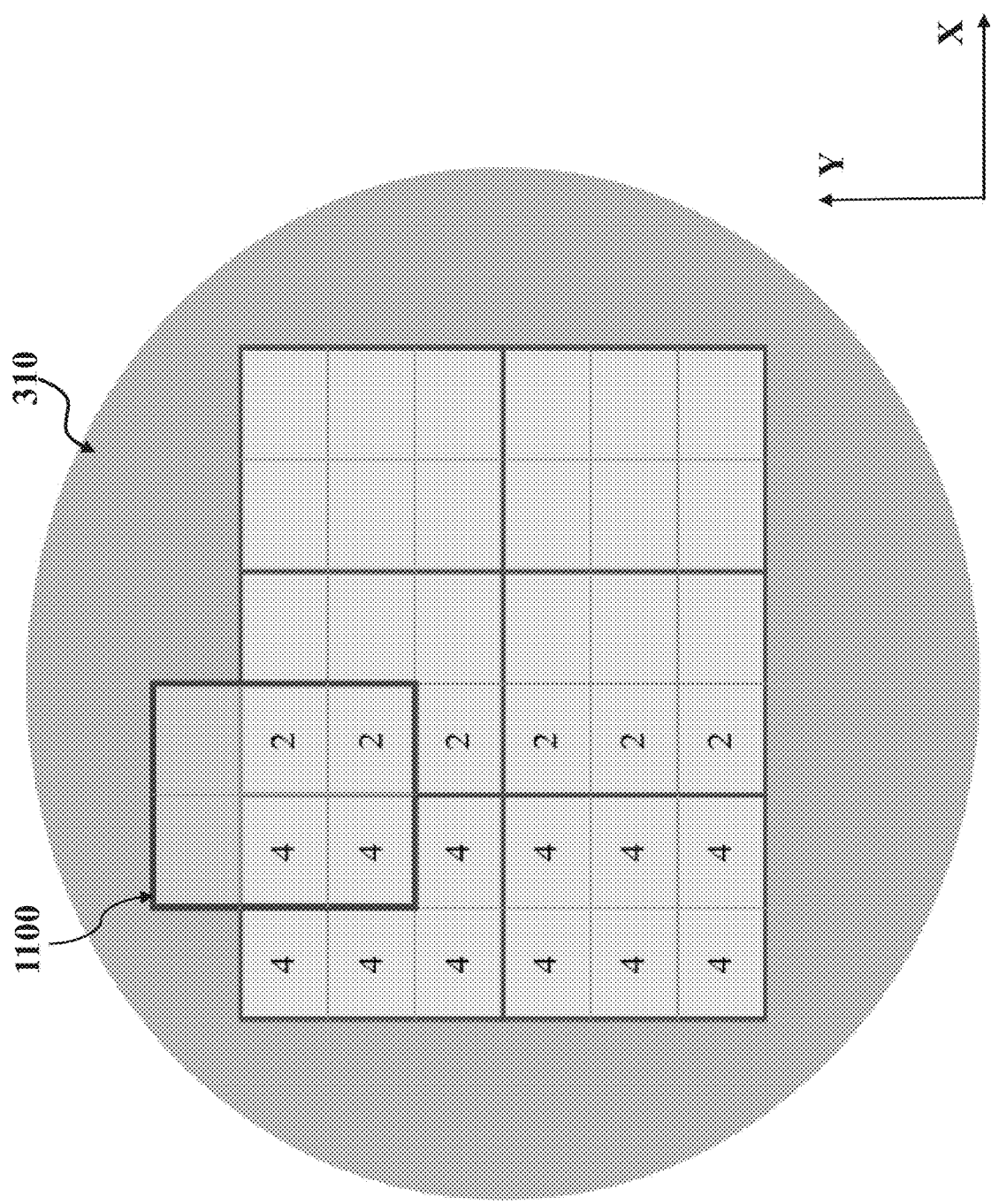
Figures 11, 12, 13, 14, 15, 16:
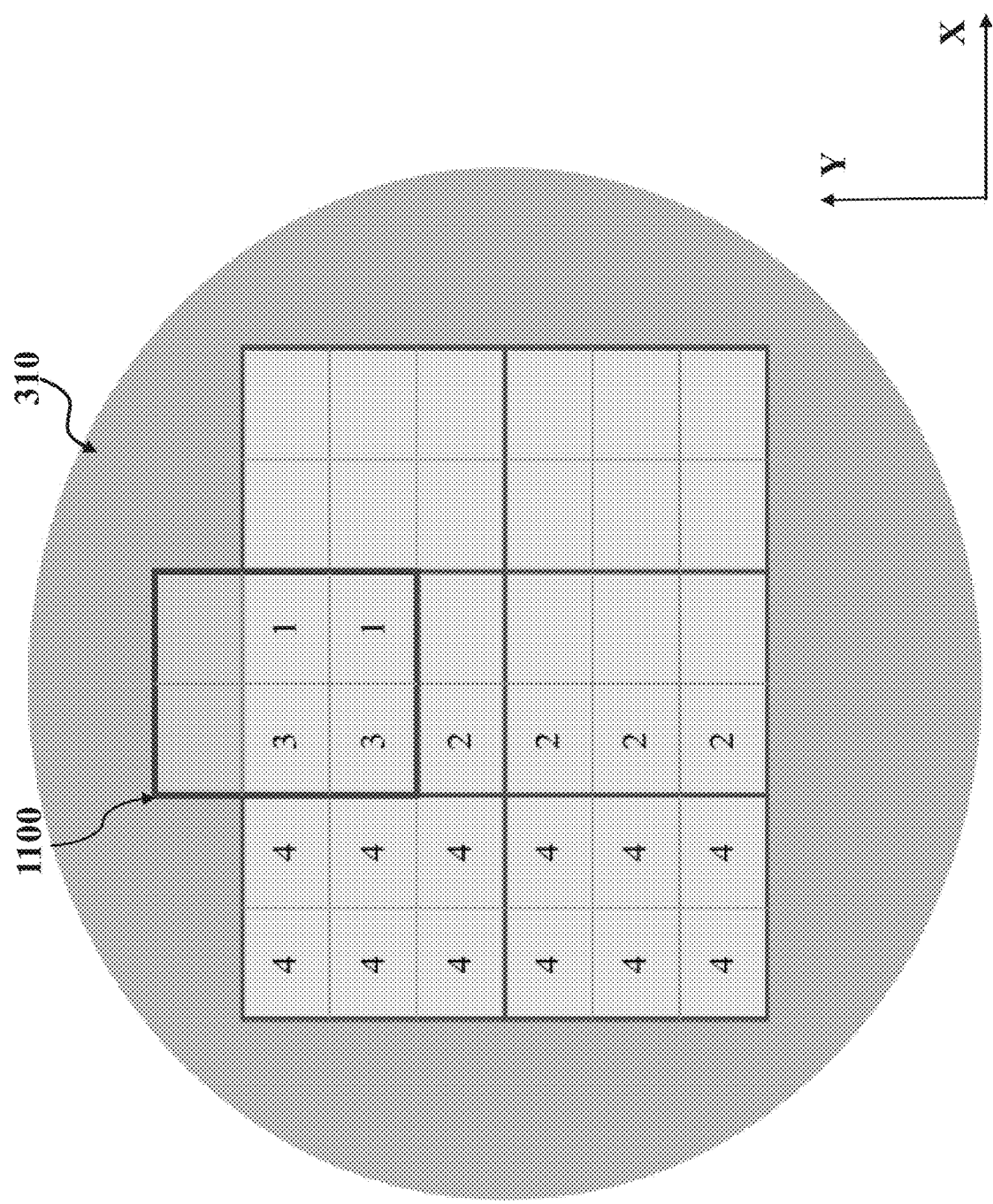
Figures 11, 12, 13, 14, 15, 16, 17:
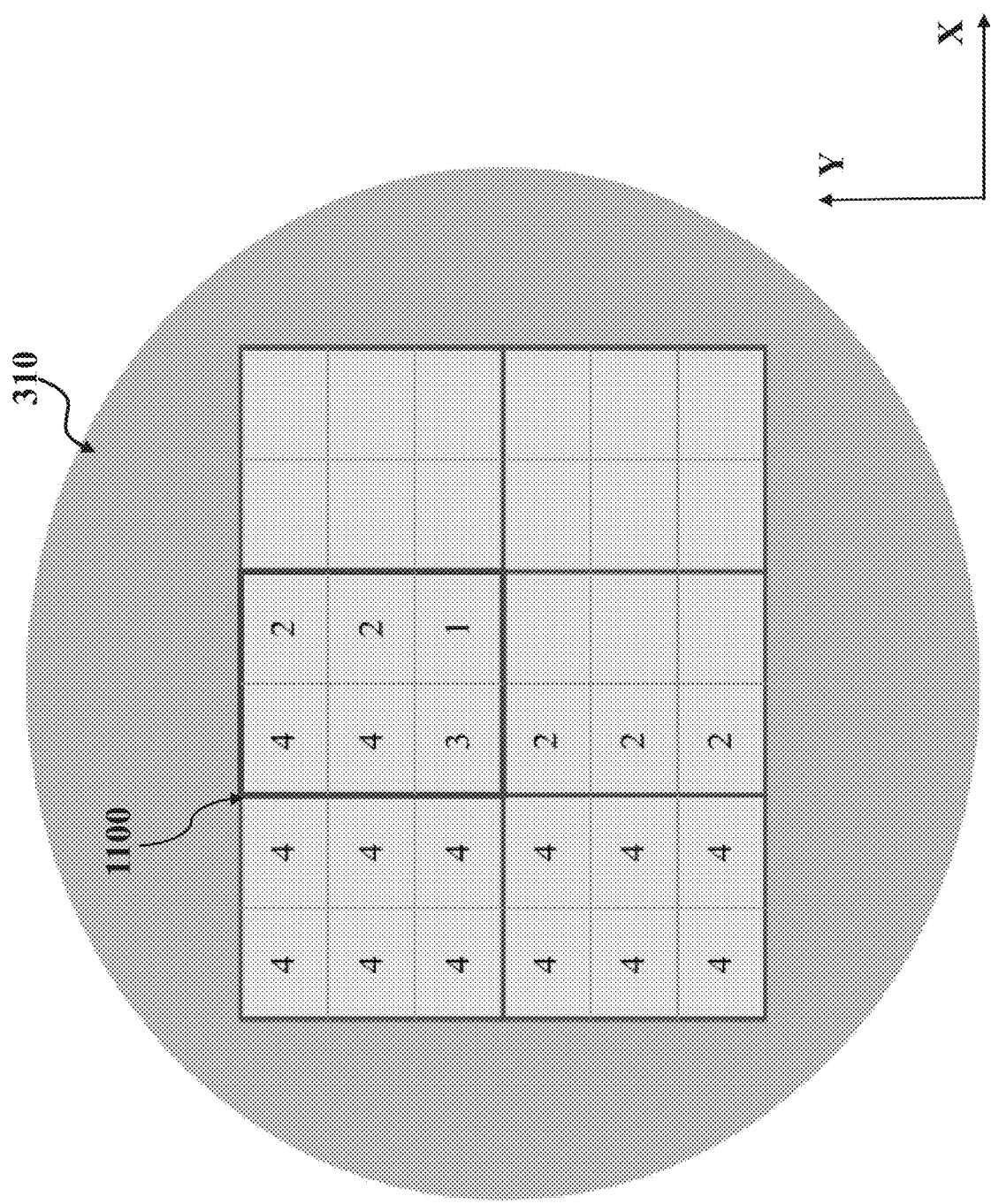
Figures 11, 12, 13, 14, 15, 16, 17, 18:
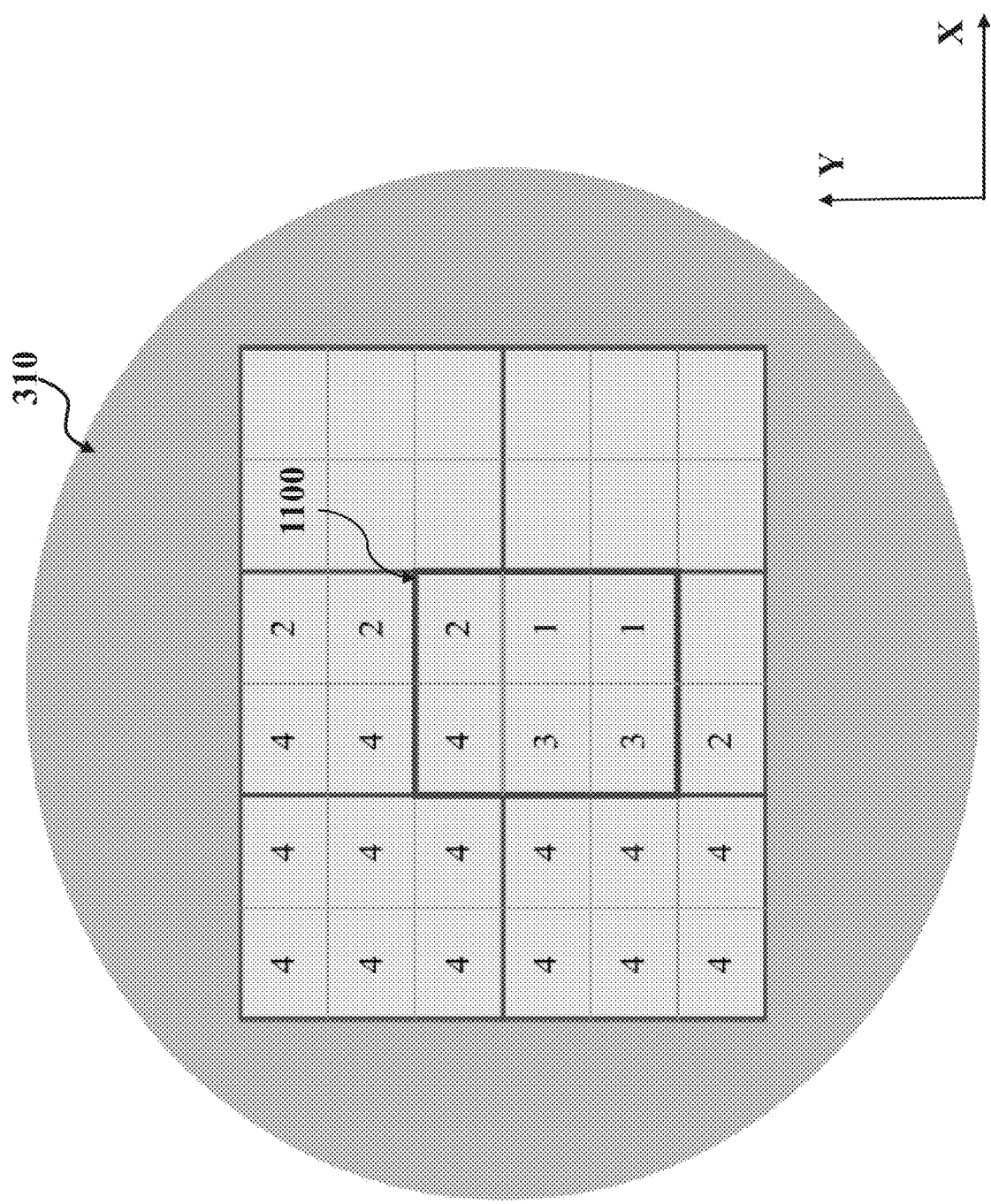
Figures 11, 12, 13, 14, 15, 16, 17, 18, 19:
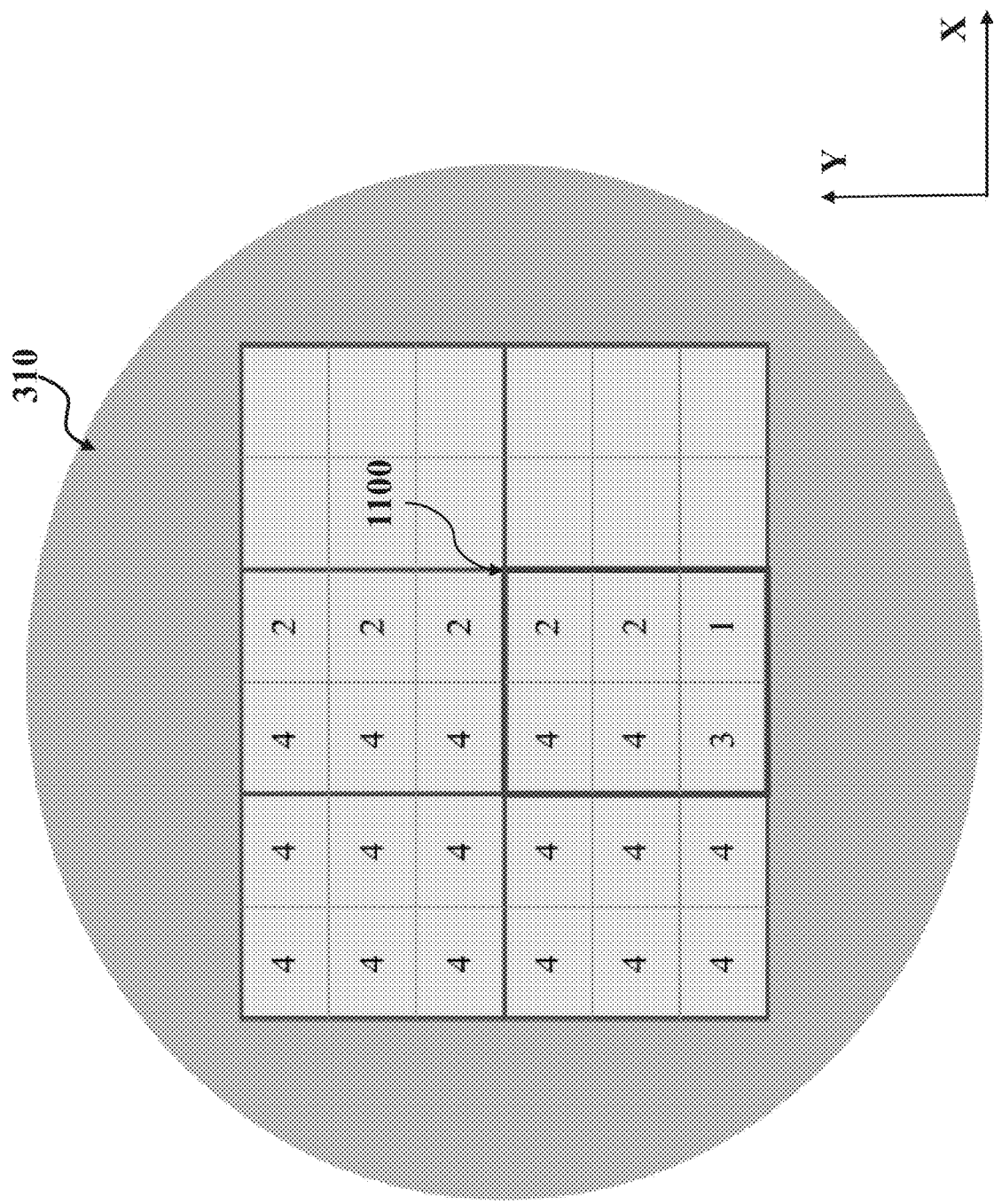
Figures 11, 12, 13, 14, 15, 16, 17, 18, 19, 20:
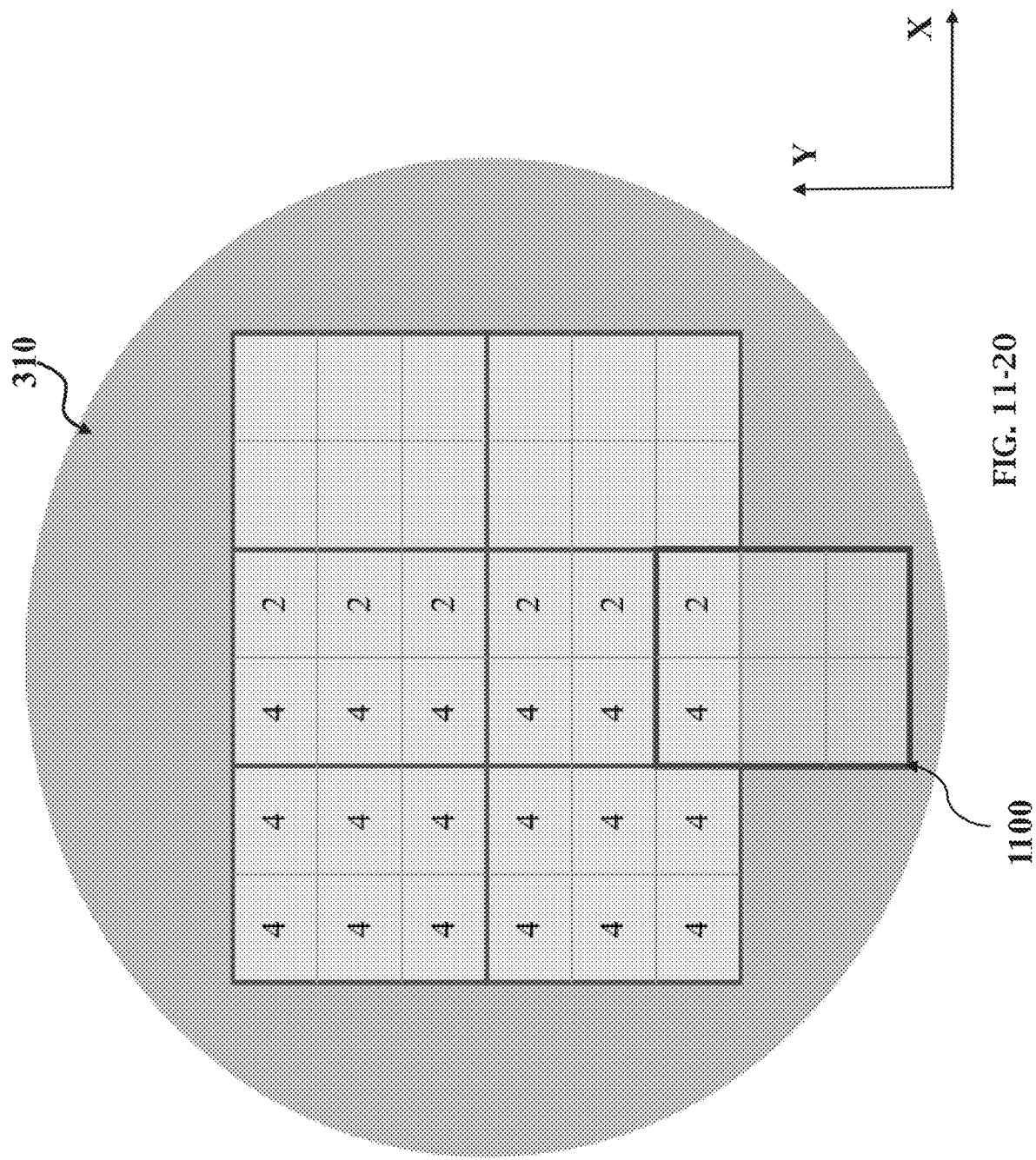
Figures 11, 12, 13, 14, 15, 16, 17, 18, 19, 20, 21:
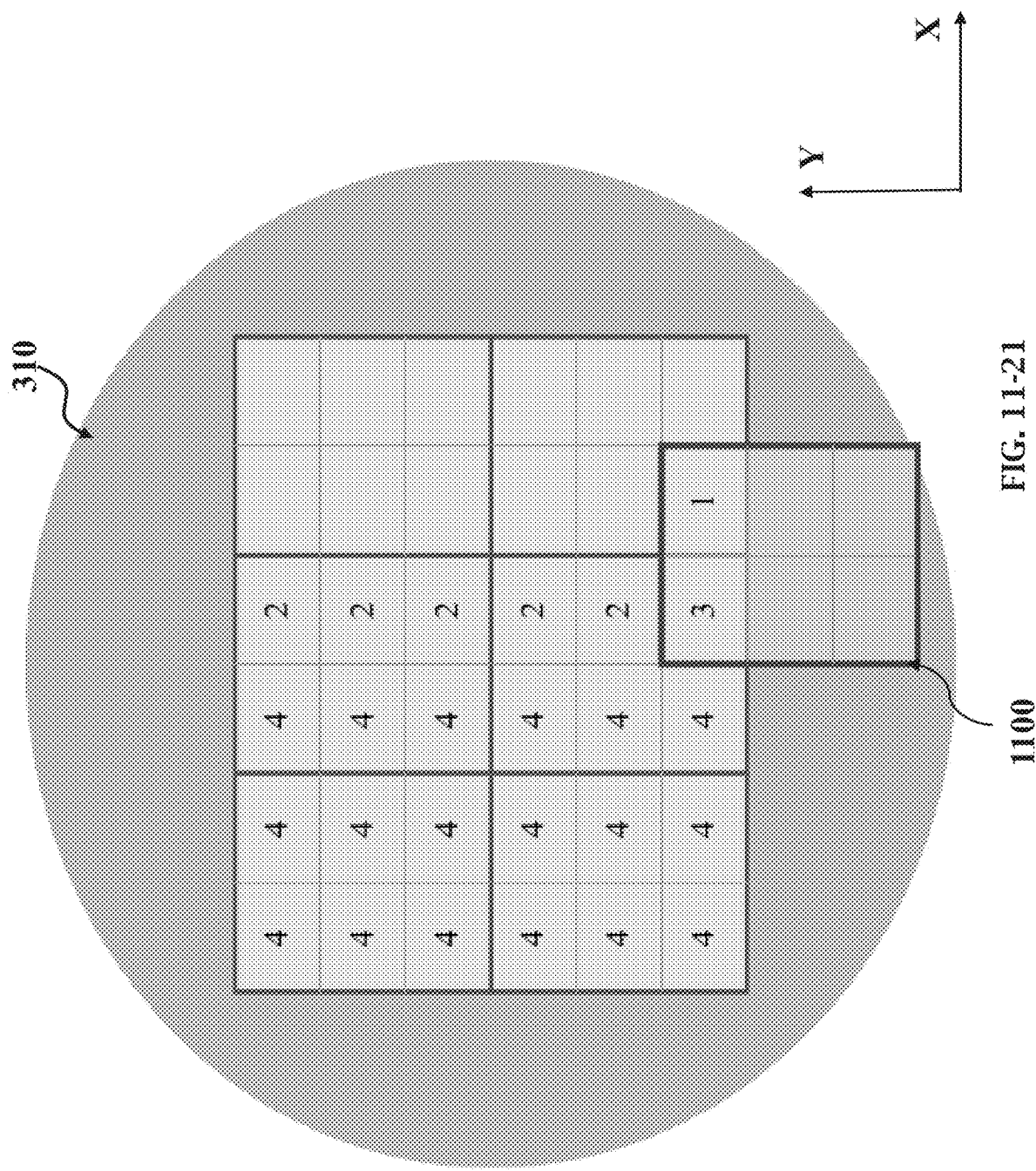
Figures 11, 12, 13, 14, 15, 16, 17, 18, 19, 20, 21, 22:
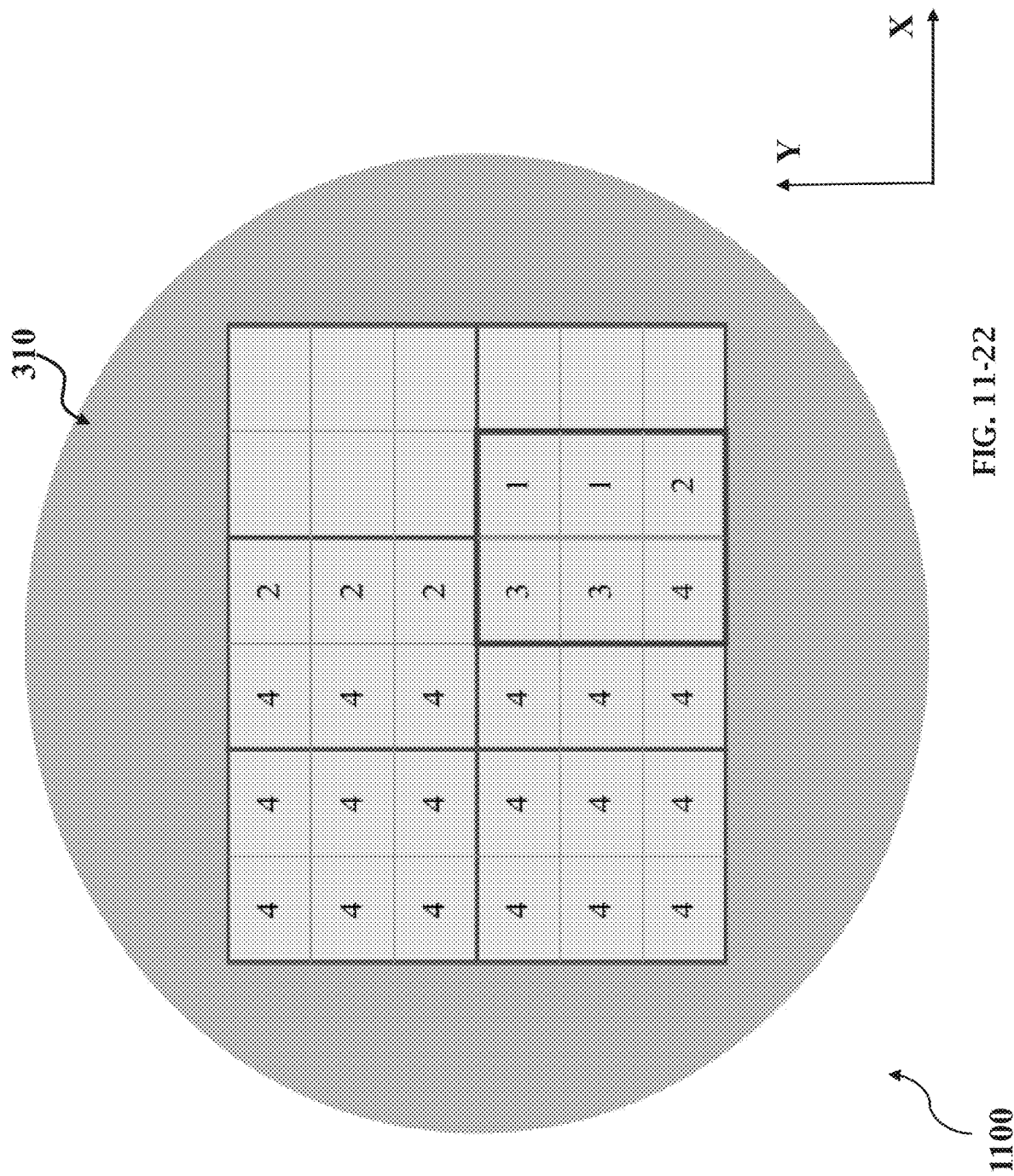
Figures 11, 12, 13, 14, 15, 16, 17, 18, 19, 20, 21, 22, 23:
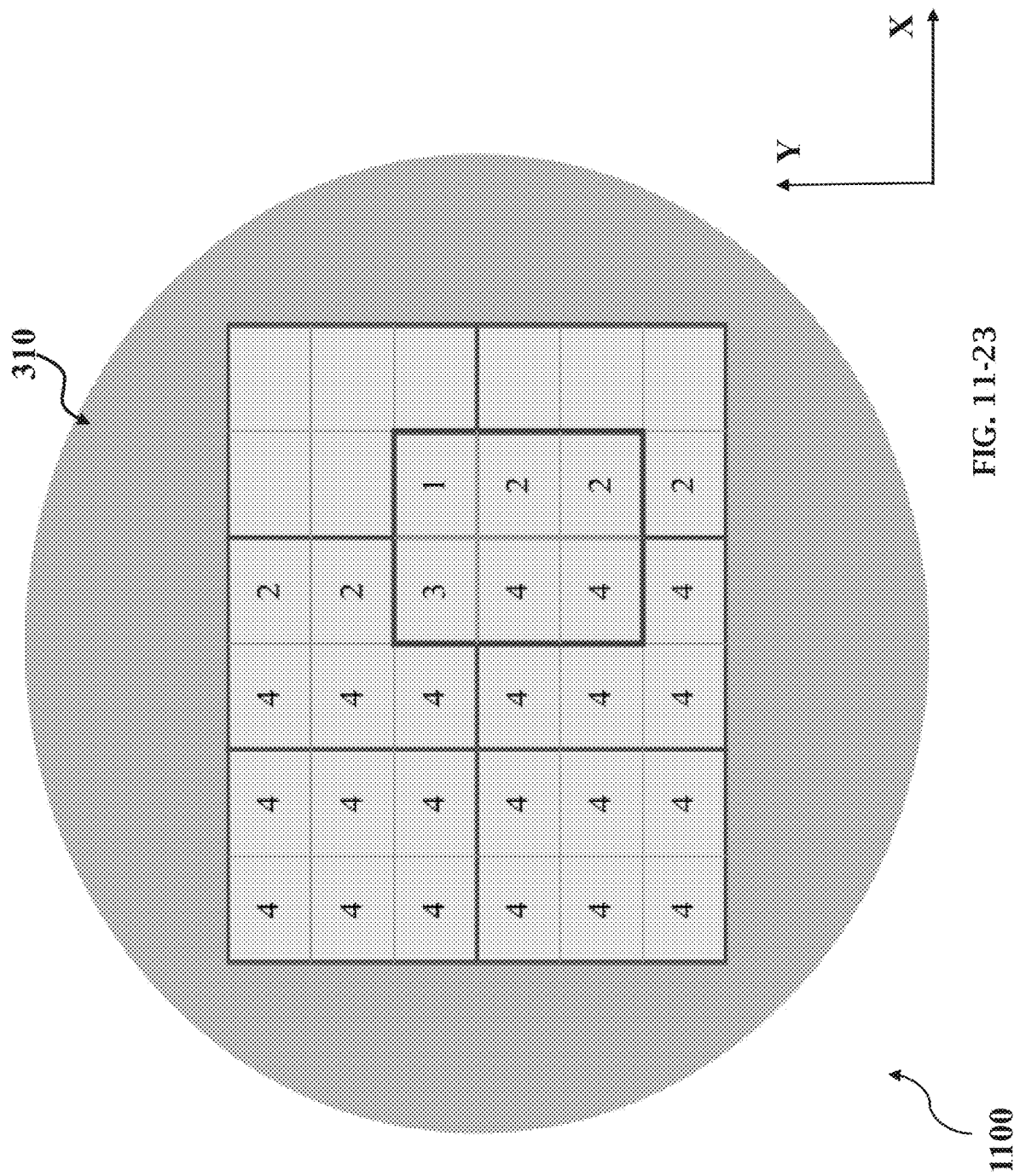
Figures 11, 12, 13, 14, 15, 16, 17, 18, 19, 20, 21, 22, 23, 24:
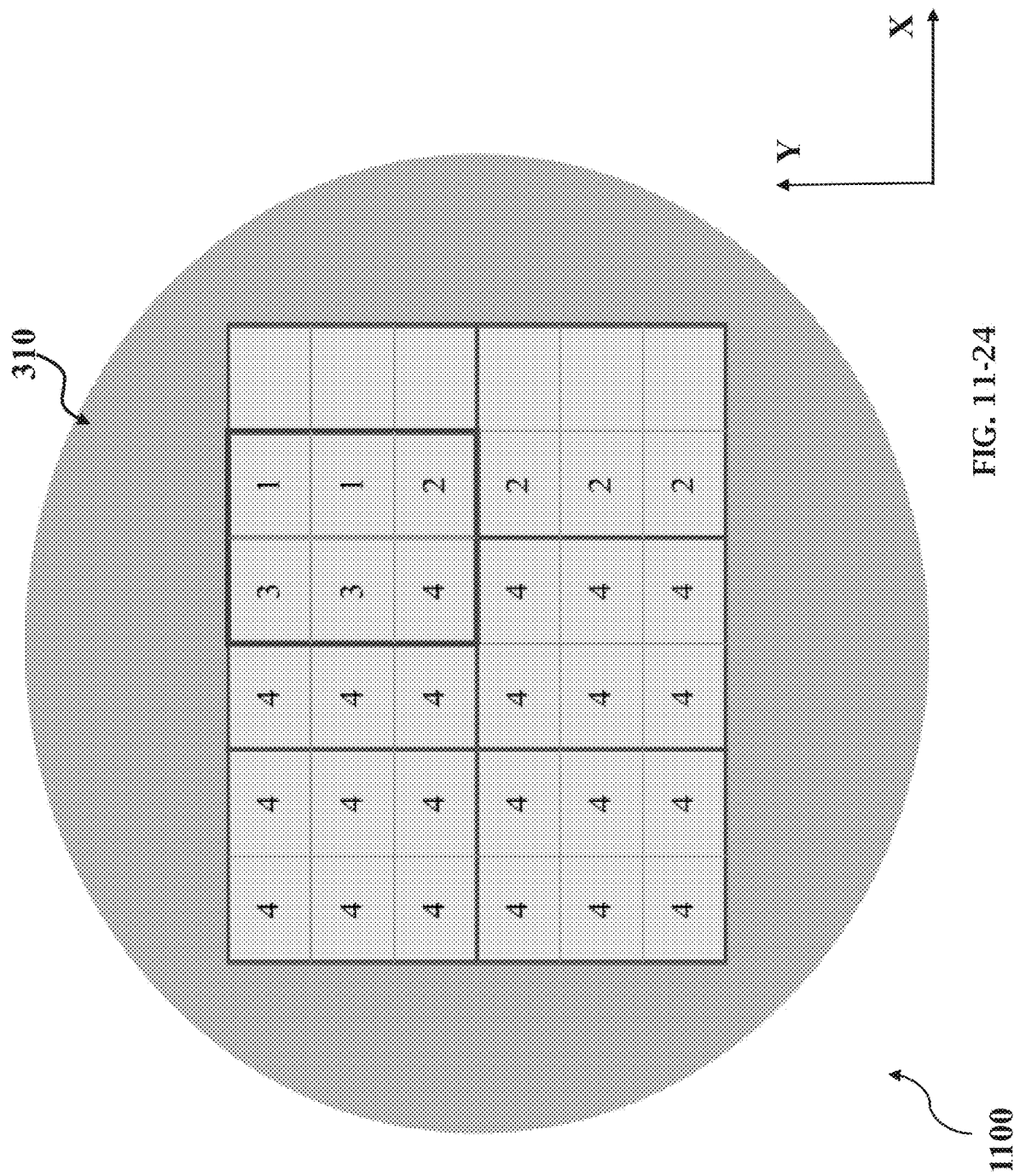
Figures 11, 12, 13, 14, 15, 16, 17, 18, 19, 20, 21, 22, 23, 24, 25:
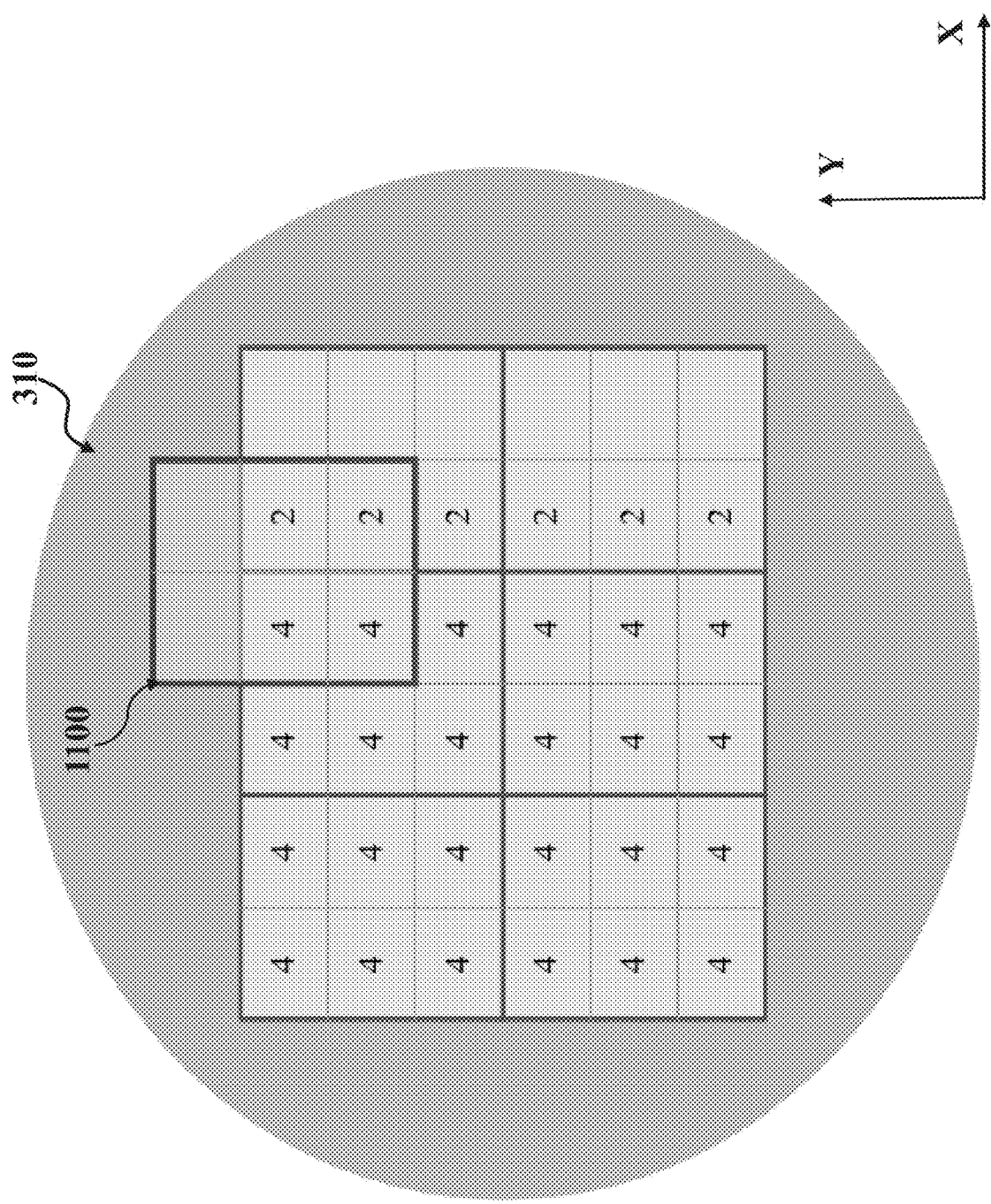
Figures 11, 12, 13, 14, 15, 16, 17, 18, 19, 20, 21, 22, 23, 24, 25, 26:
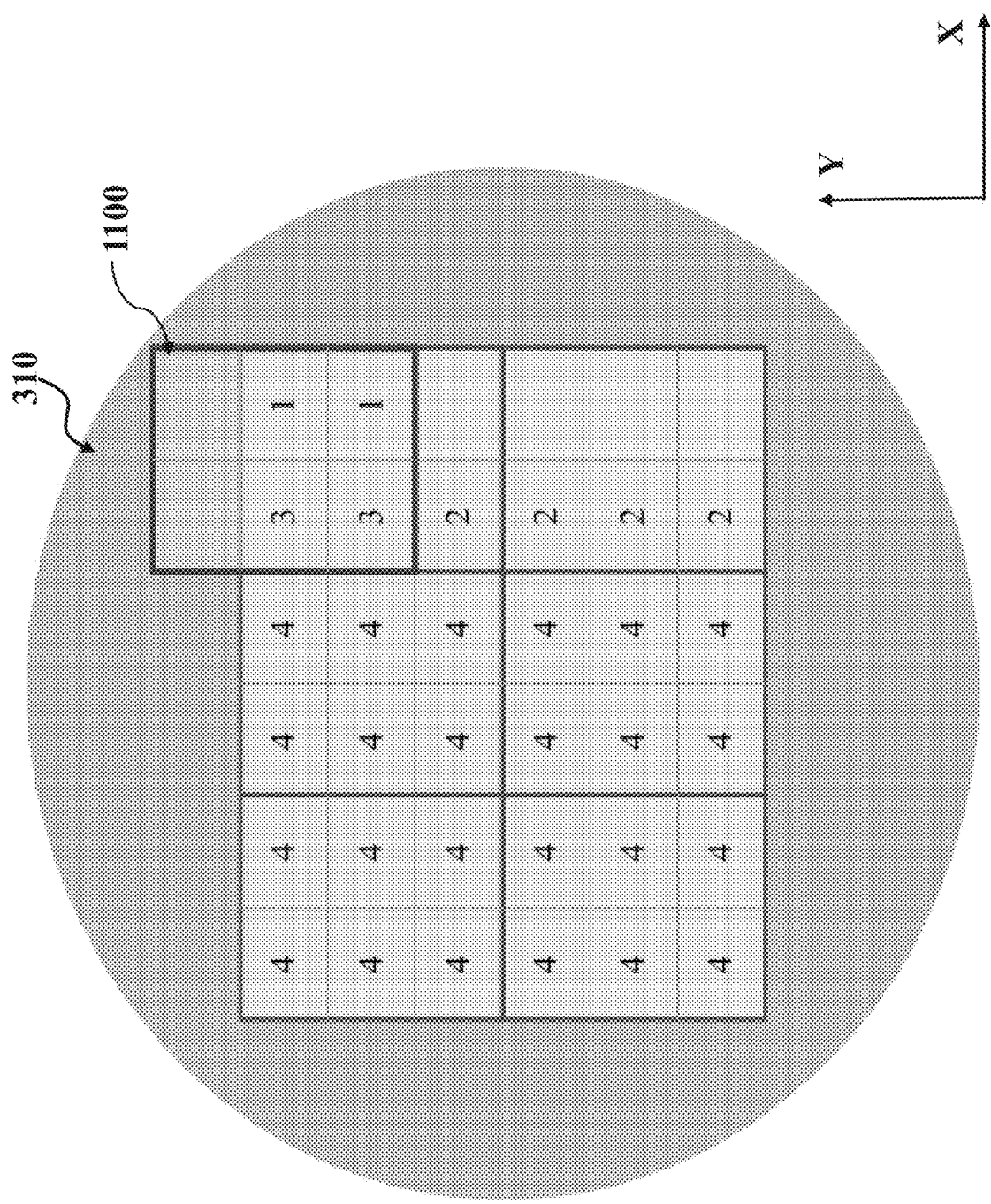
Figures 11, 12, 13, 14, 15, 16, 17, 18, 19, 20, 21, 22, 23, 24, 25, 26, 27:
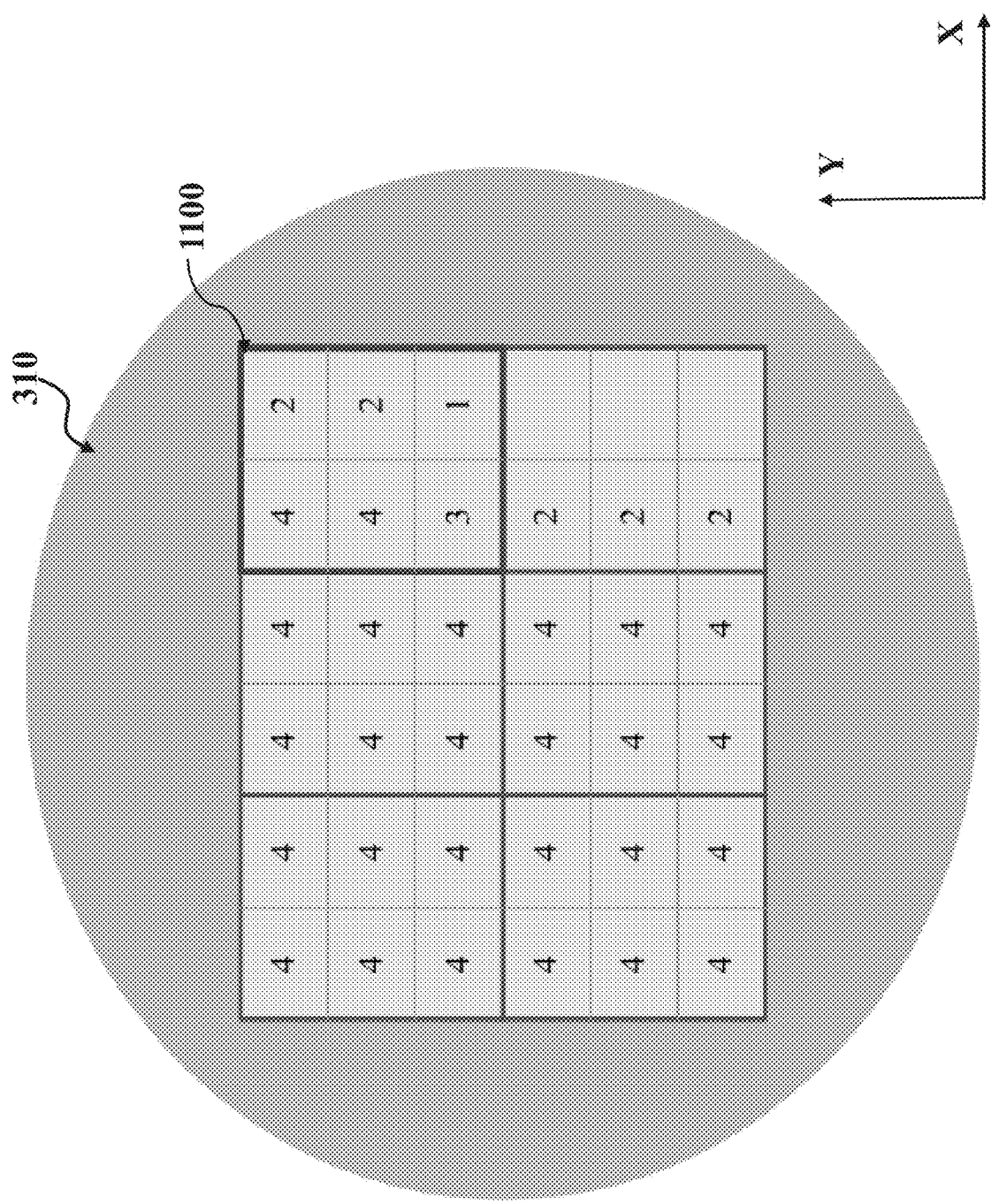
Figures 11, 12, 13, 14, 15, 16, 17, 18, 19, 20, 21, 22, 23, 24, 25, 26, 27, 28:
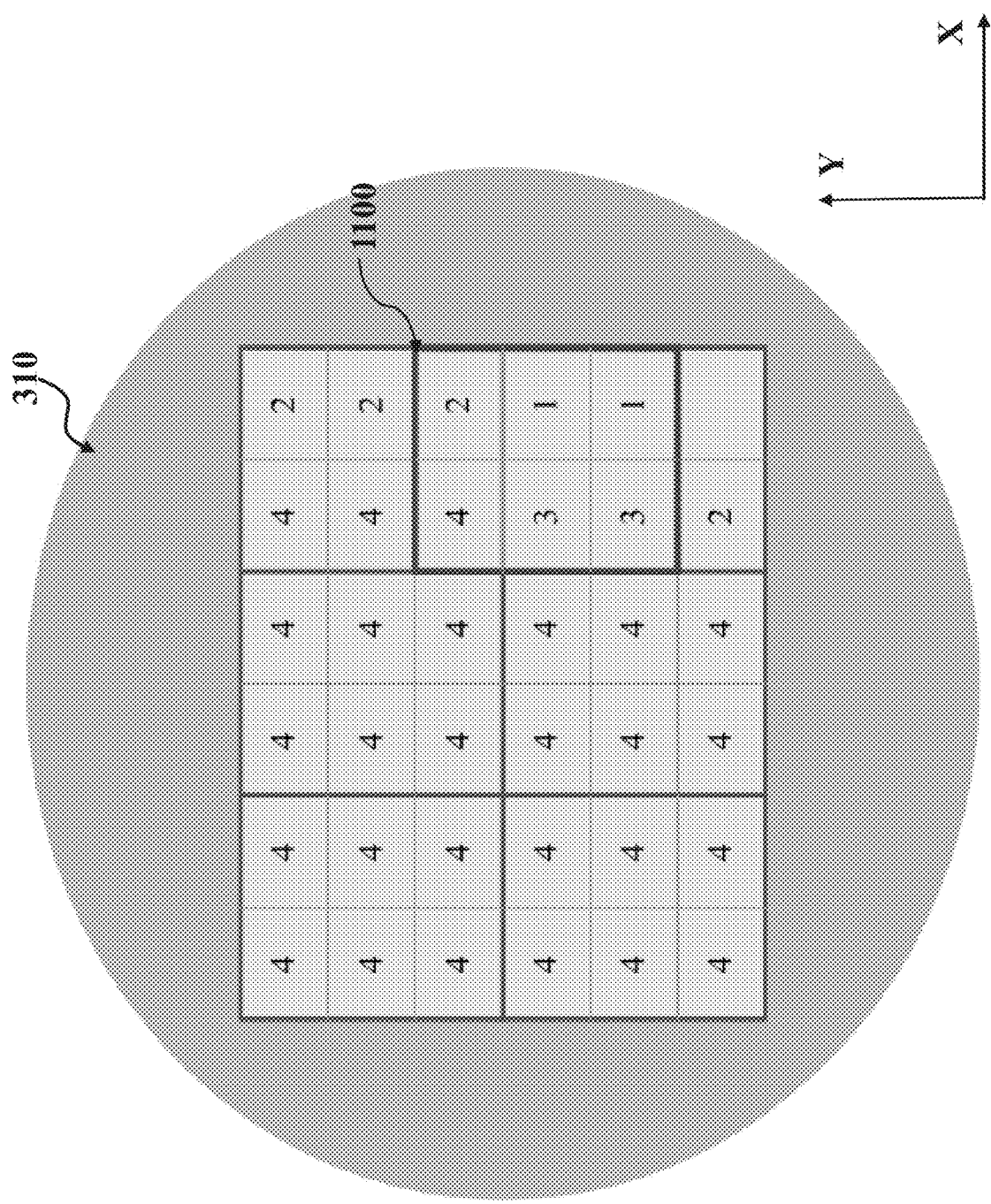
Figures 11, 12, 13, 14, 15, 16, 17, 18, 19, 20, 21, 22, 23, 24, 25, 26, 27, 28, 29:
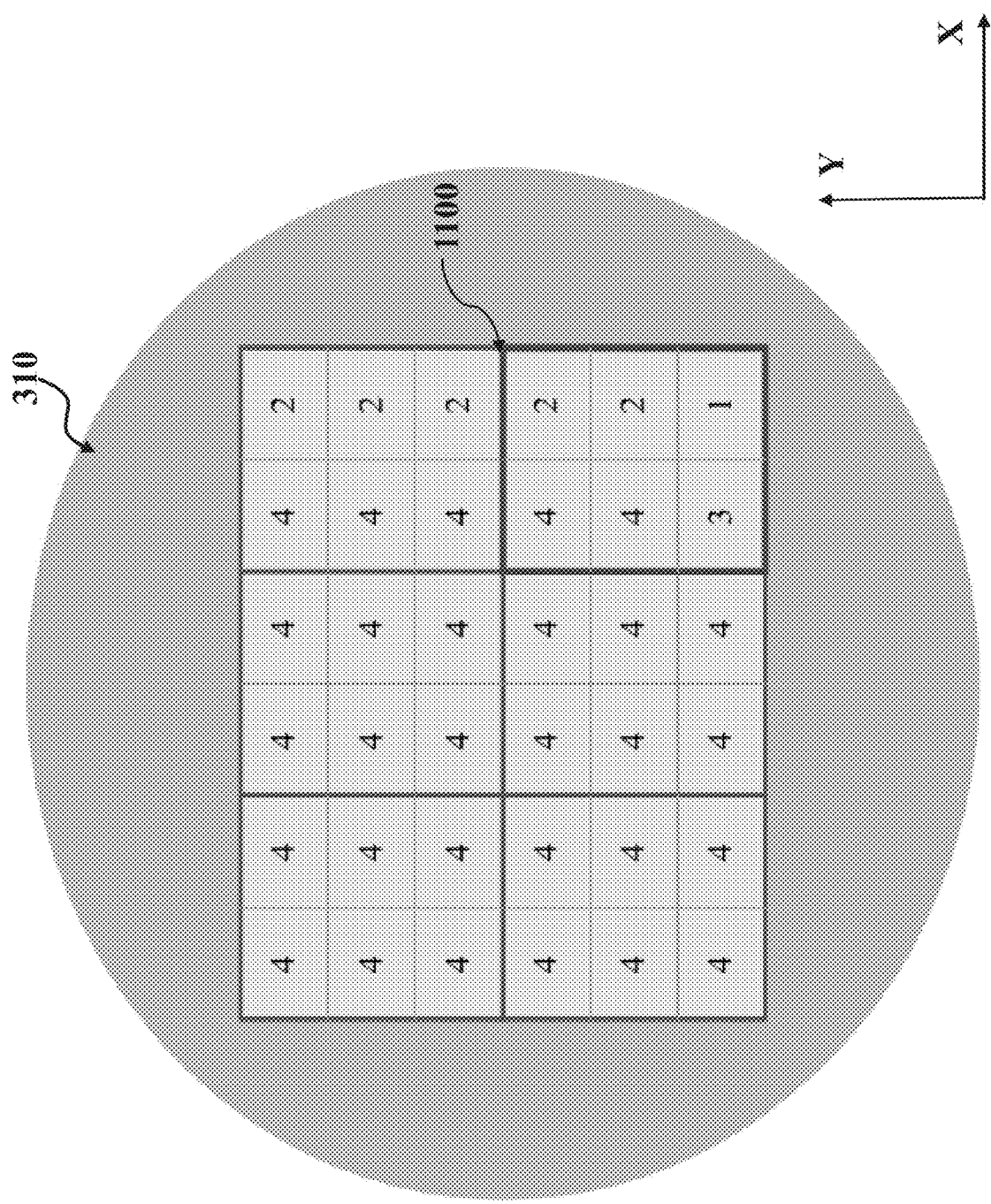
Figures 11, 12, 13, 14, 15, 16, 17, 18, 19, 20, 21, 22, 23, 24, 25, 26, 27, 28, 29, 30:
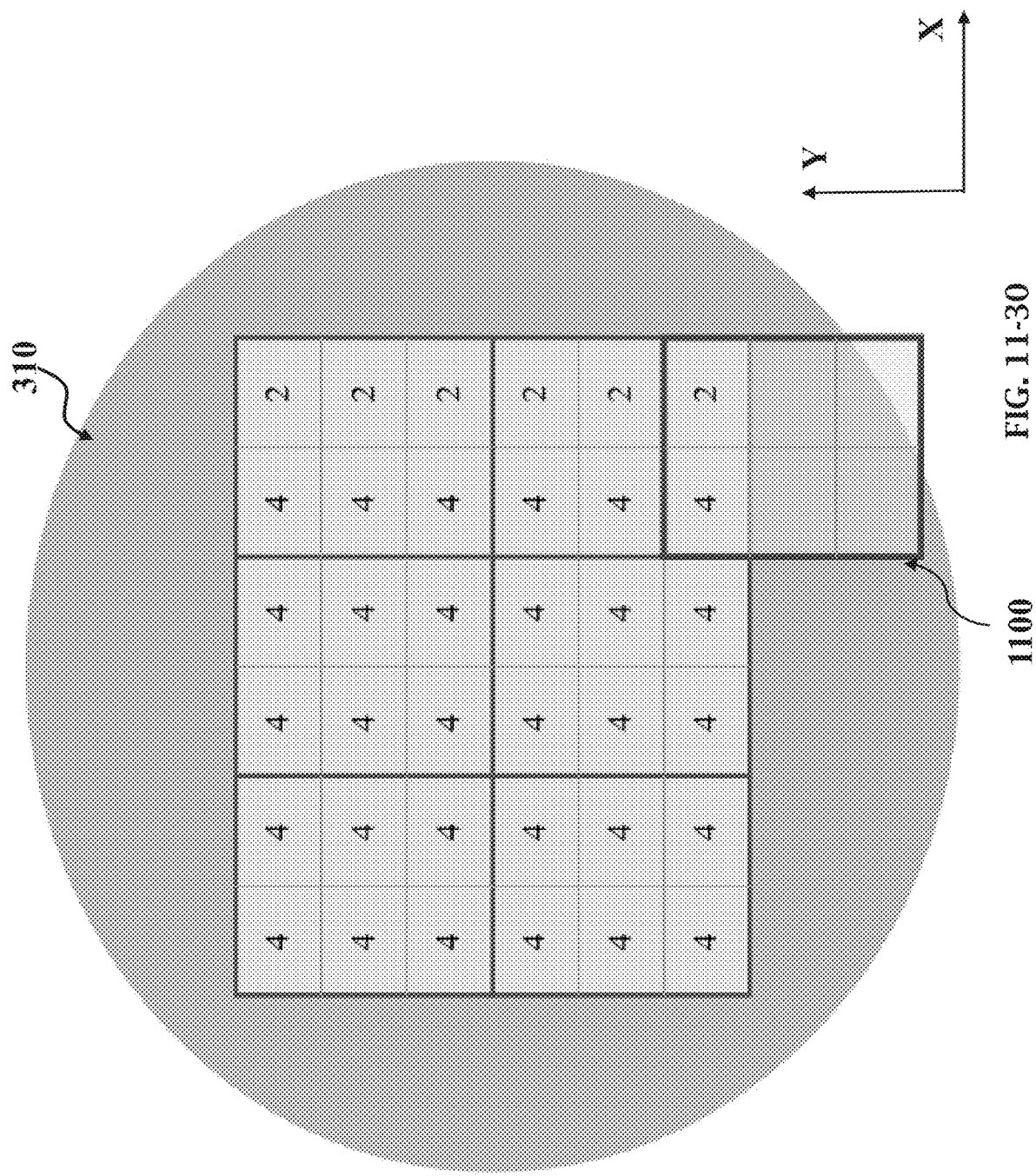
Figures 11, 12, 13, 14, 15, 16, 17, 18, 19, 20, 21, 22, 23, 24, 25, 26, 27, 28, 29, 30, 31, 32:
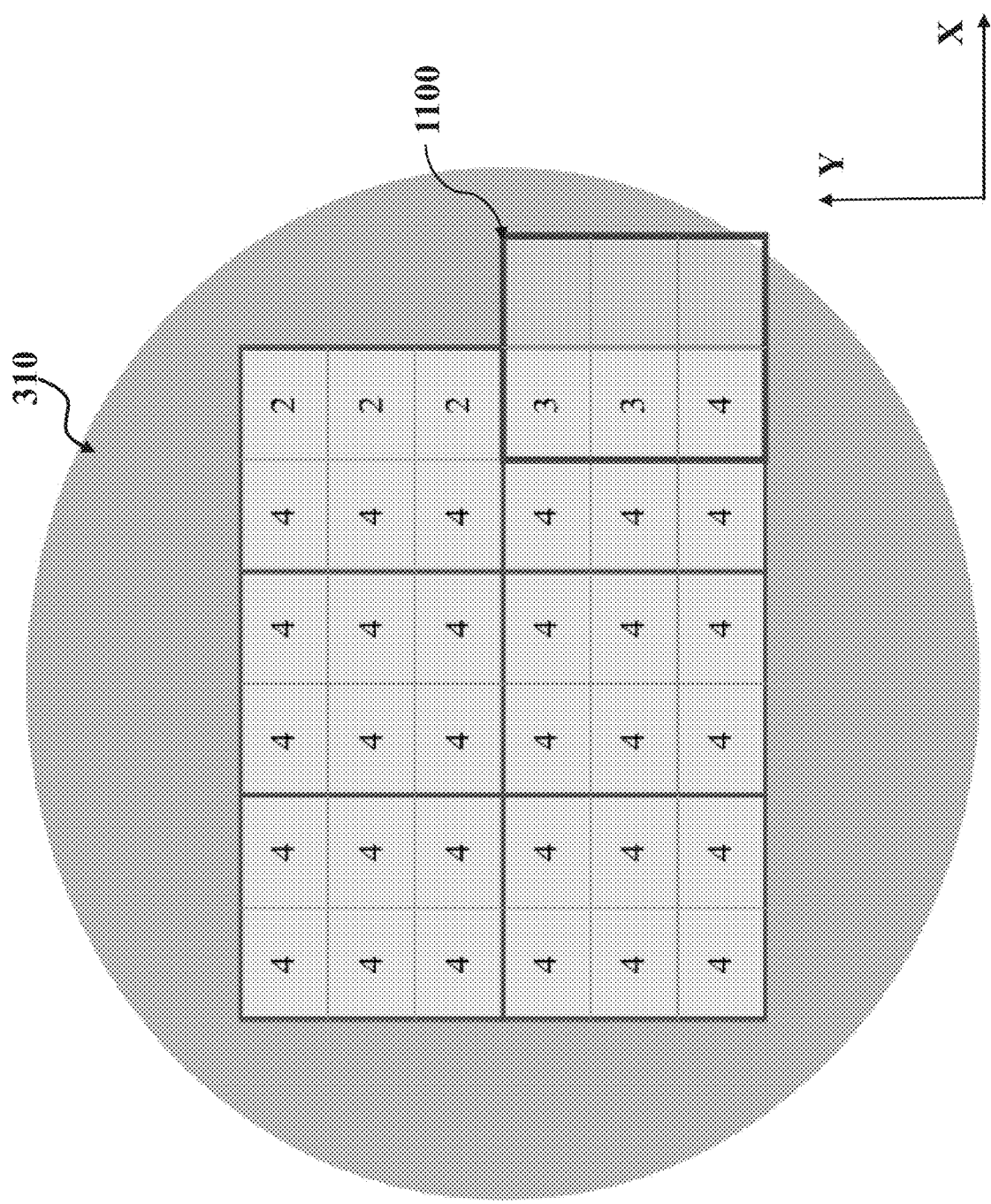
Figures 11, 12, 13, 14, 15, 16, 17, 18, 19, 20, 21, 22, 23, 24, 25, 26, 27, 28, 29, 30, 31, 32, 33:
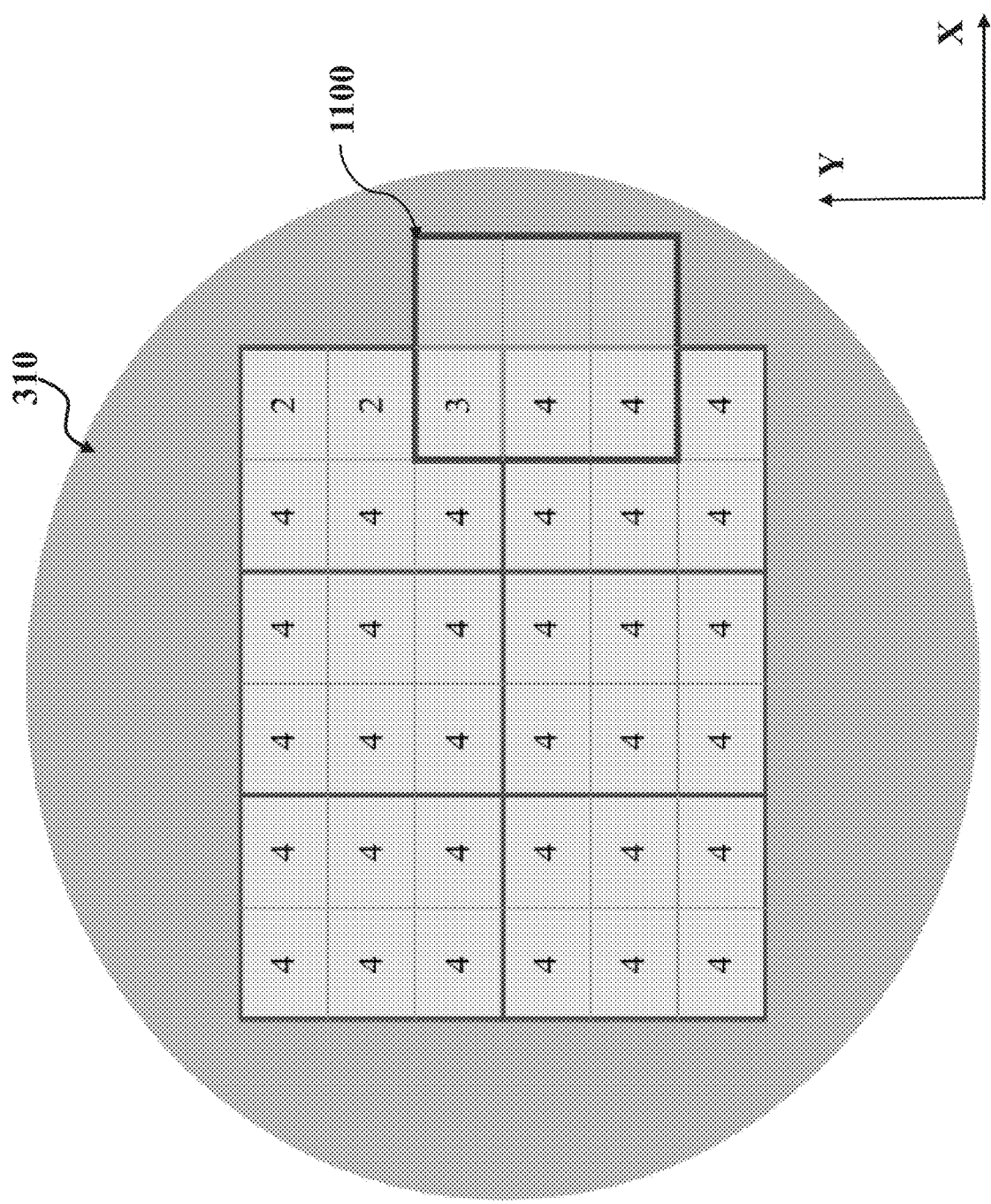
Figures 11, 12, 13, 14, 15, 16, 17, 18, 19, 20, 21, 22, 23, 24, 25, 26, 27, 28, 29, 30, 31, 32, 33, 34:
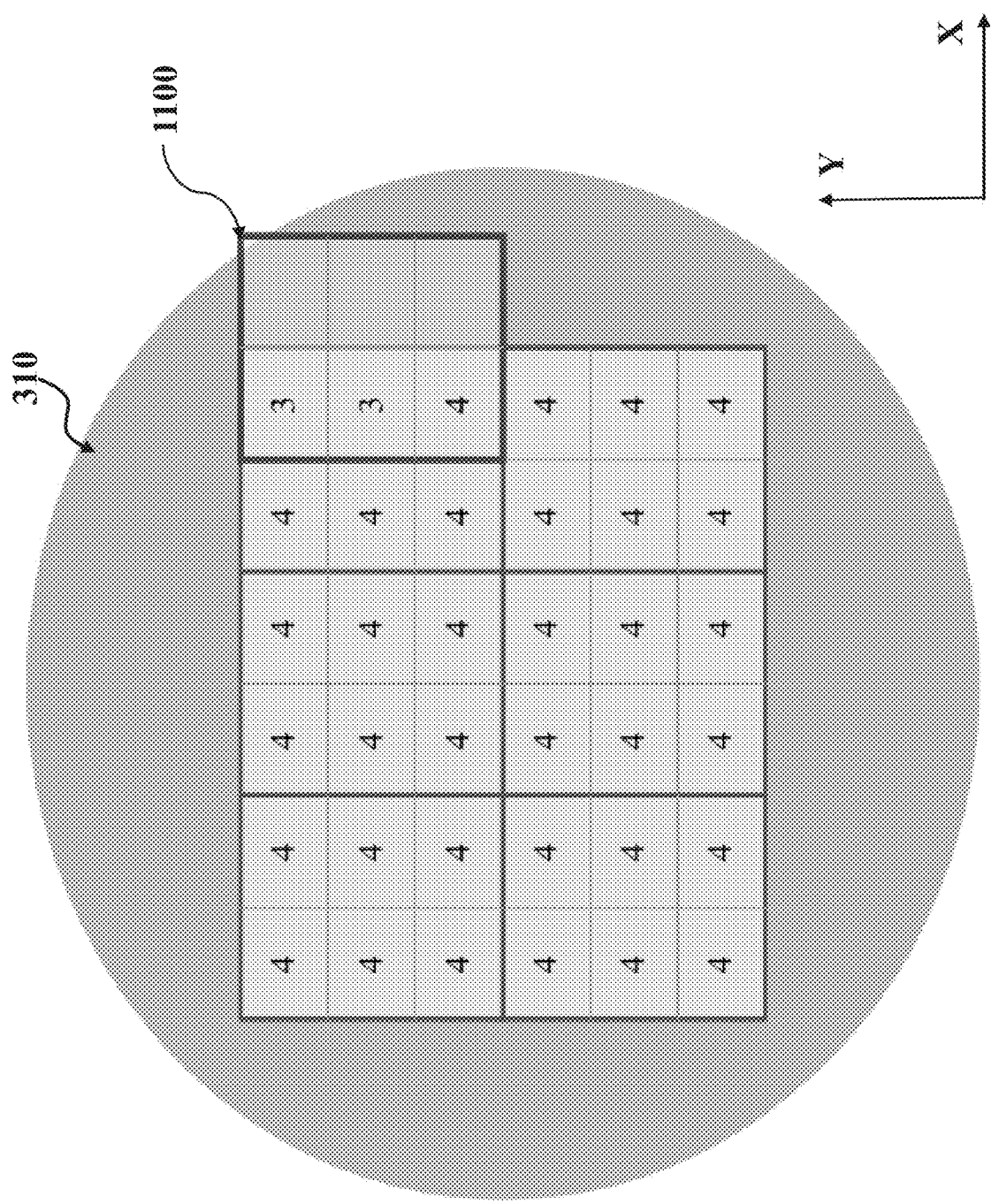
Figures 11, 12, 13, 14, 15, 16, 17, 18, 19, 20, 21, 22, 23, 24, 25, 26, 27, 28, 29, 30, 31, 32, 33, 34, 35:
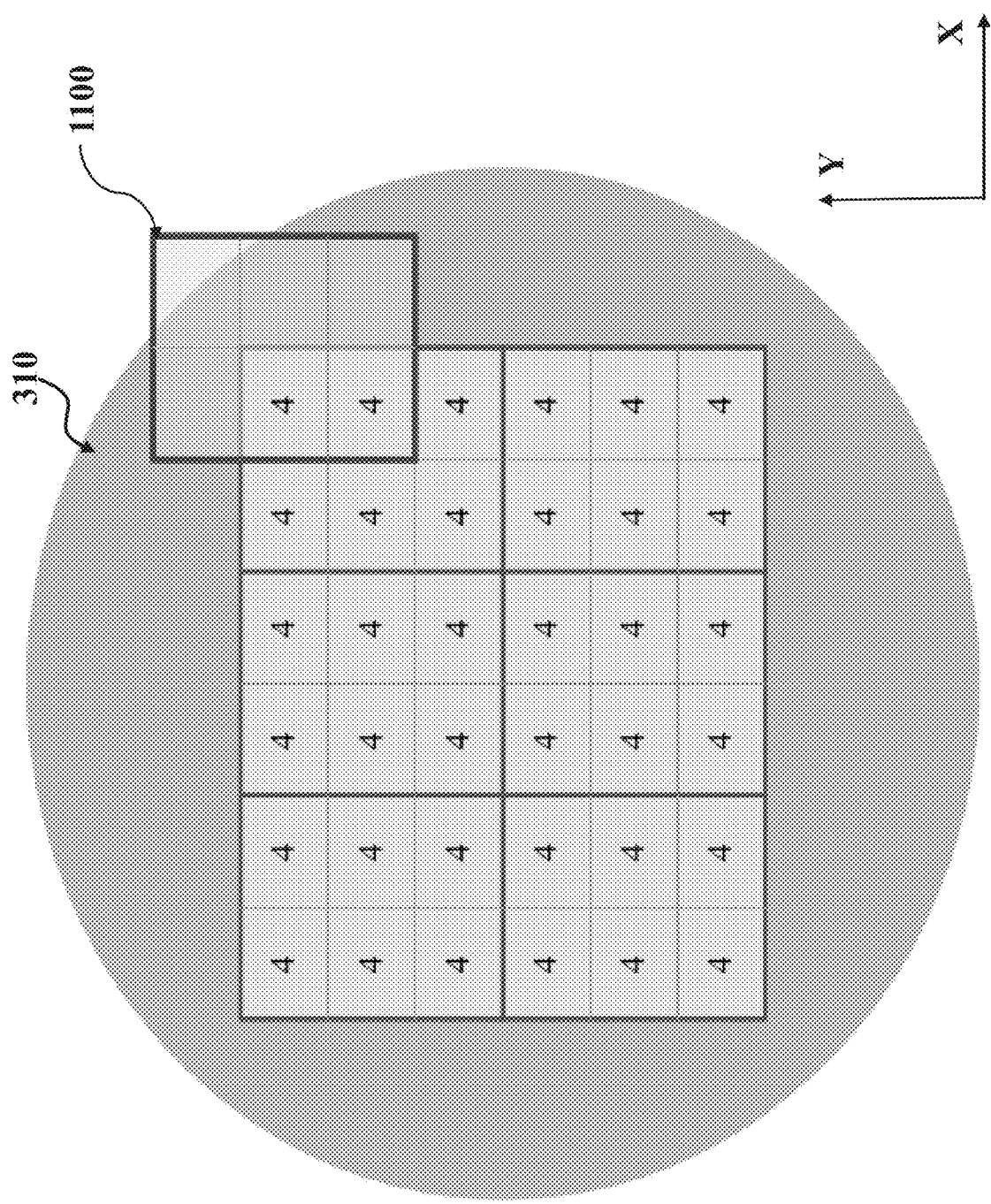

To make the description short and concise, the hybrid lithography exposure process with one mask is sequentially illustrated through FIGS. 11-1 to 11-35. The stepping distances in such step-and-scan cycles from FIGS. 11-1 to 11-35 are (0, $D_y$), (0, 2$D_y$), (0, $D_y$), (0, 2$D_y$), (0, $D_y$), (Dx, 0), (0, -$D_y$), (0, -2$D_y$), (0, -$D_y$), (0, -2$D_y$), (Dx, 0), (0, 2$D_y$), (0, $D_y$), (0, 2$D_y$), (0, $D_y$), (Dx,0), (0, -$D_y$), (0, -2$D_y$), (0, -$D_y$), (0, -2$D_y$), (Dx, 0), (0, 2$D_y$), (0, $D_y$), (0, 2$D_y$), (0, $D_y$), (Dx, 0), (0, -$D_y$), (0, -2$D_y$), (0, -$D_y$), (0, -2$D_y$), (Dx, 0), (0, 2$D_y$), (0, $D_y$), (0, 2$D_y$, and (0, $D_y$). As illustrated in FIG. 11-35, after the complement of the sequence, each subfield has been equally exposed 4 times. This embodiment illustrates various alternatives. First, the stepping distance is not a constant. For example, the first four stepping actions from FIGS. 11-1 to 11-4, the stepping distances along Y direction are $D_y$, 2$D_y$, $D_y$, and 2$D_y$, respectively. Second, by applying such hybrid lithography process with varying and periodic steps, the number of the exposure processes achieved by one mask is not N=$N_x$*$N_y$, but N'. N' is usually smaller than N. In the present case, the number of the exposure processes achieved by one mask is 2*2=4 instead 2*3. In other words, N'=$N_x$'*$N_y$', where $N_x$' and $N_y$'0 are less than or at most equal to $N_x$ and $N_y$, respectively. Especially, there is a pattern identifiable from the procedure. For various subfields on the wafer 310 as illustrated in FIGS. 11-1 through 11-35, the $1^{st}$ row subfields (e.g., (1, 1), (2, 1), . . . , and (6, 1)) each is exposed 4 times by 4 sub-regions (1, 1), (1, 3). (2, 1) and (2, 3) of the corresponding mask 1100. The $2^{nd}$ row subfields (e.g., (1, 2), (2, 2), . . . , and (6, 2)) each is exposed 4 times by 4 sub-regions (1, 2), (1, 3). (2, 2) and (2, 3) of the corresponding mask 1100. The $3^{rd}$ row subfields (e.g., (1, 3), (2, 3), . . . , and (6, 3)) each is exposed 4 times by 4 sub-regions (1, 2), (1, 3). (2, 1) and (2, 3) of the corresponding mask 1100. The $4^{th}$, $5^{th}$ and $6^{th}$ rows repeat the same pattern.

Generally speaking, by implementing this hybrid lithography process with varying and periodic steps, the number of exposure processes is L'=M*N'=M*$N_x$'*$N_y$', which may be equal to or less than L=M*N=M*$N_x$*$N_y$. In the above formula, $N_x$' is an integer that can be 1, 2, . . . , or $N_x$, and $N_y$' is an integer that can be 1, 2, . . . , or $N_y$, with additional condition that $N_x$'*$N_y$' is greater than one. In other words, $N_x$' and $N_y$' cannot both be 1. Back to the mask 1100 in FIGS. 11-1 through 11-35, the number of exposure processes by one mask is N'=$N_x$'*$N_y$', which can be, 1*2, 2*1, 2*2, or 2*3.

The present disclosure provides an extreme ultraviolet lithography (EUVL) method in accordance with some embodiments. The EUVL method is a hybrid exposure process that includes multiple exposure processes, each using the IC pattern defined in different mask image regions, which associated with multiple masks and multiple sub-regions of each mask. The EUVL method may further includes determining an optimized exposure dose; determining available sub-regions of a mask according to the IC pattern; and determining mask number M and sub-region parameters $N_x$ and $N_y$ of a mask according to the available sub-regions and a manufacturing cost function. The manufacturing cost function defines a manufacturing cost associated with a hybrid lithography exposure process as a function of the mask making cost and wafer making cost. The mask making cost further includes blank mask cost, making patterning cost and mask repair cost. The wafer cost includes step-and-scan actions cost. The hybrid lithography exposure process includes a plurality of exposure processes, wherein each of the plurality of exposure processes uses an exposure dose that is less than the optimized exposure dose and a sum of the exposure dose of each of the plurality of exposure processes is approximately equal to the optimized exposure dose.

When different mask patterns (including different masks and different sub-regions of the masks) are used to expose a same IC pattern by the hybrid lithography exposure process with multiple exposure processes, one or more of the different mask patterns include a phase-defect region. Because the exposure dose projected onto the different mask pattern is less than the optimized exposure dose, the impact of such phase-defect regions in the various mask patterns is greatly reduced. Since such defects or defect regions are randomly located on various masks or various sub-regions of the masks, no defect or defect region will receive a full exposure dose. More specifically, an aerial image intensity impacted by each individual defect or defect region is reduced, thereby reducing printability of such defect or defect region.

Thus, the present disclosure provides a lithography method in accordance with some embodiments. The method includes forming a resist layer on a substrate; performing a first exposure process to image a first pattern of a first sub-region of a first mask to the resist layer; performing a second exposure process to image a second pattern of a second sub-region of the first mask to the resist layer; and performing a third exposure process to image a third pattern of a first sub-region of a second mask to the resist layer. The second and third patterns are identical to the first pattern. The first, second and third exposure processes collectively form a latent image of the first pattern on the resist layer.

A method for extreme ultraviolet lithography (EUVL) is disclosed in accordance with some embodiments. The method includes receiving an integrated circuit (IC) design layout; determining candidate sub-regions based on the IC design layout; determining sub-region parameters $N_x$ and $N_y$, and a mask parameter M based on a manufacturing cost function and the candidate sub-regions; and fabricating a first number of identical masks according to the IC design layout. The first number equals to the mask parameter M. Each of the masks includes $N_x$ times $N_y$ sub-regions configured in an array, wherein each of the sub-regions on each of the masks defines a same pattern.

A method for extreme ultraviolet lithography (EUVL) is disclosed in accordance with some embodiments. The method includes receiving a first number (M) of masks, each having $N_x*N_y$ sub-regions configured in an array, wherein $N_x$ and $N_y$ are integers and define numbers of sub-regions along x and y directions, respectively, wherein patterns on the sub-regions of the masks are all identical to a circuit pattern; forming a resist layer on a substrate; and performing a second number of exposure processes to the resist layer. The second number equals to $M*N_x'*N_y'$. The exposure processes includes M groups paired with the first number of masks so that each group of the exposure processes is implemented using a paired mask. Each group of the exposure processes further includes $N_x'*N_y'$ exposure processes with a respective step location different from others. The second number of the exposure processes collectively forms a latent image of the circuit pattern on the resist layer. $N_x'$ is an integer with a value 1, 2, ..., or $N_x$, and $N_y'$ is an integer with a value 1, 2, ..., or $N_y$, and $N_x'*N_y'$ is greater than one. When the hybrid lithography process implements varying steps (as illustrated in FIGS. 11-1 through 11-35), $N_x'$ is less than $N_x$ and $N_y'$ is less than $N_y$. When the hybrid lithography process implements a constant step (as illustrated in FIGS. 9A through 9P), $N_x'$ equals $N_x$ and $N_y'$ equals $N_y$.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for extreme ultraviolet lithography (EUVL), the method comprising:
   receiving an integrated circuit (IC) design layout;
   determining candidate sub-regions based on the IC design layout;
   determining sub-region parameters Nx and Ny and a mask parameter M based on a manufacturing cost function and the candidate sub-regions;
   fabricating a first number of identical masks according to the IC design layout;
   forming a resist layer on a substrate; and
   performing a second number of exposure processes to a same area of the resist layer using the masks,
   wherein the first number equals to the mask parameter M,
   wherein each of the masks includes Nx times Ny sub-regions configured in an array, wherein each of the sub-regions on each of the masks defines a same pattern,
   wherein each of the first number, Nx and Ny is greater than 1,
   wherein the first number of identical masks comprise randomly distributed defects,
   wherein the manufacturing cost function is a linear function,
   wherein the performing of the second number of exposure processes comprises:
      performing a plurality of first step-wise exposures of the same area by moving a first stepping distance along an X direction, and
      performing a plurality of second step-wise exposures of the same area by moving a second stepping distance along a Y direction,
   wherein the second stepping distance is not constant.

2. The method of claim 1, wherein the manufacturing cost function is defined as a function of a mask fabrication cost and a lithography exposure cost.

3. The method of claim 2, wherein the mask fabrication cost further includes a mask making cost, a blank mask cost, and a mask repair cost; and
   wherein the lithography exposure cost is a function of a stepping time cost and a scanning time cost.

4. The method of claim 1,
   wherein the second number equals to M*Nx'*Ny',
   wherein each of the exposure processes uses only one of the masks,
   wherein the exposure processes includes M groups paired with the first number of masks so that each group of the exposure processes is implemented using a paired mask,
   wherein each group of the exposure processes further includes Nx'*Ny' exposure processes using a respective sub-region of the paired mask, and
   wherein the second number of the exposure processes collectively form a latent image of the pattern in the area of the resist layer, wherein Nx' is an integer with greater than 1, or Nx, and Ny' is an integer greater than 1, or Ny, wherein Nx'*Ny' is greater than one.

5. The method of claim 1, further comprising developing the resist layer to form a patterned resist having the pattern in the area.

6. The method of claim 1, further comprising determining an optimized exposure dose Eop for the resist layer.

7. The method of claim 6,
wherein the area of the resist layer is exposed M*Nx'*Ny' times by the second number of the exposure processes with respective exposure doses, each being less than the optimized exposure dose.

8. The method of claim 7, wherein the respective exposure doses from the exposure processes add up to an accumulative exposure dose Es that is equals to the optimized exposure dose Eop.

9. The method of claim 8, wherein the respective exposure dose equals to Eop/M*Nx'*Ny'.

10. A method comprising:
providing an integrated circuit (IC) pattern;
determining a first number of available sub-regions based on the IC pattern;
using a manufacturing cost function to determine a cost to manufacture based on the first number of available sub-regions;
determining a second number of masks to be fabricated based on the cost, wherein each of the second number of masks includes an Nx-by-Ny array of mask sub-regions, wherein each of the masks in the Nx-by-Ny array is identical to each of the other masks in the Nx-by-Ny array;
fabricating the second number of masks; and
performing a step-and-scan process by stepping at least one of the second number of masks for a first stepping distance along an X direction and a second stepping distance along a Y direction,
wherein each of the second number, Nx and Ny is greater than 1,
wherein the second stepping distance is not constant.

11. The method of claim 10, wherein the manufacturing cost function further includes:
a mask fabrication cost including a blank mask cost, a mask patterning cost, and a mask repair cost; and
a photolithography cost including scanning time cost and stepping time cost.

12. The method of claim 11,
wherein the manufacturing cost function is a linear function,
wherein the manufacturing cost function further includes a mask complexity cost.

13. The method of claim 11, wherein the blank mask cost of a mask having a defect is lower than the blank mask cost of a mask free of defects; and
wherein a lower blank mask cost associated with the mask having a defect offsets a higher photolithography cost caused by the mask having a defect.

14. The method of claim 10, wherein the pattern of each of the mask sub-regions in the Nx-by-Ny array of mask sub-regions is defined by the IC pattern.

15. A method comprising:
determining a first number of candidate sub-regions of an integrated circuit (IC) design layout;
determining a second number of masks for use in a photolithography process;

determining an Nx-by-Ny array of mask sub-regions for each of the second number of masks, wherein the second number of masks and the Nx-by-Ny array of mask sub-regions is based on a manufacturing cost function;
fabricating the Nx-by-Ny array of mask sub-regions in each of the second number of masks, wherein each mask sub-region in the array of mask sub-regions of a mask is identical to each of the other mask sub-regions in the Nx-by-Ny array of mask sub-regions;
forming a resist layer on a substrate; and
performing a step-and-scan process by stepping at least one of the second number of masks by a first stepping distance along an X direction and by a second stepping distance along a Y direction,
wherein each the second number, Nx and Ny is greater than 1,
wherein the second stepping distance is not constant,
wherein the manufacturing cost function is a linear function.

16. The method of claim 15, wherein the manufacturing cost function further include:
a mask fabrication cost including a blank mask cost, a mask patterning cost, and a mask repair cost; and
a photolithography cost including scanning time cost and stepping time cost.

17. The method of claim 16, wherein the blank mask cost of a mask having a defect is lower than the blank mask cost of a mask free of defects; and
wherein a lower blank mask cost associated with the mask having a defect offsets a higher photolithography cost caused by the mask having a defect.

18. The method of claim 15, wherein the step-and-scan process comprise a third number of exposure processes to a same area of the resist layer using the masks,
wherein the third number equals the second number of masks multiplied by the number of mask sub-regions in the Nx-by-Ny array of mask sub-regions,
wherein each of the exposure processes uses only one of the masks,
wherein the exposure processes include a fourth number of paired masks so that each of the exposure processes is implemented using a paired mask,
wherein the fourth number of paired masks is equal to the second number of masks,
wherein each of the exposure processes further includes a fifth number of exposure processes using a respective sub-region of the paired mask, and
wherein the third number of the exposure processes collectively form a latent image of a pattern in the area of the resist layer.

19. The method of claim 18, wherein the fifth number of exposure processes is equal to the number of mask sub-regions in the Nx-by-Ny array of mask sub-regions.

20. The method of claim 18,
wherein the substrate comprises a plurality of fields,
wherein each of the plurality of fields includes an Nx-by-Ny sub-regions,
wherein, after the third number of exposure processes, the resist layer outside of the plurality of fields receive an exposure does smaller than an optimized exposure dose Eop for the resist layer.

* * * * *